US006304101B1

(12) United States Patent
Nishihara

(10) Patent No.: US 6,304,101 B1
(45) Date of Patent: Oct. 16, 2001

(54) PROGRAMMABLE LOGIC DEVICE, INFORMATION PROCESSING SYSTEM, METHOD OF RECONFIGURING PROGRAMMABLE LOGIC DEVICE AND METHOD COMPRESSING CIRCUIT INFORMATION FOR PROGRAMMABLE LOGIC DEVICE

(75) Inventor: Yoshio Nishihara, Nakai-machi (JP)

(73) Assignee: Fuji Xerox Co., LTD, Tokyo (JP)

( * ) Notice: Subject to any disclaimer, the term of this patent is extended or adjusted under 35 U.S.C. 154(b) by 0 days.

(21) Appl. No.: 09/585,447

(22) Filed: Jun. 2, 2000

(30) Foreign Application Priority Data

Jul. 14, 1999  (JP) ................................................. 11-199964

(51) Int. Cl.[7] ............................... H01L 25/00; G06F 7/38
(52) U.S. Cl. ................................ 326/41; 326/40; 716/16; 711/170
(58) Field of Search ................................. 326/38, 39, 40, 326/41, 46, 47; 711/104, 103, 170; 716/5, 16

(56) References Cited

U.S. PATENT DOCUMENTS 5,694,056 * 12/1997 Mahoney et al. ....................... 326/38
6,049,222 * 4/2000 Lawman ................................. 326/38

FOREIGN PATENT DOCUMENTS 2-130023   5/1990 (JP) .

OTHER PUBLICATIONS

Tau, E., et al., A First Generation DPGA Implementation, FDP'95—Third Canadian Workshop of Field–Programmable Devices May 29–Jun. 1, 1995, pp. 1–6.

Motomura, M., et al., An Embedded DRAM–FPGA Chip with Instantaneous Logic Reconfiguration, 1997 Symposium on VLSI Circuits Digest of Technical Papers, pp. 55–56.

Trimberger, S., et al., A Time–Multiplexed FPGA, FCCM 1997, pp. 22–28.

Fujii, T., et al., A Dynamically Reconfigurable Logic Engine with a Multi–Context/Multi–Mode Unified–Cell Architecture, 1999 IEEE International Solid–State Circuits Conference, digest of Technical Papers, Feb. 1999, pp. 364–365 and 479.

* cited by examiner

Primary Examiner—Michael Tokar
Assistant Examiner—Daniel D. Chang
(74) Attorney, Agent, or Firm—Morgan, Lewis & Bockius LLP

(57) ABSTRACT

The invention is made to implement technique similar to multicontext technique without using a configuration memory for storing plural circuit information pieces that causes deterioration of circuit performance, increase of power consumption, increase of processes and increase of the manufacturing cost. Therefore, in a programmable logic device, a circuit information storage different from the configuration memory and a circuit information editor for generating circuit information of a specified circuit using circuit information stored in the circuit information storage are provided. In the circuit information storage, circuit information of plural circuits is stored in a compressed state. When specification information of the circuit information of a reconfigured circuit is input to a programmable logic circuit, the circuit information editor reads required circuit information from the circuit information storage, decompresses compressed circuit information, generates circuit information specified in the specification information, transfers the generated circuit information to a configuration memory and reconfigures the circuit.

20 Claims, 40 Drawing Sheets

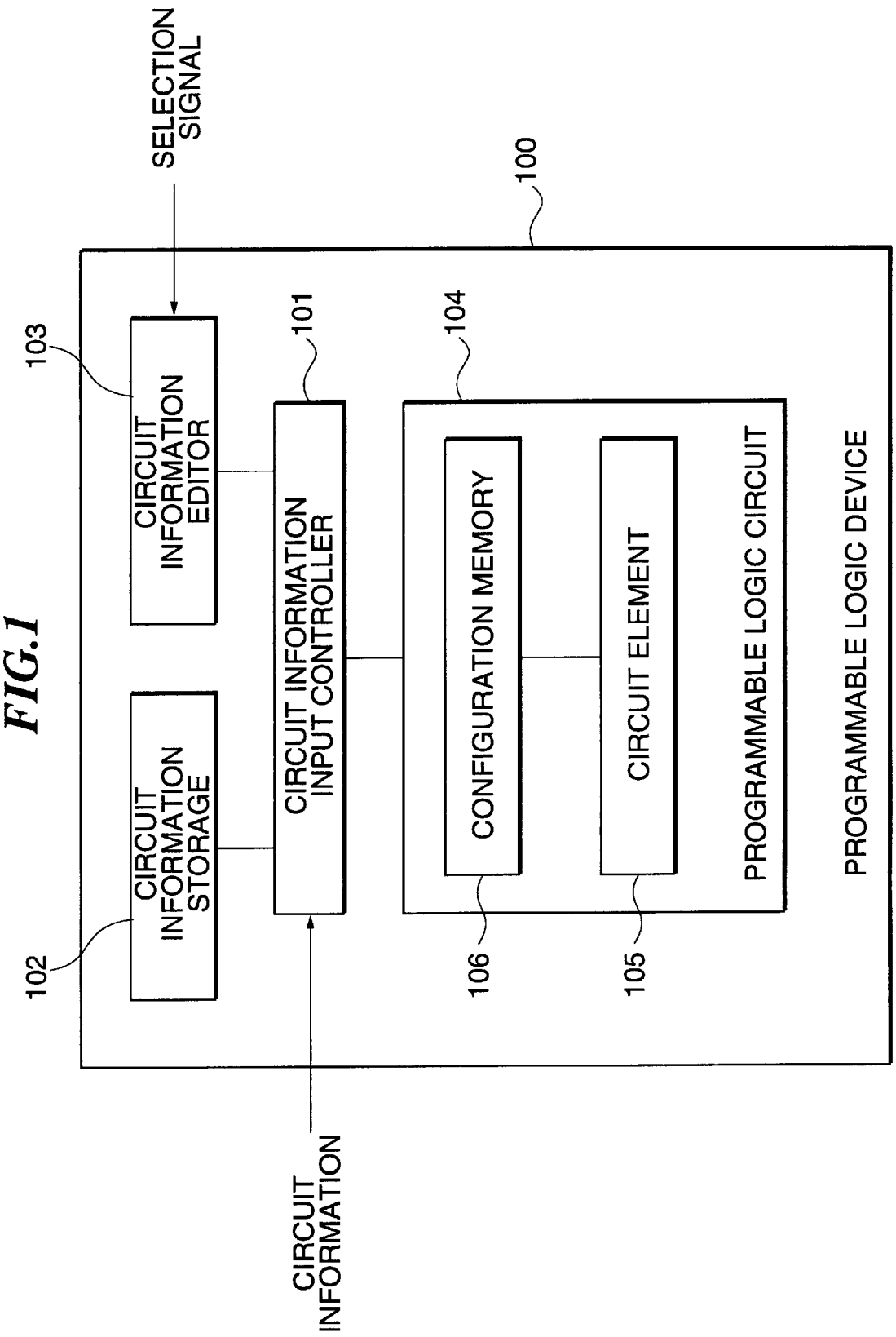

FIG.2A

| CIRCUIT INFORMATION 1 | 1-A | 1-B | 1-B | 1-B | 1-B |
|---|---|---|---|---|---|
| CIRCUIT INFORMATION 2 | 2-A | 1-A | 1-A | 2-B | 2-C |
| CIRCUIT INFORMATION 3 | 2-A | 2-A | 2-A | 2-B | 3-A |

FIG.2B

REPEAT FRAME (REPEAT (FOUR TIMES))
CIRCUIT INFORMATION 1   1-A 1-B
REFERENCE FRAME (REFERENCE AND REPEAT (TWICE))
CIRCUIT INFORMATION 2   2-A 1-A 2-B 2-C
REFERENCE FRAME (REFERENCE AND REPEAT (THREE TIMES))
CIRCUIT INFORMATION 3   2-A 2-B 3-A
REFERENCE FRAME (REFERENCE AND REPEAT (ONCE))

↓ STORED

FIG.2C

| 1-A | 1-B | 2-A | 1-A | 2-B |
|---|---|---|---|---|
| 2-C | 2-A | 2-B | 3-A | |

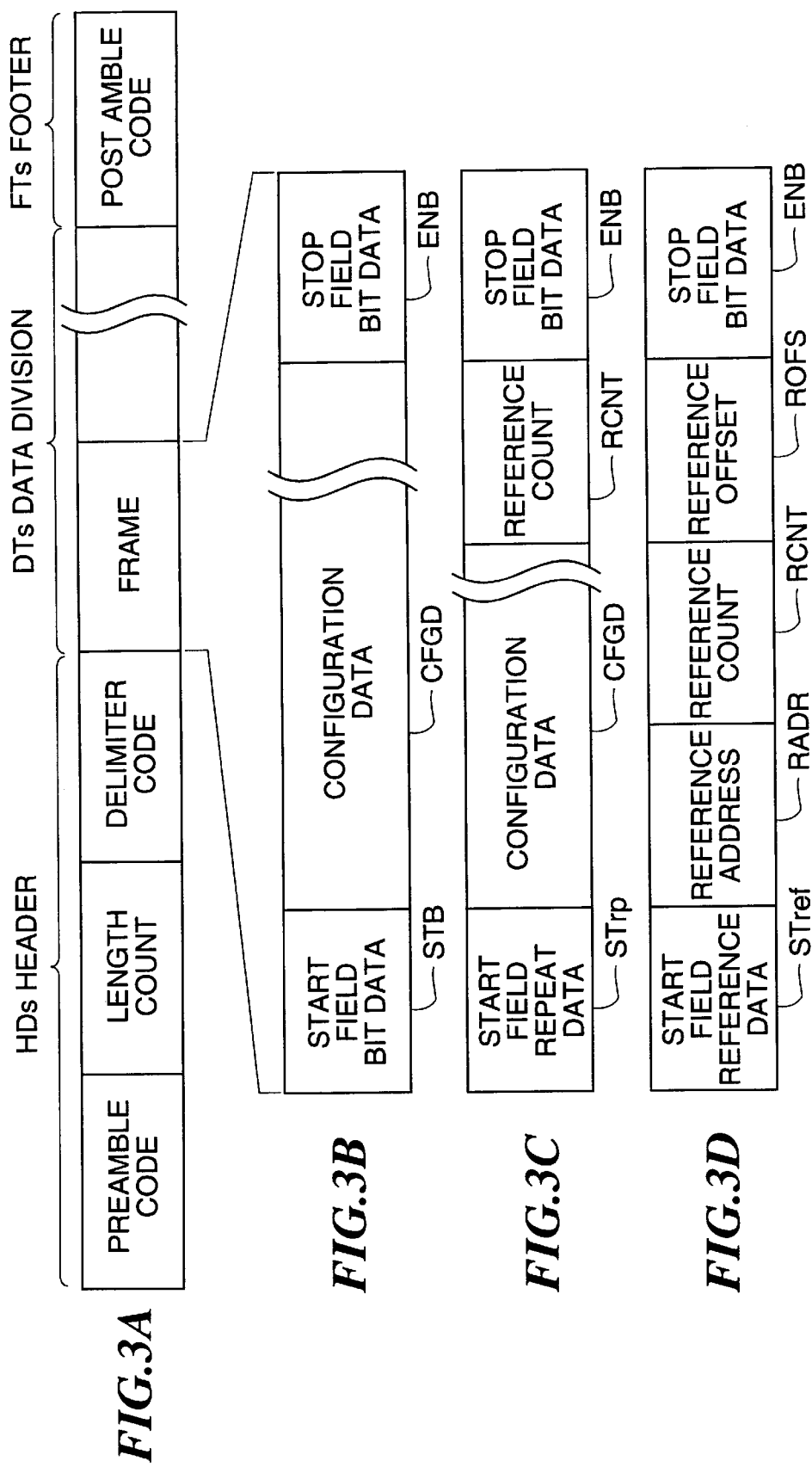

FIG.9A

| CIRCUIT INFORMATION 1 | 1-A | 1-B | 1-B | 1-B | 1-B |
| CIRCUIT INFORMATION 2 | 2-A | 1-A | 1-A | 2-B | 2-C |
| CIRCUIT INFORMATION 3 | 2-A | 2-A | 2-A | 2-B | 3-A |

FIG.9B

REPEAT FRAME (REPEAT (FOUR TIMES))
CIRCUIT INFORMATION 1  | 1-A | 1-B |

REFERENCE FRAME (REFERENCE AND REPEAT (TWICE))
CIRCUIT INFORMATION 2  | 2-A | 1-A | 2-B | 2-C |

REFERENCE FRAME (REFERENCE AND REPEAT (THREE TIMES))
CIRCUIT INFORMATION 3  | 2-A | 2-B | 3-A |

REFERENCE FRAME (REFERENCE AND REPEAT (ONCE))

↓ STORED

FIG.9C

| 1-A | 1-B | 2-A | 1-A | 2-B |
| 2-C | 2-A | 2-B | 3-A |     |

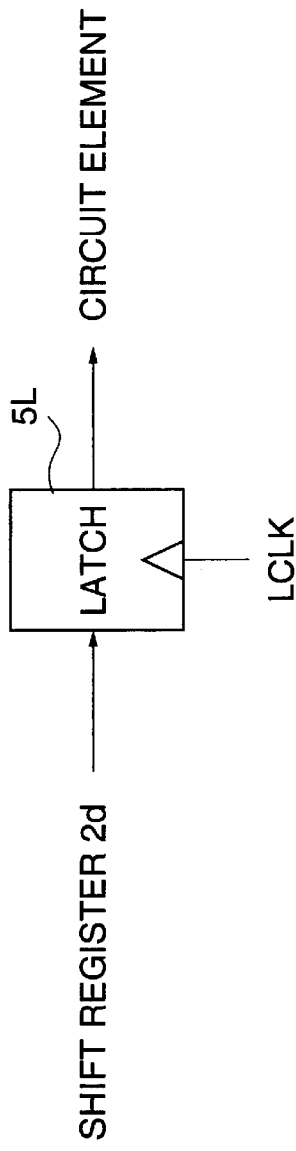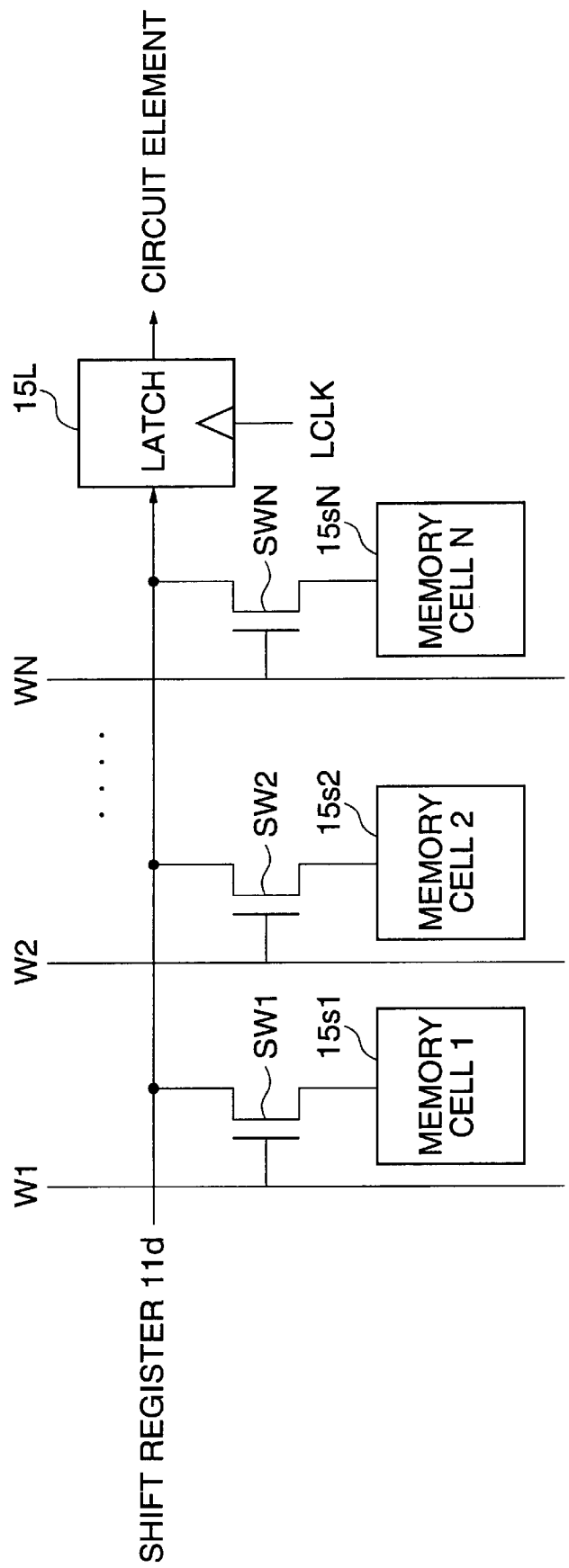

PROGRAMMABLE LOGIC DEVICE, INFORMATION PROCESSING SYSTEM, METHOD OF RECONFIGURING PROGRAMMABLE LOGIC DEVICE AND METHOD COMPRESSING CIRCUIT INFORMATION FOR PROGRAMMABLE LOGIC DEVICE

BACKGROUND OF THE INVENTION

1. Field of the Invention

The present invention relates to a programmable logic device suitable in the case where plural circuits are sequentially reconfigured to take on a part of processing by an application program for example. Particularly, the present invention relates to a method of reducing time required for reconfiguring a programmable logic device.

2. Description of the Related Art

In the field of a digital device, a programmable logic device such as a field programmable gate array (FPGA) and a programmable logic device (PLD) has been used for prototypical device before an application specific integrated circuit (ASIC) is produced or for a substitute device of ASIC that requires a long term for production from a few weeks to a few months. Also recently, a programmable logic device is used to change specifications after a device is produced and to enable modifying a circuit.

FIG. 22 shows the configuration of a programmable logic device in general. The programmable logic device 1 includes a circuit information input controller 2 for reading circuit information from an external device and a programmable logic circuit 3 for implementing a circuit function according to the read circuit information.

Further detailedly, the programmable logic circuit 3 includes a circuit element 4 and a configuration memory 5 connected to the circuit element 4 as shown in FIG. 23. The circuit element 4 includes an input/output device, logic circuit cells and wiring. Depending upon the configuration of the connection of the circuit element 4, the programmable logic device is classified into an FPGA type and a CPLD type.

In a programmable logic circuit 3A of the FPGA type, logic circuit cells 6A arrayed in the shape of a cross grating are mutually connected via wiring 7A as shown in FIG. 24A. Each logic circuit cell also receives a signal from a external device or outputs a signal to an external device via an input/output device 8A connected to the respective four sides of the rectangular wiring 7A when viewed as a whole.

Also, in a programmable logic circuit 3B of the CPLD type, input/output devices 8B and logic circuit cells 6B are connected to wiring 7B in tree structure as shown in FIG. 24B.

In both structure, circuit information read in the programmable logic device 1 is written to the configuration memory 5 by the circuit information input controller 2. According to the circuit information written to the configuration memory 5, the function and the connected state of the circuit element are determined. This operation is called the reconfiguration of the programmable logic device or configuration.

[Description of reconfigurable computing technique]

Recently, in the field of reconfigurable computing to implement higher speed processing than software processing using a general purpose processor by hardware processing using a dedicated processing circuit for the processing of an application, a programmable logic device is starting to be utilized.

In reconfigurable computing, the circuit information of plural processing circuits required in the processing of an application is stored in an external storage beforehand and if necessary, a required circuit is implemented in a programmable logic device by writing the circuit information read from the external storage to the configuration memory of the programmable logic device.

The technique is called cache logic technique in view of saving required circuit information outside a programmable logic device and is called virtual logic technique in view of implementing a circuit larger in scale than the scale of an actual programmable logic circuit by rewriting circuit information. In the following description, these technologies are generically called cache logic technique for simplification.

The cache logic technique is time sharing driving technique that different circuits are configured in the same programmable logic device if necessary. As a result, circuits exceeding the scale of a programmable logic device can be implemented using the programmable logic device small in scale, the device can be miniaturized and the cost can be reduced.

However, there is a problem that depending upon the scale of circuit information written to the configuration memory of a programmable logic device, it takes much time to write circuit information from an external storage to the configuration memory of the programmable logic device and the whole processing time including circuit reconfiguring time is longer than software processing time even if high speed processing is implemented using a dedicated hardware processing circuit.

One solving method of the problem is device technique called multicontext technique. That is, in the multicontext technique, plural configuration memories are provided so that plural circuit information pieces can be stored in a programmable logic device and circuit reconfiguring time is greatly reduced by reconfiguring the programmable logic device by switching the configuration memories if necessary.

[Description of programmable logic device based upon multicontext technique]

FIG. 25 shows the structure of a programmable logic device base upon multicontext technique. The programmable logic device 10 based upon the multicontext technique includes a circuit information input controller 11 that reads plural circuit information pieces from an external device, a circuit information selection controller 12 that selects required circuit information out of plural circuit information pieces and a programmable logic circuit 13 that realizes a circuit function according to the selected circuit information.

FIG. 26 shows the detailed structure of the programmable logic circuit 13 based upon the multicontext technique. The programmable logic circuit 13 includes a circuit element 14 having input/output devices, logic circuit cells and wiring as in the above case and a configuration memory 15 connected to the circuit element 14, however, the configuration memory 15 in the case of the programmable logic circuit 13 based upon the multicontext technique includes plural memory planes.

In the case of the programmable logic circuit 13 based upon the multicontext technique, in both structures of the FPGA type and the CPLD type (see FIG. 24), each of plural circuit information pieces read from an external device in the programmable logic device 10 is written to each memory plane of the configuration memory 15 by the circuit information input controller 11.

Of plural circuit information pieces written to the plural memory planes of the configuration memory 15, the function and the connected state of the circuit element 14 are determined according to circuit information on the memory plane selected according to a selection signal from the circuit information selection controller 12 and circuits are reconfigured in the programmable logic device 10.

For the format of circuit information used in a programmable logic device, there are a serial format and a parallel format and configuration operation differs depending upon these two circuit information formats. Configuration operation in the case of each circuit information format in the programmable logic device 1 shown in FIG. 22 and the programmable logic device 10 using the multicontext technique shown in FIG. 25 will be described below.

[Structure of circuit information; (I) circuit information in serial format]

FIGS. 27 show the structure of circuit information in a serial format used in a conventional type programmable logic device. As shown in FIG. 27A, circuit information includes a header HDs, a data division DTs and a footer FTs. In a programmable logic device, circuit information in the serial format is treated as serial data, however, parallel transmission and parallel memory access are enabled by delimiting in a suitable unit such as 8 bits.

The header HDs has a preamble code showing the beginning of circuit information, length count showing the data quantity of the circuit information and a delimiter code showing the end of the header HDs.

The data division DTs has plural frames. A frame means a cluster of data acquired by delimiting data stored in the configuration memory every certain quantity (normally approximately 100 to 1000 bits). The size of a frame is determined considering the facility of reconfiguring circuits in a programmable logic circuit and for example, is circuit information for one column of logic circuit cells in a longitudinal direction in the case of the FPGA type shown in FIG. 24A.

Each frame includes start field bit data STB showing the beginning of a frame, configuration data CFGD stored in the configuration memory and stop field bit data ENB showing the end of the frame as shown in FIG. 27B.

The footer FTs has a postamble code showing the end of one circuit information.

[Configuration of conventional type programmable logic device 1 based upon circuit information in serial format]

FIG. 28 is a functional block diagram for explaining configuration operation based upon circuit information in the serial format to the conventional type programmable logic device 1 shown in FIG. 22. The storage of circuit information in the configuration memory will be described below using the block diagram shown in FIG. 28.

The circuit information input controller 2 shown in FIG. 22 includes a configuration controller 2a, a length count register 2b, a selector 2c and plural shift registers 2d respectively shown in FIG. 28.

Also, the programmable logic circuit 3 shown in FIG. 22 includes the circuit element 4 and the configuration memory 5 as described above, however, in FIG. 28, in the case of the FPGA type shown in FIG. 24A for example, a programmable logic circuit is divided into sets of a configuration memory 5s for plural columns in units of one column of plural logic circuit cells for example and a circuit element 4s.

A register at each digit of each shift register 2d is connected to each memory cell of the configuration memory 5s in each column. Therefore, each shift register 2d has the number of digits for circuit information for the number of one column of logic circuit cells in the case of the FPGA type shown in FIG. 24A for example. One shift register is allocated to one column of plural logic circuit cells and shift registers 2d are provided by the number of logic circuit cells in a horizontal direction.

In the case where many logic circuit cells are provided, one shift register 2d is provided for plural columns of approximately a few to few tens of columns so that the one shift register 2d is used in common for the plural columns.

The size described above of one frame of circuit information is equivalent to data quantity of one shift register 2d.

When circuit information is read from an external storage 9 in the configuration shown in FIG. 28, the configuration controller 2a detects a preamble code in the header of the circuit information and starts configuration processing.

Length count next to the preamble code is stored in the length count register 2b. The value of the length count register 2b is decremented by one for every data shift described later of the shift register 2d and the shift register 2d is operated until the value of the length count register 2b becomes 0. Hereby, all data is sent to the shift register 2d.

The data division next to a delimiter code is sent to the selector 2c. In an initial state, the selector 2c sends configuration data to a first column of shift register 2d. The shift register 2d sequentially shifts data sent from the selector 2c. When data is shifted to the end of the shift register 2d, the selector 2c switches sending data to the next column of shift register 2d.

All data is stored in the shift register 2d by operating the shift register 2d until the value of the length counter 2b becomes 0 by repeating the operation described above.

When the shift register 2d is filled with configuration data, the data is simultaneously transferred to the whole configuration memory 5s in parallel and the programmable logic circuit 3 is reconfigured. That is, as shown in FIG. 29 for example, data is simultaneously transferred in parallel from the shift register 2d to the configuration memory 5s by connecting a latch 5L of each memory cell of the configuration memory 5s to each register of the shift register 2d and sending a latch clock LCLK to the latch 5L.

Next, when the configuration controller 2a detects a postamble code in the footer next to the data division, the configuration processing is finished.

[Configuration based upon circuit information in serial format of programmable logic device 10 based upon conventional type multicontext technique]

FIG. 31 is a functional block diagram for explaining configuration operation based upon circuit information in a serial format to the programmable logic device 10 based upon multicontext technique shown in FIG. 25. The storage of circuit information in the configuration memory in a case depending upon conventional type multicontext technique will be described below using the block diagram shown in FIG. 31.

The circuit information input controller 11 shown in FIG. 25 includes a configuration controller 11a, a length count register 11b, a selector 11c and plural shift registers 11d respectively shown in FIG. 31.

The programmable logic circuit shown in FIG. 25 is divided into sets of a configuration memory 15s for plural columns in units of one column of plural logic circuit cells for example and a circuit element 14s in the case of the FPGA type shown in FIG. 24A for example as in the example of prior art described above. In the case of this example, each column of configuration memory 15s is provided for plural memory planes as shown by a broken line in FIG. 31.

A register at each digit of each shift register 11d is connected to each memory cell of each plane of each column of configuration memory 15s. The selection of a configuration memory plane by the circuit information selection controller 12 shown in FIG. 25 corresponds to the selection of word lines W1, W2, . . . , WN shown in FIG. 30 of the memory plane of each column of configuration memory 15s.

FIG. 30 shows connection between the shift register 11d and the configuration memory 15s. Each register of the shift register 11d is connected to memory cells 15s1, 15s2, . . . , 15sN of each configuration memory plane via switches SW1, SW2, . . . , SWN. The opening/closing motion of the switches SW1, SW2, . . . , SWN can be controlled by selecting and controlling the word lines W1, W2, . . . , WN. The selection of the circuit element 14 to be configured based upon circuit information on a configuration memory plane can be controlled by opening/closing the switches SW1, SW2, . . . , SWN.

In this case, each shift register 11d also has the number of digits for circuit information for one column of logic cells in the case of the FPGA type shown in FIG. 24A for example. One shift register is allocated to one column of plural logic circuit cells and the shift registers 11d are provided by the number of logic cells in a horizontal direction.

In the case where many logic cells are provided, one shift register 11d is provided for plural columns of approximately a few to few tens of columns so that the one shift register 11d is used in common for the plural columns.

The size described above of one frame of circuit information is equivalent to data quantity in one shift register 11d for example.

In the configuration shown in FIG. 31, the circuit information of plural processing circuits required by an application program for example, that is, plural circuit information pieces stored on plural configuration memory planes are stored in the external storage 9. When first circuit information is read from the external storage 9, the configuration controller 11a detects a preamble code in the header of the circuit information and starts configuration processing.

Length count next to the preamble code is stored in the length count register 11b. The value of the length count register 11b is decremented by one for every data shift described next in the shift register and the shift register 11d is operated until the value of the length count register 11b becomes 0. Hereby, all data are sent to the shift register 11d.

Data next to a delimiter code is sent to the selector 11c. In an initial state, the selector 11c sends the data to a first column of shift register 11d. The shift register 11d that receives the data sequentially shifts the data sent from the selector 11c. When the data is shifted to the end of the shift register 11d, the selector 11c switches sending data to the next column of shift register 11d. The configuration data of first circuit information is stored in the shift register 11d by repeating the operation described above and operating the shift register 11d until the value of the length counter becomes 0.

When the shift register 11d is filled with data, the word line W1 shown in FIG. 29 is selected and first circuit information is simultaneously transferred from the shift register 11d to the memory cell 15s1 of a first configuration memory plane in parallel.

When the configuration controller 11a detects a postamble code in a footer FTs next to a data division DTs, the configuration processing of the first circuit information is finished.

Second circuit information is successively read, the shift register 11d is filled with data in the same procedure as reading the first circuit information, the word line W2 shown in FIG. 29 is selected and the second circuit information is simultaneously transferred from the shift register 11d to the memory cell 2 of the second configuration memory plane in parallel.

N pieces of circuit information is respectively stored on the respective independent memory plane of the configuration memory 15 by sequentially repeating the same procedure.

In reconfiguration, configuration data is simultaneously transferred from the memory cells of a selected memory plane in parallel by selecting a word line corresponding to selected circuit information and next sending a latch clock LCLK to the latch 15L.

[Structure of circuit information; (II) circuit information in parallel format]

FIG. 32 shows the structure of circuit information in a parallel format used in a conventional type programmable logic device. As shown in FIG. 32, circuit information includes a header HDp, a data division DTp and a footer FTp. In a programmable logic device, serial transfer, parallel transmission via buses different in capacity and parallel memory access are enabled outside the programmable logic device by delimiting circuit information in the parallel format having certain bit length, for example 32-bit circuit information in the parallel format in a suitable unit, for example every bit or every 64 bits.

The header HDp has a preamble code showing the beginning of circuit information, an option code for setting a configuration parameter such as an input clock rate of circuit information and a switch command for executing a set option and starting the reading of data.

The data division DTp has plural frames as in the case of the serial format. Each frame has a frame address FADR showing the position of the frame in a configuration memory for configuration data CFGD to be written, a data-in command DIN for instructing to write the configuration data CFGD, word count WCNT for instructing the number of words read from the configuration data CFGD and the configuration data CFGD. The footer FTp has a postamble code for instructing the end of circuit information.

Circuit information in the serial format described above is all treated as data and circuit information is passively read in the whole configuration memory by operating shift registers by the number of clocks indicated by length count. In the meantime, circuit information in the parallel format is treated as data and a command and is characterized in that configuration data CFGD is partially written to a part indicated by the frame address FADR of the configuration memory by activating the data-in command DIN.

[Configuration of conventional type programmable logic device 1 based upon circuit information in parallel format]

FIG. 33 is a functional block diagram for explaining configuration operation based upon circuit information in the parallel format to the conventional type programmable logic device 1 shown in FIG. 22. The storage of circuit information in the configuration memory will be described below using FIG. 33 and a block diagram showing a part shown in FIG. 34 of the configuration memory of the conventional type programmable logic device.

The circuit information input controller 2 shown in FIG. 22 includes a configuration controller 2e, an address generator 2f and a selector 2g respectively shown in FIG. 33. The programmable logic circuit 3 shown in FIG. 22 is divided into sets of a configuration memory 5s for plural columns having one column of plural logic circuit cells as a unit and a circuit element 4s in FIG. 33 in the case of the FPGA type shown in FIG. 24A for example.

The frame of circuit information includes configuration data for one column of plural logic circuit cells as in the case of the serial format.

As shown in FIG. 34, the bit line of each column of configuration memory 5s is connected to the selector 2g. Also, the word line of the configuration memory 5s is connected to the address generator 2f.

In the configuration shown in FIG. 33, when circuit information is read from an external storage 9, the configuration controller 2e detects a preamble code in the header HDp of the circuit information and starts configuration processing.

A parameter for configuration is set in the option code next to the preamble code. The set option is executed according to the next switch command and the reading of data is started.

First, the address FADR of the frame is read in the address generator 2f, and a bit line and a word line corresponding to the configuration memory 5s for data to be written are selected. Next, the data-in command DIN is activated, data for the number indicated by the word count WCNT is read from the configuration data CFGD and the read data is written to the configuration memory 5s via the selector 2g. This procedure is repeated for all frames.

When the configuration controller 2e detects a postamble code in the footer FTp next to the data division DTp, configuration processing is finished.

[Configuration based upon circuit information in parallel format of programmable logic device 10 based upon conventional type multicontext technique]

FIG. 36 is a functional block diagram for explaining configuration operation based upon circuit information in a parallel format to the programmable logic device 10 based upon multicontext technique shown in FIG. 25. The storage of circuit information in the configuration memory will be described below using FIG. 36 and a block diagram showing a part shown in FIG. 35 of the configuration memory of the conventional type programmable logic device based upon multicontext technique.

The circuit information input controller 11 shown in FIG. 25 includes a configuration controller 11e, an address generator 11f and a selector 11g respectively shown in FIG. 36. Also, the programmable logic circuit 13 shown in FIG. 25 includes configuration memories 15s and circuit elements 14s respectively shown in FIG. 36.

As in the case shown in FIG. 31, plural sets of the configuration memory 15s and the circuit element 14s are provided. Each configuration memory 15s is provided with plural memory planes as shown by a broken line in FIG. 36.

In this example, a frame of circuit information also includes configuration data for one column of a memory cell array for one plane as in the case of the serial format.

As shown in FIG. 35, bit lines of each configuration memory 15s (including plural memory planes (a memory cell array)) are connected to the selector 11g. In this case, the bit lines of the memory cell array including plural memory planes are united and connected to the selector 11g. Also, a word line united every memory cell array including plural memory planes of the configuration memory 15s is connected to the address generator 11f.

The circuit information selection controller 12 shown in FIG. 25 corresponds to selecting the configuration memory 15s depending upon context shown in FIG. 35.

In the configuration shown in FIG. 36, when first circuit information is read from the external storage 9, the configuration controller 11e detects a preamble code in the header HDp of the circuit information and starts configuration processing.

A parameter of configuration is set by an option code next to the preamble code. Next, the set option is executed according to a switch command and the reading of data is started.

The address FADR of a frame is read in the address generator 11f, and a bit line and a word line respectively corresponding to the configuration memory 15s for data to be written are selected. At this time, as shown in FIG. 35, as plural memory cell arrays are arranged in a row, a bit line of a first memory cell array 15s1 is selected for first circuit information by the selector 11g for example.

Next, a data-in command DIN is activated, data for the number indicated by word count WCNT is read from configuration data CFGD and is written to the configuration memory 15s via the selector 11g. This procedure is repeated for all frames.

When the configuration controller 11s detects a postamble code in the footer FTp next to a data division DTp, the configuration processing of the first circuit information is finished.

Second circuit information is successively read and is stored in a second memory cell array 15s2 selected by the selector 11g according to the same procedure as that in the reading of the first circuit information. The same procedure is sequentially repeated and N pieces of circuit information is stored in the configuration memory 15.

In reconfiguration, a context selecting line corresponding to selected circuit information is selected and the configuration of the circuit element 14s is executed.

[Processing operation by circuit reconfigured based upon conventional type multicontext technique]

Next, referring to an explanatory drawing shown in FIG. 37 and a flowchart shown in FIG. 38, a procedure for operation for reconfiguring a programmable logic device based upon circuit information in case one processing using plural circuits is executed using the programmable logic device based upon conventional type multicontext technique described above will be further described.

As described above, circuit information normally has a unit called a frame, however, an example shown in FIG. 37 shows that one circuit information is configured by five frames and one processing is executed using three circuit information pieces of circuit information 1, circuit information 2 and circuit information 3.

That is, the three circuit information pieces (the circuit information 1, the circuit information 2 and the circuit information 3) are stored in the configuration memory 15 via the circuit information input controller 11. One circuit information is selected out of the three circuit information pieces stored in the configuration memory 15 according to a selection signal generated by an application program for example by the circuit information selection controller 12 and the programmable logic device 10 is reconfigured based upon the circuit information.

Referring to the flowchart shown in FIG. 38 and a timing chart shown in FIG. 39, this procedure for reconfiguration will be described below. In the timing chart shown in FIG. 39, the programmable logic device is reconfigured using the circuit information 1, the circuit information 2 and the circuit information 3 in the order and processing is finished.

First, the circuit information input controller 11 reads circuit information stored in an external storage (not shown) and others one by one and stores it in the configuration memory 15 (a step S101). At this time, every time the circuit information input controller reads circuit information, it checks the residual capacity of the configuration memory 15 (steps S102 and S103) and when the configuration memory 15 is full before all circuit information pieces are read, the circuit information input controller detects an error and terminates the operation (a step S104).

When the circuit information input controller 11 stores all the three circuit information pieces in the configuration memory 15, the circuit information selection controller 12 monitors a selection signal (a step S105). When the circuit information selection controller 12 detects that a selection signal is switched according to an application program for example, the circuit information selection controller identifies which of the three circuit information pieces is selected (a step S106), circuit information according to the switched selection signal is read from the configuration memory 15 and the programmable logic circuit (not shown) is reconfigured according to the circuit information (a step S107 or a step S108 or a step S109).

Afterward, as long as processing by the programmable logic device 10 continues, the monitoring of a selection signal by the circuit information selection controller 12 is continued and every time a selection is switched, circuit information is switched. When processing by the programmable logic device 10 is finished, the procedure for reconfiguration is finished independent of a selection signal.

In the case where processing by the programmable logic device 10 is finished, the programmable logic device is generally kept in a state reconfigured based upon finally selected circuit information unless power supply to the programmable logic device 10 is stopped.

Referring to the timing chart shown in FIG. 39, the processing described above will be further described below. That is, when processing becomes an execution state, the three circuit information pieces 1, 2 and 3 are first read in the configuration memory 15. When the reading is finished and the selection of circuit information is instructed, a configuration memory plane where the circuit information the selection of which is instructed is stored is selected to be switched, the circuit information is read and the programmable logic circuit is reconfigured based upon the read circuit information.

The reason why configuration based upon the circuit information 3 is also continued after execution is finished in FIG. 39 is that a programmable logic device is generally kept in a state reconfigured based upon finally selected circuit information unless power supply is stopped in case processing is finished as described above.

[Concrete conventional examples using multicontext technique]

For one of multicontext techniques described above, there is "a multifunctional programmable logic device" disclosed in Japanese Published Unexamined Patent Application No. Hei 2-130023. Referring to FIG. 40, this example will be described below as a conventional example 1.

FIG. 40 shows the configuration of a multifunctional programmable logic device. This device includes a programmable logic array 21, PROM 22 for setting a switch having SRAM and a selecting circuit 23.

PROM 22 for setting a switch can store M sets of N-bit circuit information corresponding to a circuit having the programmable logic array 21. The circuit configuration of the programmable logic array 21 is determined by one set of circuit information selected by the selecting circuit 23 out of M sets of circuit information stored in PROM 22 for setting a switch. That is, the circuit configuration of the programmable logic array 21 can be reconfigured by switching circuit information selected by the selecting circuit 23.

For another example based upon multicontext technique, there is "Time-Multiplexed FPGA" announced in FPGAs for Custom Computing Machines 1997 (FCCM'97). Referring to FIG. 41, this will be described below as a conventional example 2.

FIG. 41 shows the configuration of the announced time sharing driven FPGA. The time sharing driven FPGA is acquired by improving XC4000E manufactured by Xilinx (U.S.A.) and is provided with 8 sets of configuration memories 25 having SRAM that determine the logic cells of a circuit element 24 and internal wiring. Circuit information corresponding to different circuit configuration is stored in the respective configuration memories 25 and FPGA can be reconfigured by time sharing by switching these configuration memories 25.

As shown in the conventional examples 1 and 2, multicontext technique enables reducing time required for reconfiguring a circuit because plural circuit information pieces are stored in the configuration memory beforehand.

However, as plural planes or plural configuration memories are required inside a programmable logic device to store circuit information, the scale of the programmable logic circuit is increased. When the scale is increased, a problem that the performance of the circuit is deteriorated because the load capacity of the circuit element is increased and power consumption is increased is caused. Also, when the scale of the circuit is increased, a problem that the manufacturing cost of the programmable logic device is increased is caused.

Normally, as a programmable logic device is manufactured in CMOS process, SRAM that can be manufactured in the same CMOS process is used for a configuration memory. In the conventional examples 1 and 2, SRAM is used for a configuration memory. As SRAM requires six transistors to store one bit, the scale of a programmable logic circuit is greatly increased when the number of circuit information pieces that can be stored in the programmable logic device is increased.

The problem that the scale of a circuit is increased as described above is improved to some extent by using DRAM having three transistors per bit for a configuration memory as "First Generation DPGA Implementation" announced in Third Canadian Workshop of Field Programmable Devices 1995 (FPD'95). Referring to FIG. 42, this will be described below as a conventional example 3.

FIG. 42 shows the logic cell structure of announced DPGA. A logic cell includes 4×32-bit DRAM 31 that can store four sets of configuration, four eight-input multiplexers 32 to 35, a four-input look-up table 36, a bistable circuit 37 and a selector 38 for switching output.

Out of the output of 32-bit DRAM 31, 12 bits determine the state of the four eight-input multiplexers 32 to 35, 16 bits determine the state of the four-input look-up table 36, one bit determines the state of the selector 38 and the residual 3 bits are reserved. Circuit information pieces respectively different are stored in four sets of DRAM 31 and a different circuit can be configured by switching the output of the memory.

As described above, as DRAM 31 is configured by three transistors per bit, the problem that the scale of the circuit is increased in multicontext technique can be improved to some extent according to the conventional example 3.

Further, a CMOS circuit and DRAM having one transistor per bit can be manufactured on one device owing to the recent development of semiconductor device manufacturing technology. The semiconductor manufacturing technology is called a DRAM consolidation process. To store in one bit, SRAM having CMOS requires six transistors and DRAM having CMOS requires three transistors, while DRAM according to the DRAM consolidation process requires only one transistor.

Therefore, the above defect that an extra configuration memory area is required to store circuit information of multicontext technique can be further improved by using DRAM having one transistor according to the DRAM consolidation process for a configuration memory.

For the example, there is "an Embedded DRAM-FPGA Chip with Instantaneous Logic Reconfiguration" announced in Symposium on VLSI Circuit 1997. Referring to FIG. 43, this will be described below as a conventional example 4.

FIG. 43 shows the structure of the announced DRAM-FPGA logic elements and a DRAM element, and four logic elements 42 to 45 surround the DRAM element 41 having 256×256 cells. One logic element is reconfigured based upon 64-bit circuit information. Each 64-bit bit line led out by total 128 bits right and left via a sense amplifier is connected to each logic element 42 to 45.

Circuit information output to the right and left bit lines is switched by selecting a word line led out by 128 bits upward and downward via a word driver. That is, DRAM-FPGA can store 256 sets of circuit information by using the DRAM element 41 for a memory circuit.

As shown in the conventional example 4, the defect that an extra configuration memory circuit area is required to store circuit information of multicontext technique can be greatly improved by constituting a memory circuit by DRAM having one transistor using the DRAM consolidation process.

However, as a gate oxide film of a transistor used in the DRAM circuit is required to be thicker than a gate oxide film of a transistor used in the CMOS circuit, they are required to be separately produced. Therefore, a new problem that the number of processes is increased, the manufacturing cost of the programmable logic device is increased and a yield is deteriorated is caused. Also, when processes are shared and a thick oxide film is used not to increase the number of processes, another problem that the performance of the CMOS circuit is deteriorated is caused.

As described above, an information processing system using reconfigurable computing technique that a part of processing by an application program is processed by a circuit having the programmable logic device using cache logic technique has a problem that time required for reconfiguring a circuit is increased and hardware processing by a programmable logic device originally faster in processing speed, compared with software processing may require more time than software processing when both processing is compared in total processing time including circuit reconfiguring time.

Multicontext technique which is one unit for solving the problem can reduce time required for reconfiguring a circuit, however, as an extra configuration memory area to store plural circuit information pieces is required, the multicontext technique has a defect that the scale of a programmable logic circuit is increased.

When the scale of the circuit is increased, a problem that the load capacity of a circuit element is increased, the performance of the circuit is deteriorated and power consumption is increased is caused. Also, when the scale of the circuit is increased, a problem that the manufacturing cost of the programmable logic device is increased is caused.

Also, to reduce a configuration memory area, DRAM having one transistor manufactured according to the DRAM consolidation process is used for a memory in place of SRAM manufactured according to a CMOS process. However, as described above, a new problem that the number of processes is increased, the manufacturing cost of the programmable logic device is increased and a yield is deteriorated is caused. Also, when processes are shared not to increase the number of processes and a thick oxide film of DRAM is used for an oxide film of a CMOS circuit, another problem that the performance of the CMOS circuit is deteriorated is caused.

SUMMARY OF THE INVENTION

The present invention is made in view of the above circumstances and provides a programmable logic device that can reconfigure a circuit at high speed without using a configuration memory for storing plural circuit information pieces that cause deterioration of circuit performance, increase of power consumption, increase of processes and increase of the manufacturing cost.

To solve the problems, a programmable logic device according to one aspect of the invention is characterized in that it is provided with a programmable logic circuit having a circuit element and a configuration memory connected to the circuit element in which a circuit configured based upon circuit information written to the configuration memory, a circuit information storage different from the configuration memory that stores plural circuit information pieces for sequentially configuring plural circuits in the programmable logic circuit, a circuit information writer that writes plural circuit information pieces to the circuit information storage, a circuit information editor that generates the circuit information of one circuit specified to be generated in the programmable logic circuit and specified in specification information using one or plural circuit information pieces out of plural circuit information pieces stored in the circuit information storage, and a controller that writes the circuit information of the circuit generated by the circuit information editor to the configuration memory.

A programmable logic device according to another aspect of the invention is characterized in that the circuit information storage and the circuit information editor are provided separately from the programmable logic circuit.

Also, a programmable logic device according to still another aspect of the invention is characterized in that the circuit information storage and the circuit information editor are generated in a part of the circuit element of the programmable logic circuit by reading circuit information for them in a part of the configuration memory.

Also, a programmable logic device according to still another aspect of the invention is characterized in that circuit information stored in the circuit information storage is compressed, and the compressed circuit information is decompressed by the circuit information editor and circuit information specified in the specification information is generated.

In the invention configured as described above, plural circuit information pieces are not stored in the configuration memory as in multicontext technique but is temporarily stored in the circuit information storage. Circuit information to be reconfigured is read from the circuit information storage, is edited to be circuit information in a format that the circuit information to be reconfigured is written to the configuration memory by the circuit information editor and is transferred to the configuration memory.

Therefore, according to the invention of above, as a configuration memory area has only to be able to store one circuit information piece like a conventional type general programmable logic device, the defect that the scale of the programmable logic circuit is increased in the case of multicontext technique can be avoided.

Instead, the circuit information storage is required, however, in the invention above, as circuit information in the circuit information storage is transferred to the configuration memory after the circuit information is edited by the circuit information editor, circuit information to be stored in the circuit information storage is not required to be a format that the circuit information is directly stored in the configuration memory and the data quantity can be reduced.

For example, as in the invention of another aspect, the capacity of the circuit information storage can be reduced by compressing circuit information and decompressing the compressed circuit information by the circuit information editor.

The circuit information storage and the circuit information editor may also be configured outside the programmable logic circuit as in the invention above and may also be configured in the programmable logic circuit by reading circuit information for them as in the invention of above.

Particularly, there is the effect that the programmable logic device according to the invention can be implemented using a conventional type programmable logic device.

BRIEF DESCRIPTION OF THE DRAWINGS

Preferred embodiments of the present invention will be described in detail based on the followings, wherein:

FIG. 1 is a block diagram for explaining first structure in an embodiment of a programmable logic device according to the invention;

FIGS. 2A, 2B, 2C and 2D explain a first embodiment of the programmable logic device according to the invention;

FIGS. 3A, 3B, 3C and 3D explain an example of circuit information in a serial format used in the embodiment of the invention;

FIGS. 9A, 9B, 9C and 9D explain the second embodiment of the programmable logic device according to the invention;

FIG. 29 is a block diagram for explaining a part of the programmable logic circuit in the programmable logic device using circuit information in a serial format;

FIG. 30 is a block diagram for explaining the configuration of a part of the programmable logic circuit in the programmable logic device based upon multicontext technique using circuit information in a serial format;

DETAILED DESCRIPTION OF THE PREFERRED EMBODIMENTS

Figure 2D:
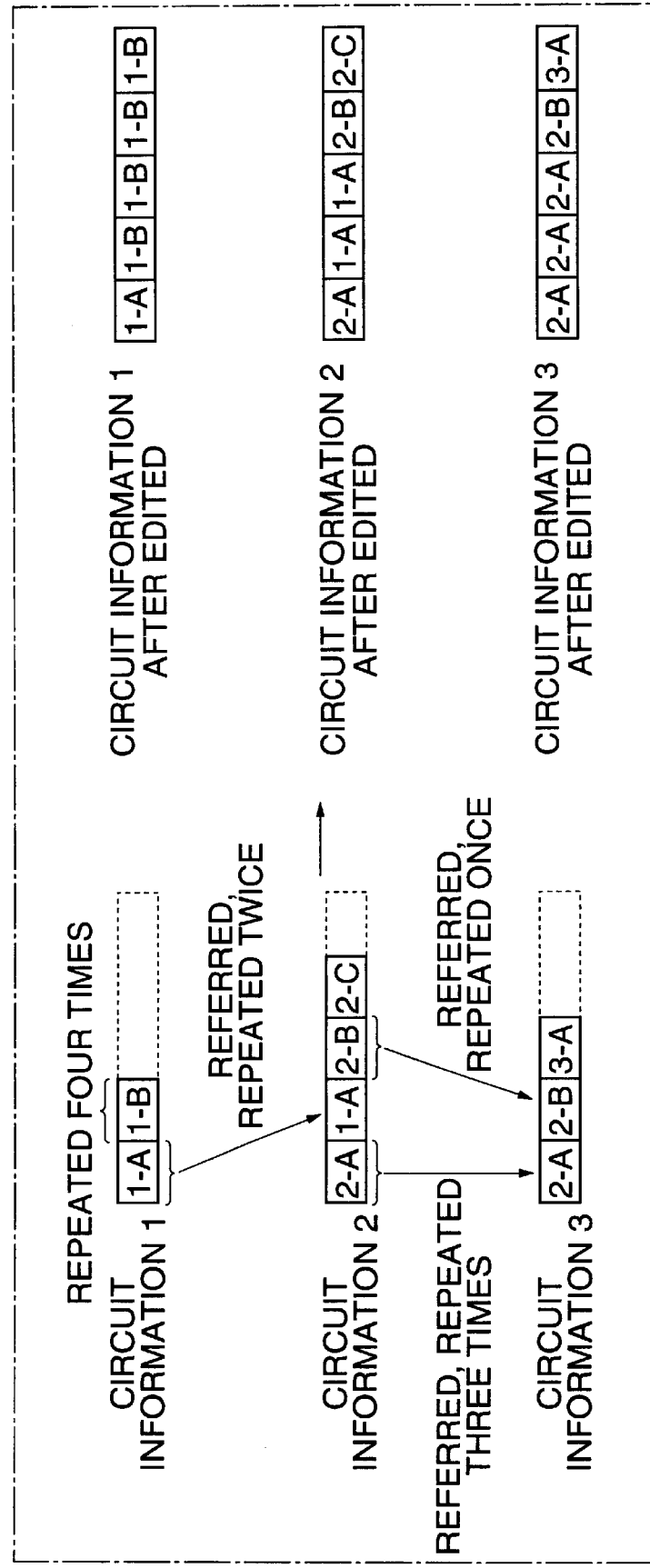

Referring to the drawings, some embodiments of a programmable logic device according to the invention will be described below, comparing with the above-mentioned conventional type programmable logic device based upon multicontext technique.

The embodiments described below are examples in the case where plural circuits to execute a part or all of processing by an application program are configured by the programmable logic device in an information processing system using reconfigurable computing technique described above.

That is, the circuit information of plural processing circuits required by the application program is stored in an external storage beforehand, if necessary, the circuit information read from the external storage of the plural processing circuits is read in the programmable logic device, and required circuits are sequentially reconfigured to the programmable logic device to execute required processing.

First Embodiment

First structure of programmable logic device according to the invention

A programmable logic device equivalent to a first embodiment is provided with first structure of a programmable logic device according to the invention. FIG. 1 shows the configuration of the programmable logic device 100 according to the invention provided with the first structure. The programmable logic device 100 according to the invention provided with the first structure includes a circuit information input controller 101 that reads plural circuit information pieces from an external storage (not shown) for example, a circuit information storage 102 that temporarily stores the read plural circuit information pieces, a circuit information editor 103 that selects required circuit information out of the plural circuit information pieces and edits it and a programmable logic circuit 104 that realizes a circuit function according to the edited circuit information read via the circuit information input controller 101.

In the programmable logic device 100 provided with the first structure, the circuit information input controller 101 also has a function of a circuit information writer for writing plural circuit information pieces to the circuit information storage 102. The circuit information input controller 101 also functions as a controller for writing the circuit information of one circuit generated by the circuit information editor to the configuration memory of the programmable logic circuit 104.

Figure 22:
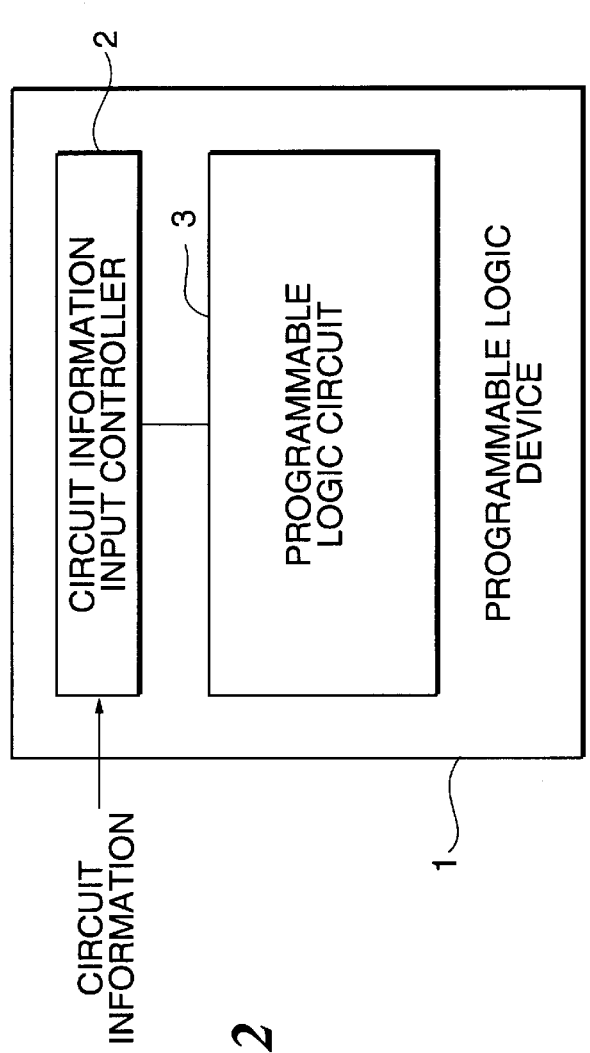
FIG. 22 is a block diagram for explaining the structure of a conventional type programmable logic device.

That is, the programmable logic device 100 having the first structure is provided with a circuit information storage 102 and a circuit information editor 103 in addition to a circuit information input controller 101 and a programmable logic circuit 104 respectively similar to the circuit information input controller 2 and the programmable logic circuit 3 in the conventional type programmable logic device 1 shown in FIG. 22.

Figure 23:
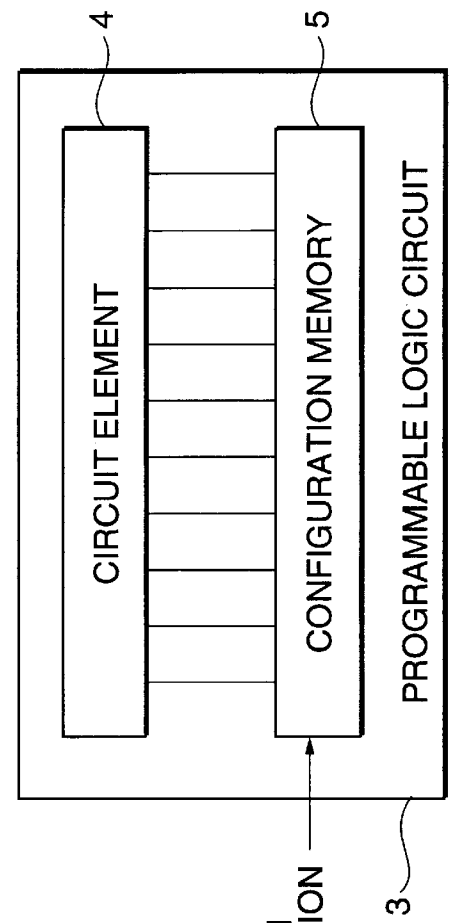
FIG. 23 is a block diagram for explaining the structure of a programmable logic circuit in the conventional type programmable logic device.
Figure 26:
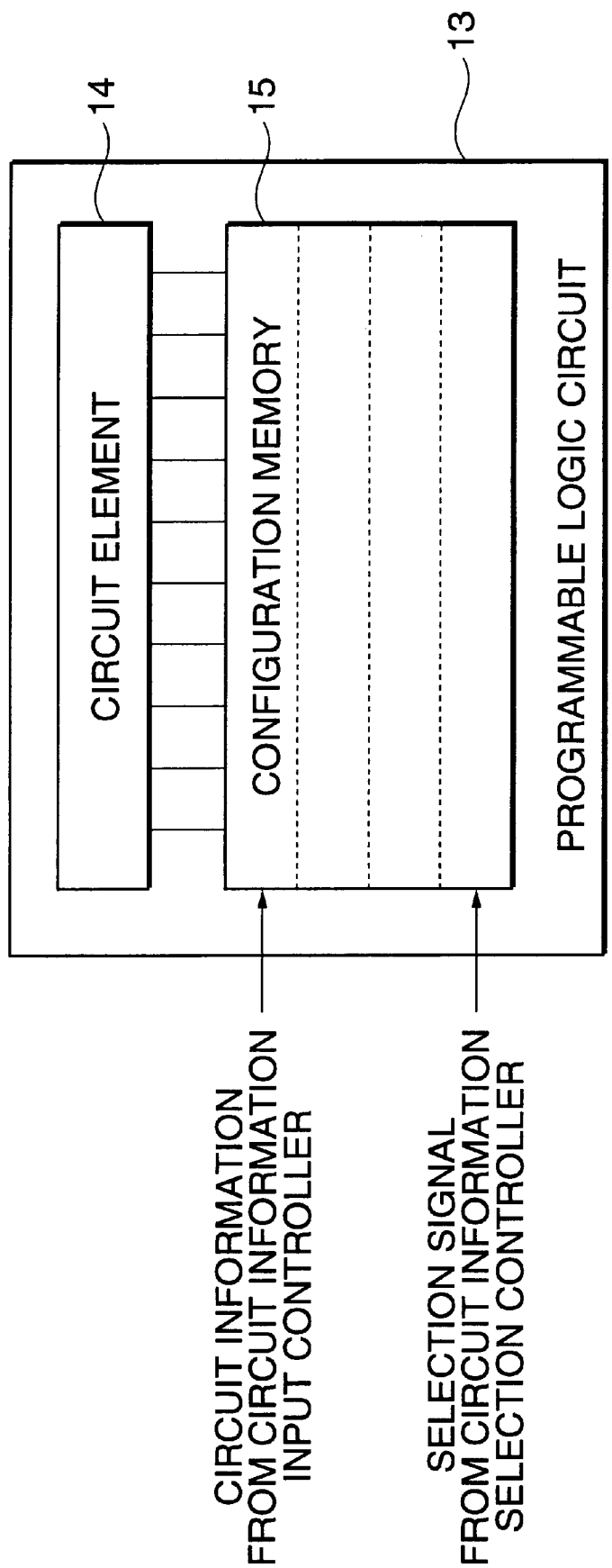
FIG. 26 is a block diagram for explaining the structure of a programmable logic circuit of the programmable logic device based upon the conventional type multicontext technique.

The detailed structure of the programmable logic circuit 104 is the same as the programmable logic circuit shown in FIGS. 23 and 24 in the conventional type programmable logic device shown in FIG. 22. That is, the configuration memory in the programmable logic circuit 15 based upon conventional type multicontext technique shown in FIG. 26 is provided with plural memory planes, while a configuration memory in the programmable logic circuit 104 is not provided with plural memory planes.

Figure 24A:
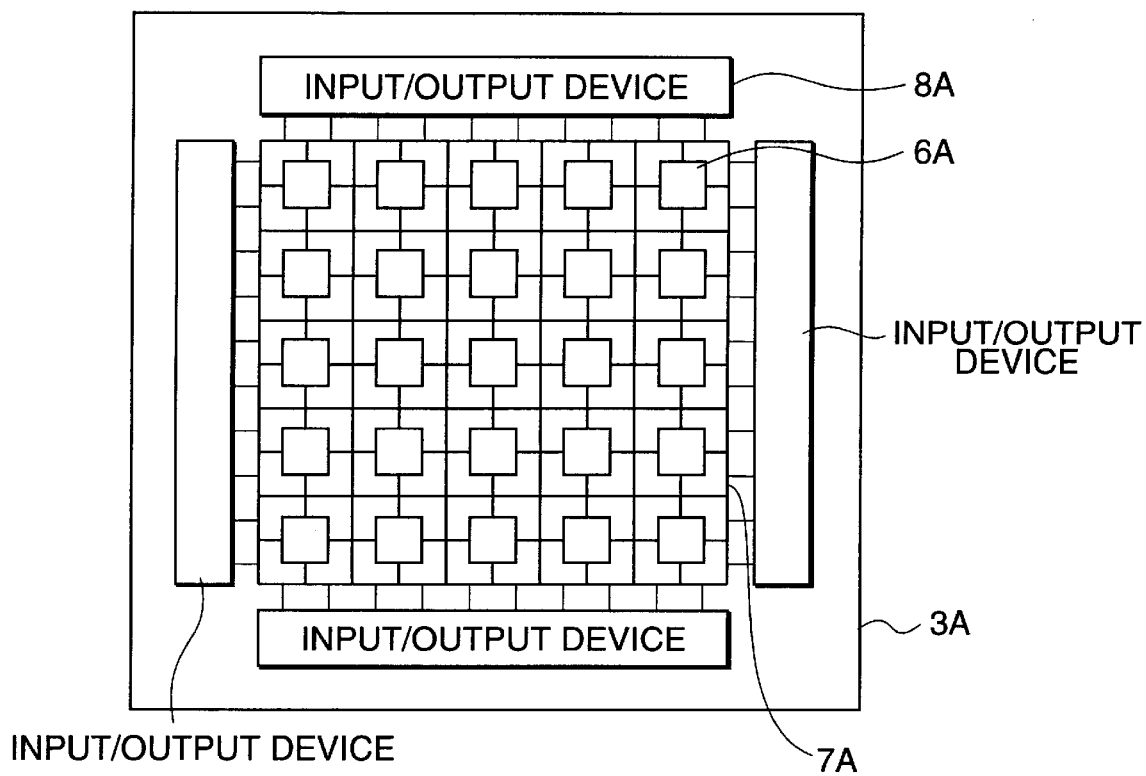
FIGS. 24A and 24B show concrete examples of the structure of a programmable logic circuit in FPGA type and CPLD type.
Figure 24B:
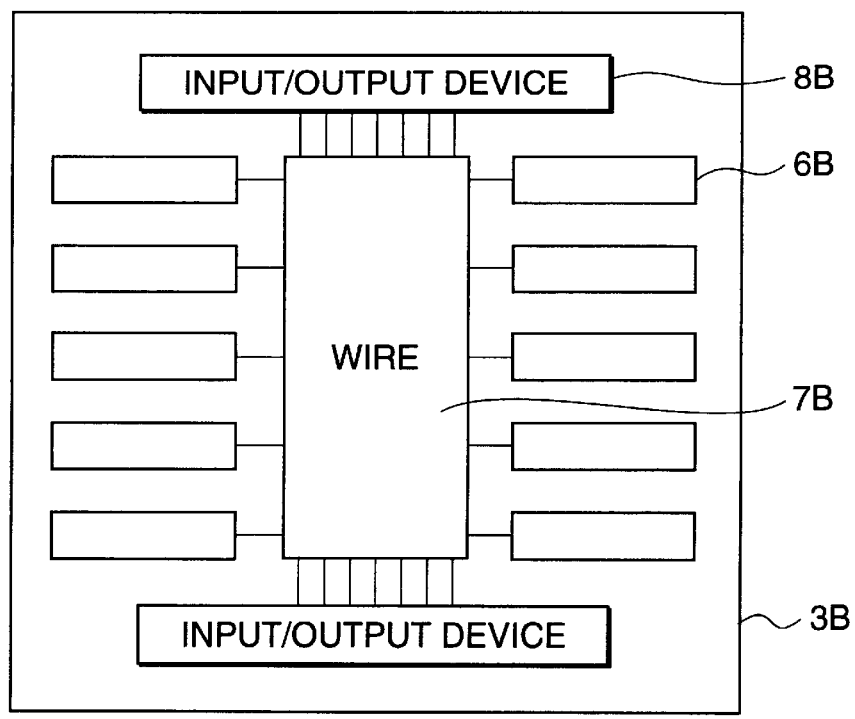

That is, the programmable logic circuit 104 includes a circuit element 105 including an input/output device, logic circuit cells and wiring respectively shown in FIGS. 24A and 24B and a configuration memory 106 connected to the circuit element 105 that stores the information of one circuit.

Figure 25:
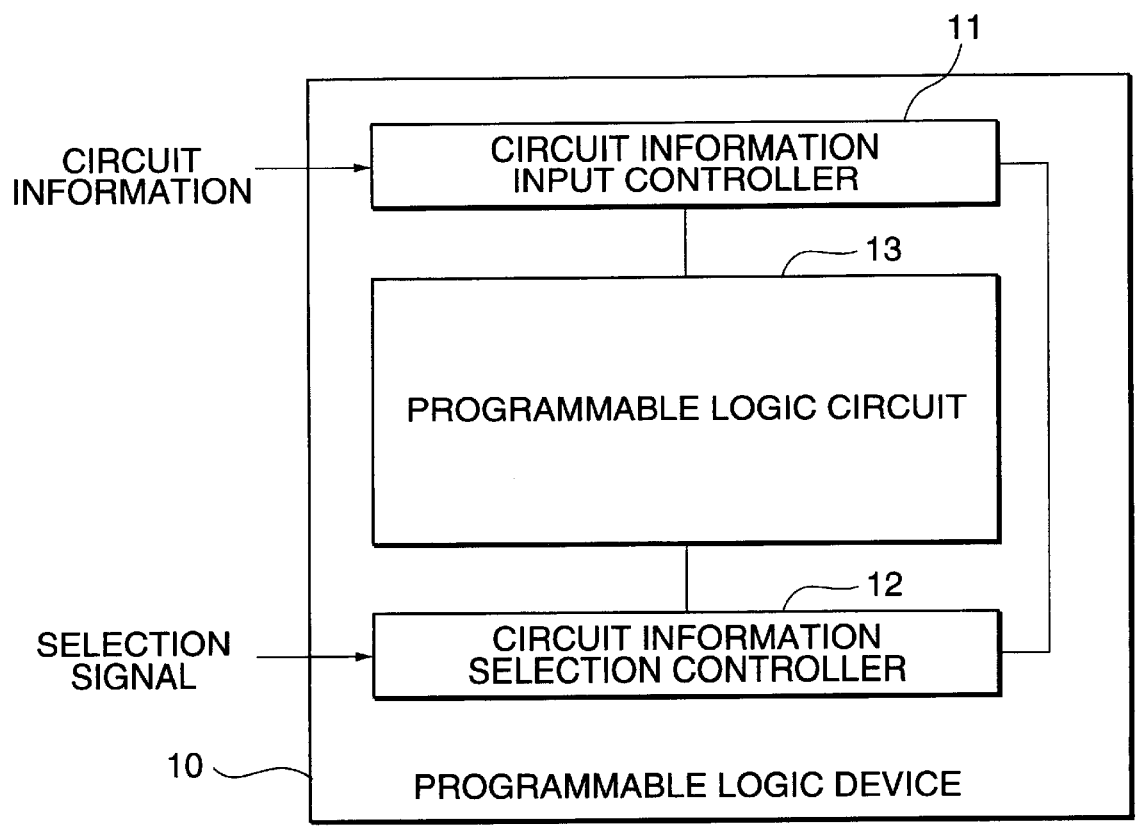
FIG. 25 is a block diagram for explaining the structure of a programmable logic device based upon conventional type multicontext technique.

As the configuration memory built in the programmable logic circuit 104 does not have plural configuration memories or plural memory planes as described above, the programmable logic device 100 in this embodiment is not provided with the circuit information selection controller 12 in the programmable logic device 10 based upon conventional type multicontext technique shown in FIG. 25.

The programmable logic device 100 in this embodiment is also classified into an FPGA type shown in FIG. 24A and a CPLD type shown in FIG. 24B depending upon a state of the connection of the circuit element 105 in the programmable logic circuit 104 as in the conventional type programmable logic device 1.

In both structures, in the programmable logic device 100 in the first embodiment, when plural circuit information pieces are read there, plural circuit information pieces are stored in the circuit information storage 102 and after they are edited by the circuit information editor 103, they are written to the configuration memory 106 by the circuit information input controller 101. The function and a state of the connection of the circuit element 105 are determined based upon circuit information written to the configuration memory 106.

Configuration in first embodiment

Next, a method of configuration in the first embodiment will be described below comparing with the case of the programmable logic device based upon conventional type multicontext technique. In the first embodiment, configuration is performed based upon circuit information in a serial format.

FIG. 2 explain circuit information and operation for editing it in the first embodiment. Referring to FIG. 2, the operation of the programmable logic device 100 in the first embodiment will be described below. An example shown in FIG. 2 shows a procedure for reconfiguring three circuits based upon the same three circuit information pieces 1, 2 and 3 as those shown in FIG. 37 and described in the configuration of the programmable logic device 10 based upon conventional type multicontext technique.

Figure 37:
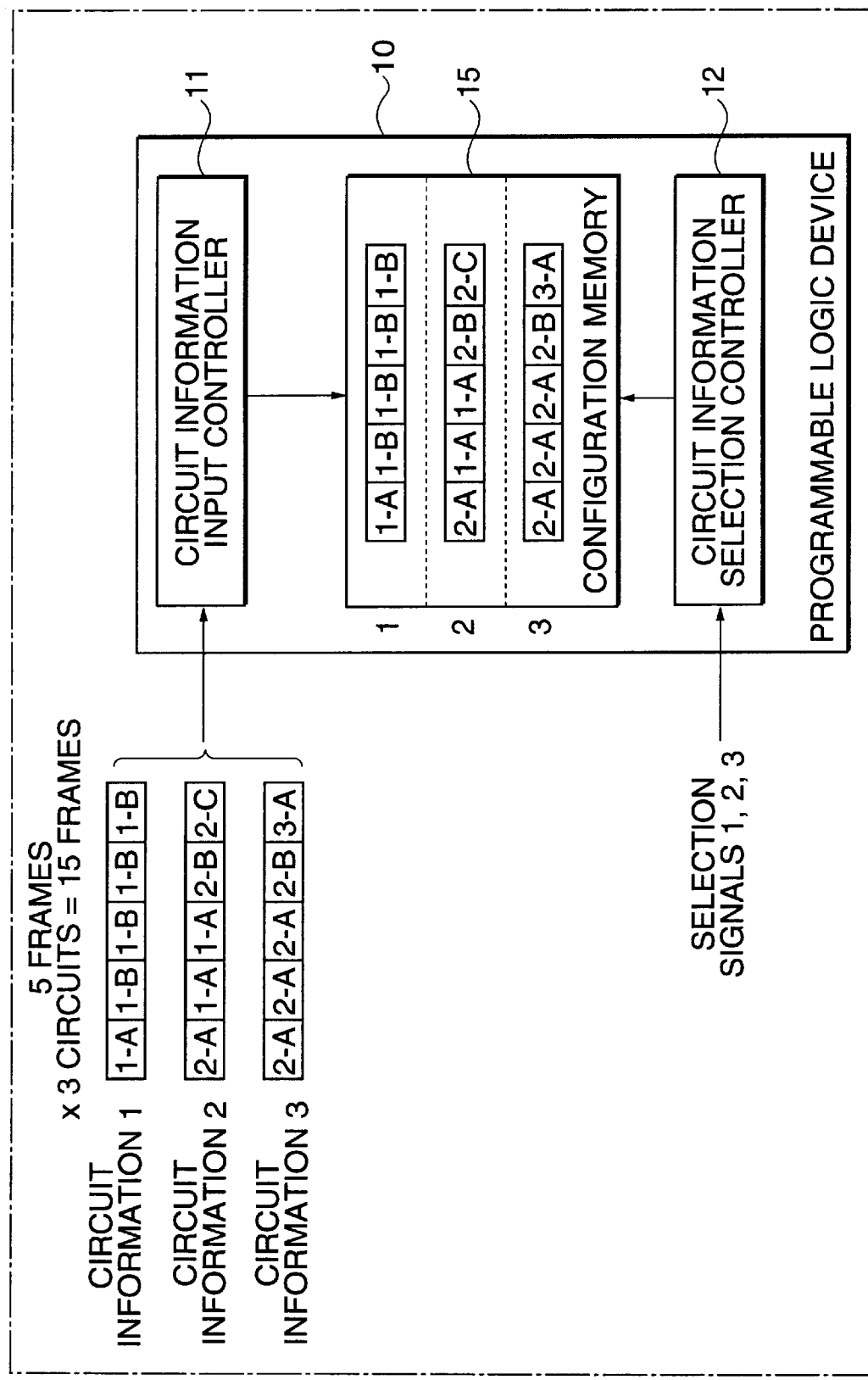
FIG. 37 explains the operation of the programmable logic device based upon conventional type multicontext technique.
Figure 38:
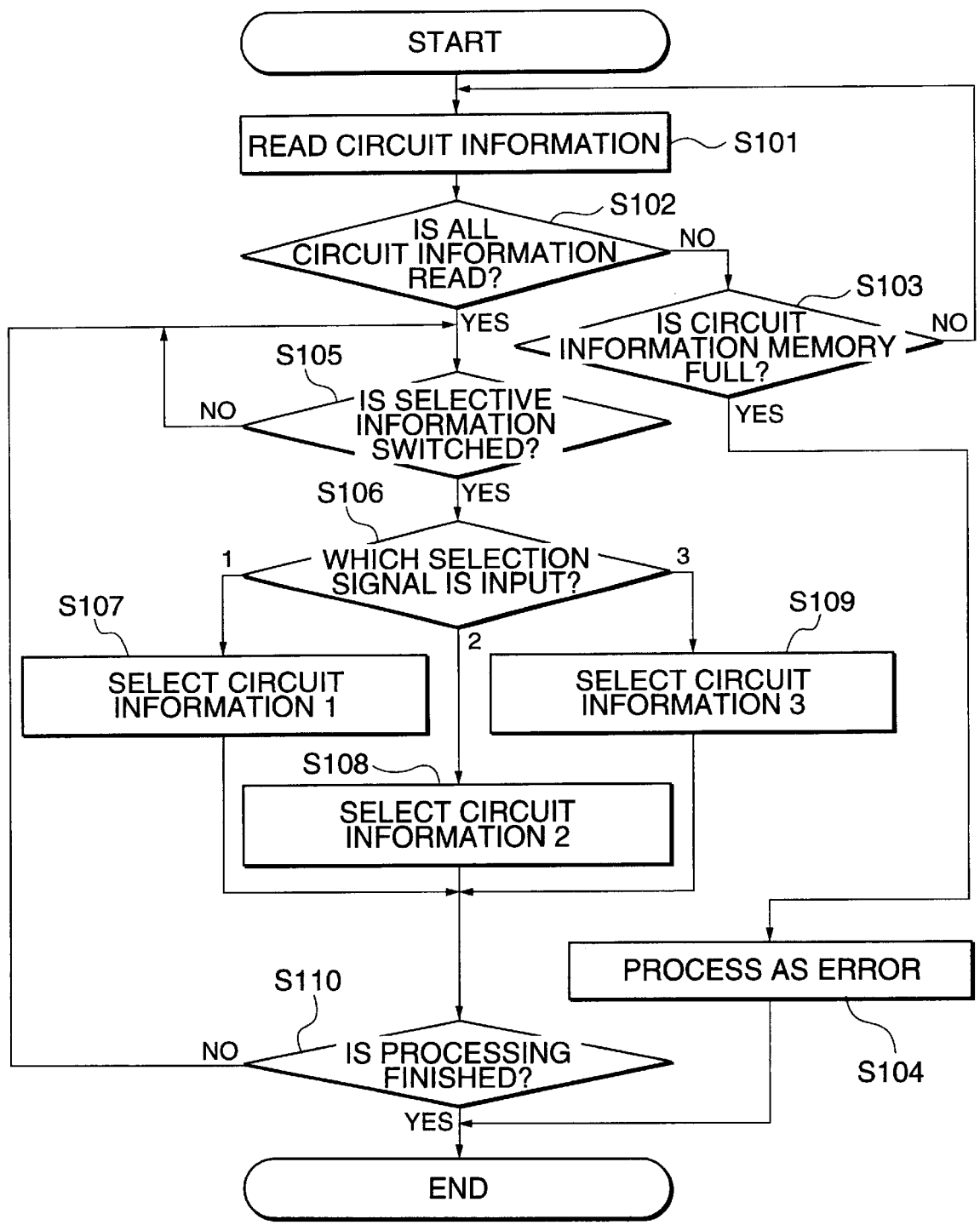
FIG. 38 is a flowchart for explaining the operation of the programmable logic device based upon conventional type multicontext technique.
Figure 39:
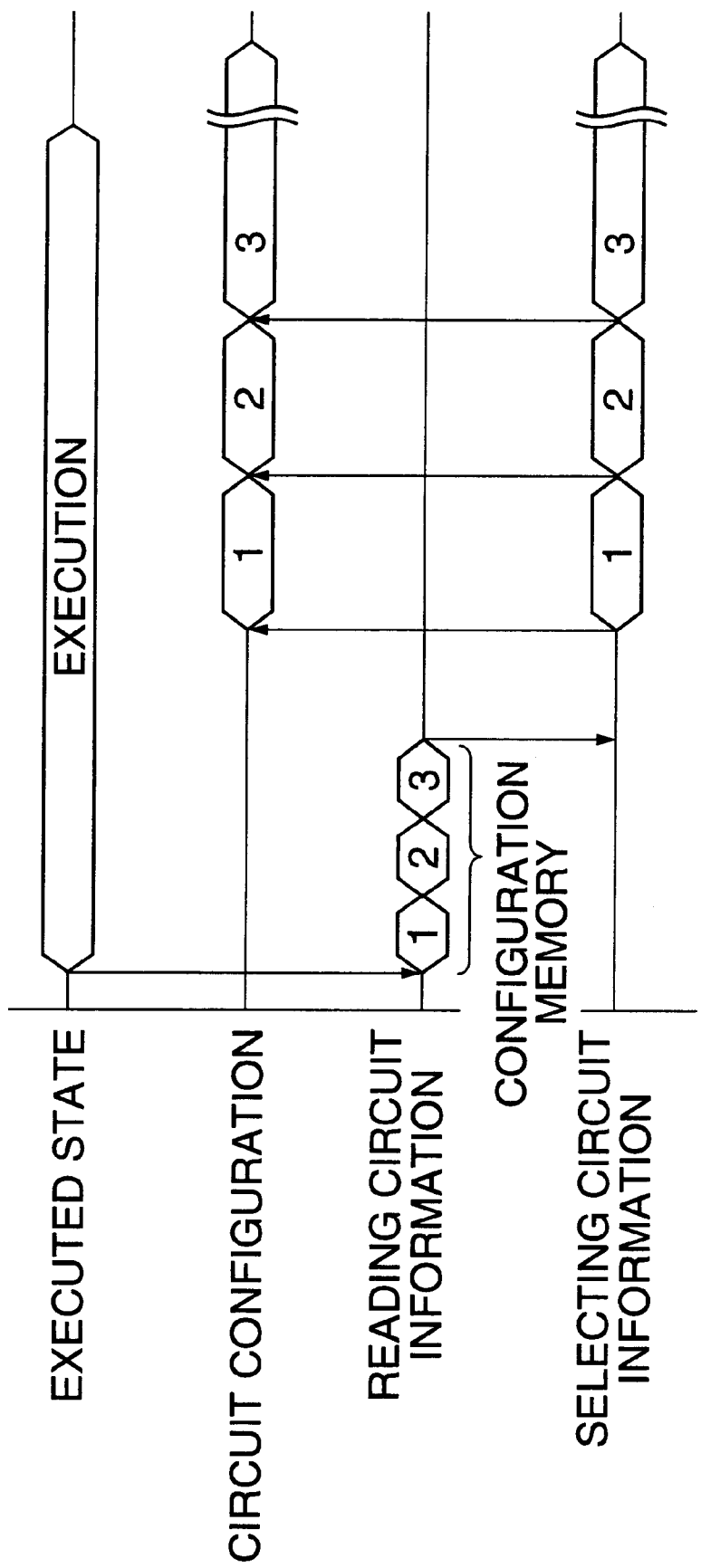
FIG. 39 is a timing chart for explaining the operation of the programmable logic device based upon conventional type multicontext technique.
Figure 40:
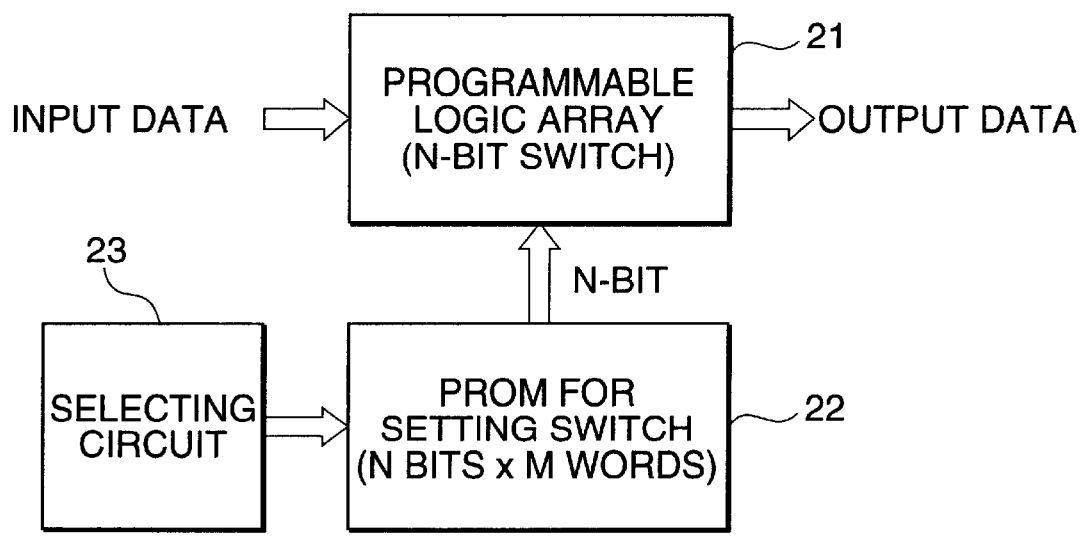
FIG. 40 is a block diagram for explaining an example 1 of the programmable logic device based upon conventional type multicontext technique.
Figure 41:
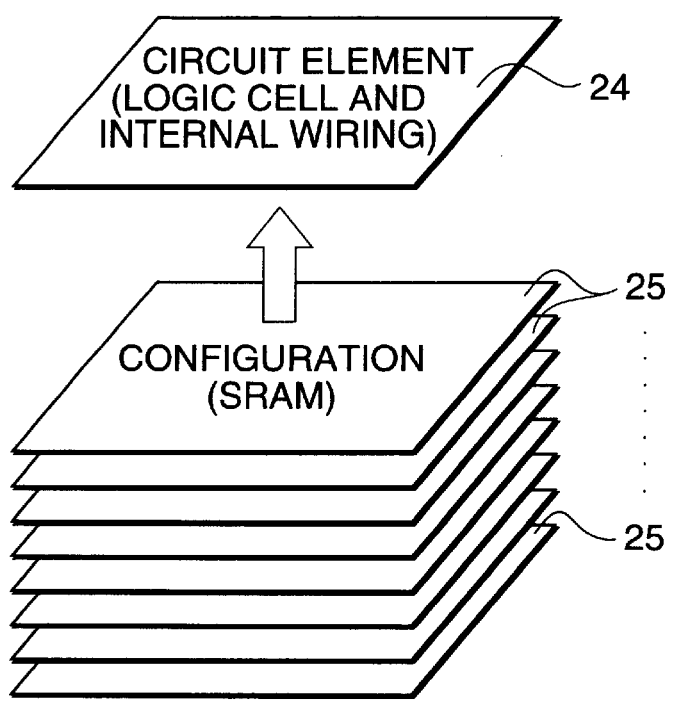
FIG. 41 is a block diagram for explaining an example 2 of the programmable logic device based upon conventional type multicontext technique.
Figure 42:
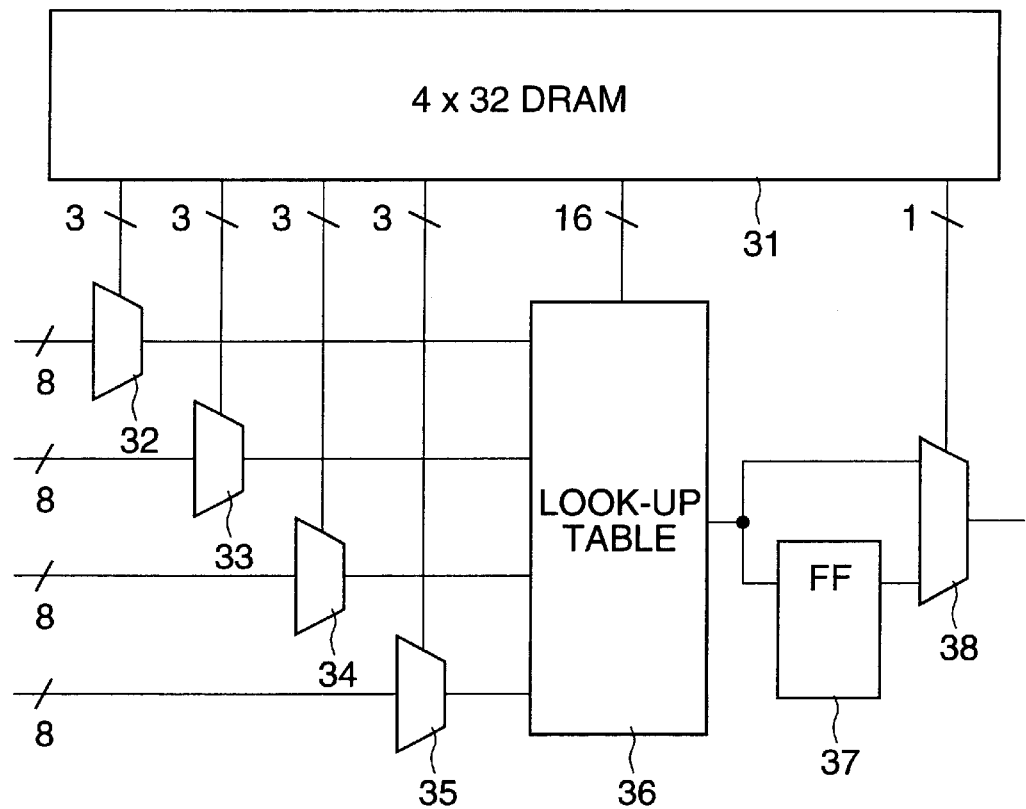
FIG. 42 is a block diagram for explaining an example 3 of the programmable logic device based upon conventional type multicontext technique.
Figure 43:
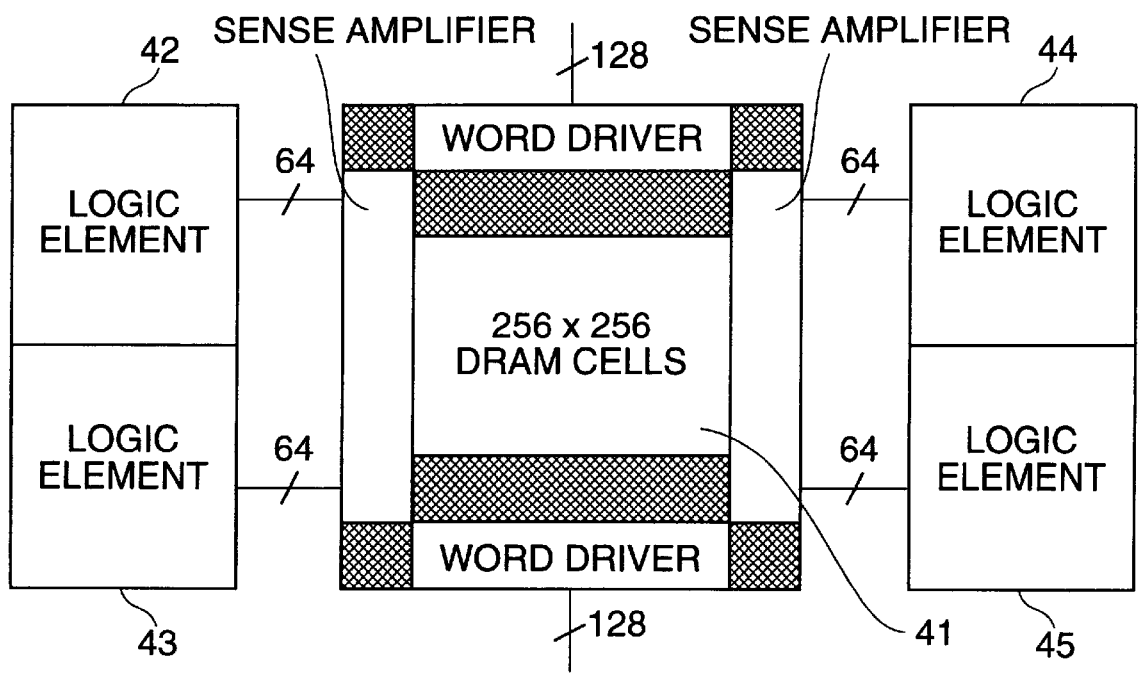
FIG. 43 is a block diagram for explaining an example 4 of the programmable logic device based upon conventional type multicontext technique.

FIG. 2A shows the frame structure of three circuit information pieces 1, 2 and 3 in the conventional example shown in FIG. 37. As shown in FIG. 2A, one circuit information of circuit information pieces 1, 2 and 3 includes five frames and when the frame structure of circuit information is further detailedly viewed, it is as follows.

Circuit information 1 includes two types of frames of a frame (1-A) and a frame (1-B) and includes five frames in total of one frame (1-A) and four frames (1-B).

Circuit information 2 includes four types of frames (1-A, 2-A, 2-B, 2-C) and the frame (1-A) of them is the same as the frame (1-A) configuring the circuit information 1. The circuit information 2 includes five frames in total of two frames (1-A), one frame (2-A), one frame (2-B) and one frame (2-C).

Circuit information 3 includes three types of frames (2-A, 2-B, 3-A), and the frame (2-A) and the frame (2-B) of them are the same as the frames configuring the circuit information 2. The circuit information 3 includes five frames in total of three frames (2-A), one frame (2-B) and one frame (3-A).

In the first embodiment, three circuit information pieces 1, 2 and 3 for reconfiguring the same circuit as the circuit shown in FIG. 37 are compressed considering the repetition of frames and the reference of frames in another circuit information so that the three circuit information pieces are configured by the number of frames smaller than the conventional number.

That is, the circuit information 1 includes two frames of the frame (1-A) and the frame (1-B) as shown in FIG. 2B. At this time, reference information that the frame is repeated three times is added to the frame (1-B) in the circuit information 1. A frame including reference information of repetition as described above is called a repeat frame in the specification.

The circuit information 2 includes four frames of the frame (2-A), the frame (1-A), the frame (2-B) and the frame (2-C) as shown in FIG. 2B. At this time, reference information that the corresponding frame date is the same as that of the frame (1-A) in the circuit information 1 is added to the frame (1-A) in the circuit information 2. A frame including the reference information of a frame in another circuit information as described above in called a reference frame in this specification.

The circuit information 3 includes three frames of the frame (2-A), the frame (2-B) and the frame (3-A) as shown in FIG. 2B. At this time, the frame (2-A) and the frame (2-B) in the circuit information 3 are reference frames to which reference information that respective frame data are the same as that of the frames (2-A) and (2-B) in the circuit information 2 is added. The frame (2-A) in the circuit information 3 is a repeat frame to which reference information that the frame is repeated three times is added.

Concrete example of circuit information in serial format according to the invention FIGS. 3 shows an example of the structure of circuit information in a serial format according to the invention. As conventional type circuit information in a serial format shown in FIG. 27, circuit information in a serial format in this example also includes a header HDs, a data division DTs and a footer FTs as shown in FIG. 3A. As described above, in the programmable logic device 100, circuit information in a serial format is treated as serial data, however, parallel transmission and parallel memory access are enabled by delimiting in a suitable unit such as 8 bits.

As shown in FIG. 3A, a header HDs includes a preamble code showing the beginning of circuit information, length count showing the data quantity of circuit information and a delimiter showing the end of the header. It is similar to the conventional case shown in FIG. 27 that a footer FTs includes a postamble code showing the end of circuit information.

Length count is used for information for transfer to a shift register as in the case of the conventional type programmable logic device 1 and in this embodiment, length count is also used for information to instruct editing by the circuit information editor 103.

Figures 27A, 27B:
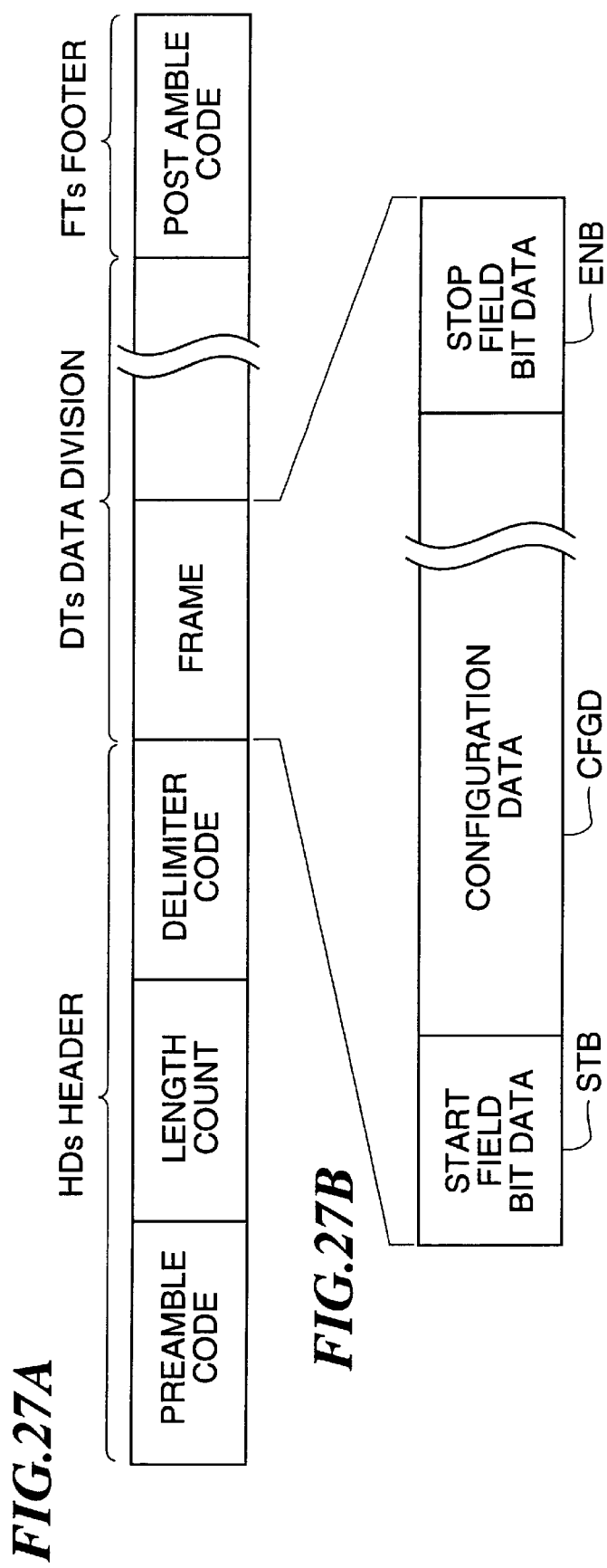
FIGS. 27A and 27B explain conventional type circuit information in a serial format.
Figure 28:
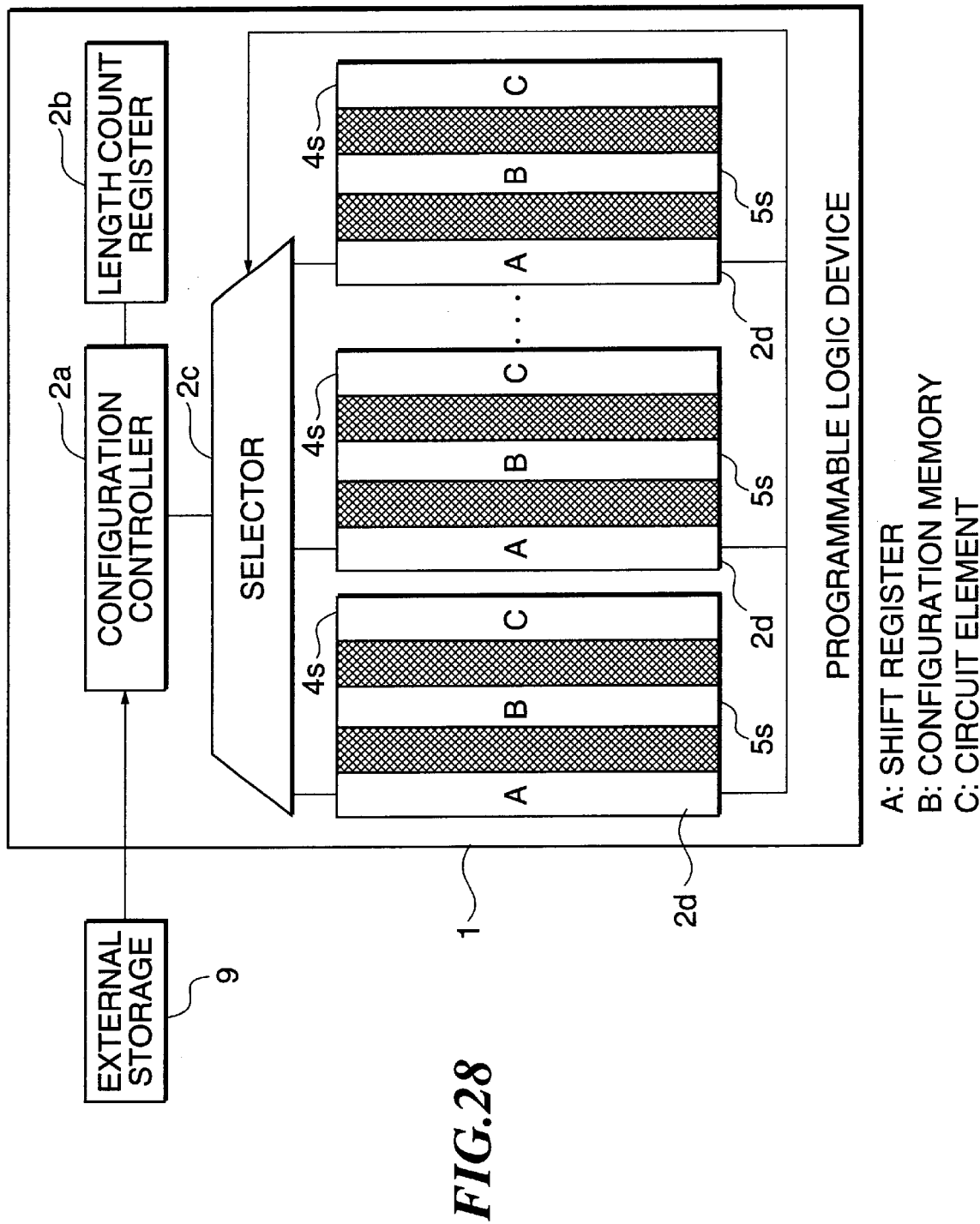
FIG. 28 is a block diagram for explaining a conventional type programmable logic device using circuit information in a serial format.
Figure 31:
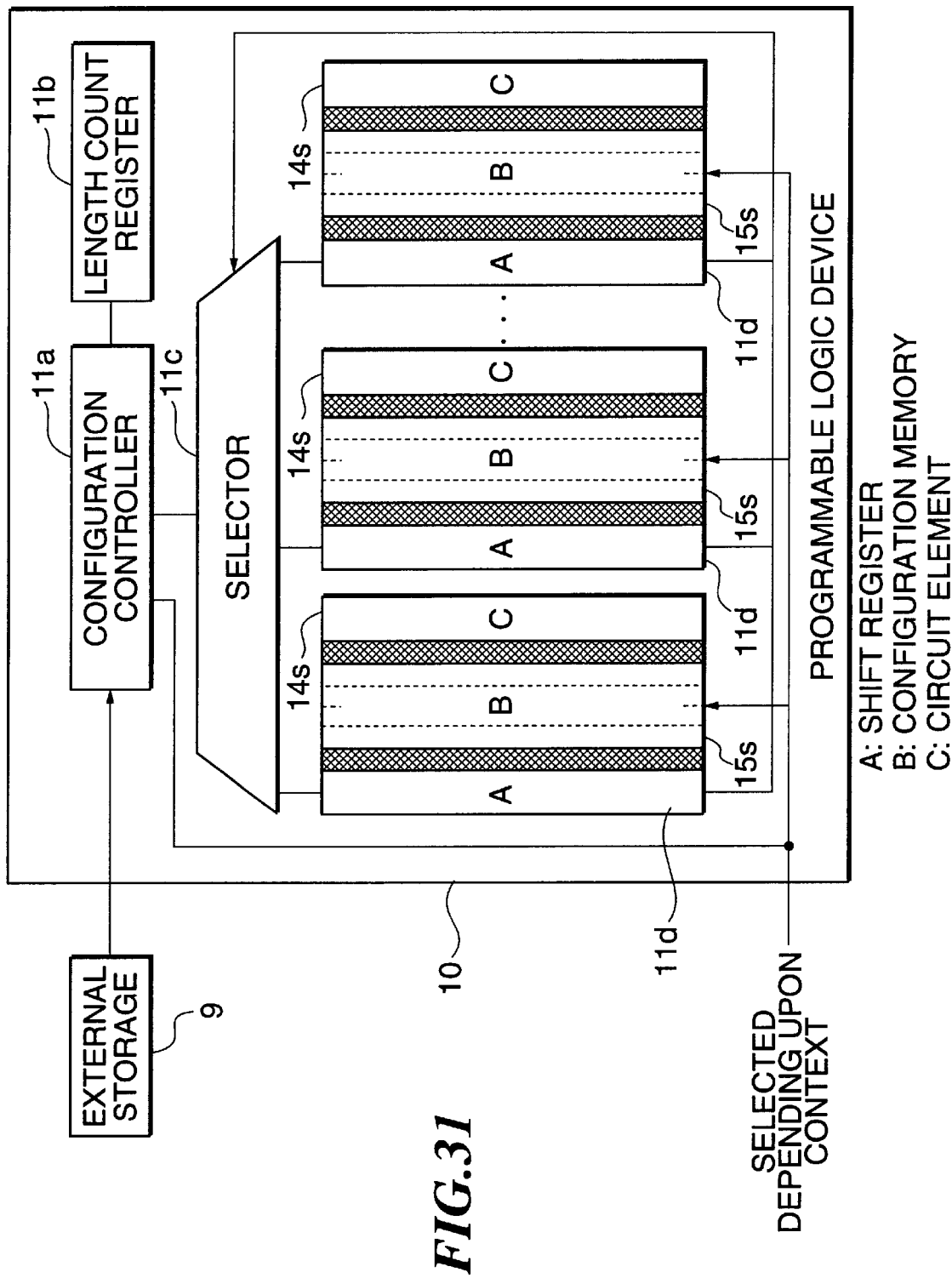
FIG. 31 is a block diagram for explaining a programmable logic device based upon multicontext technique using circuit information in a serial format.

In this embodiment, a data division DTs includes plural frames and this embodiment is different from the conventional case shown in FIG. 27 in that each frame includes any of three types of frames. For the types of frames including the data division, there are three types of a normal frame having the same structure as that in the conventional example, the above repeat frame and the above reference frame.

That is, a normal frame includes start field bit data STB showing the beginning of a frame, configuration data CFGD stored in a configuration memory and stop field bit data ENB showing the end of the frame as a frame used for conventional circuit information as shown in FIG. 3B.

A repeat frame includes start field repeat data STrp showing the beginning of a repeat frame, configuration data CFGD stored in a configuration memory, reference count RCNT showing the number of repeats of the same frame data and stop field bit data ENB showing the end of the frame as shown in FIG. 3C. In start field repeat data STrp, identification information showing that the corresponding frame is a repeat frame is included. According to a procedure to be described later, normal frames of the number indicated in reference count RCNT are generated successively from the corresponding repeat frame.

A reference frame includes start field reference data STref showing the beginning of a frame, a reference address RADR showing the address of another frame at the destination of reference in the circuit information storage 102, reference count RCNT showing the number of repeats of reference, a reference offset ROFS showing a relative address for data to be read in another frame at the destination of reference and stop field bit data ENB showing the end of the frame as shown in FIG. 3D. In start bit reference data STref, identification information showing that the corresponding frame is a reference frames is included.

According to a procedure to be described later, normal frames having configuration data stored in the circuit information storage 102 and calculated based upon a reference address RADR and an offset address ROFS are generated by the number indicated in reference count RCNT successively from the corresponding reference frame.

Circuit information in a serial format used in this embodiment is characterized in that the circuit information has two types of frames of a repeat frame and a reference frame in addition to a normal frame. These three types of frames are recognized by the circuit information editor 103 because they have the respective different start field codes as described above.

As described above, one characteristic of the invention is that the data size (the number of frames including circuit information) of circuit information is small even if circuit information pieces are the same circuit information for reconfiguring a circuit. Circuit information whose data size is small is called compressed circuit information.

In an example shown in FIG. 37, one piece of circuit information includes five frames (five normal frames) and three circuit information pieces (the circuit information pieces 1, 2, 3) are stored in the configuration memory 15 via the circuit information input controller 2. Therefore, the configuration memory 15 of the programmable logic device 10 based upon conventional type multicontext technique shown in FIG. 25 is required to have capacity that can store at least 15 frames in this case.

That is, generally, the configuration memory of the programmable logic device based upon multicontext technique requires storage capacity equivalent to as many times as the number of circuit information pieces stored in the configuration memory of the normal conventional type programmable logic device shown in FIG. 22.

In the meantime, in the first embodiment, plural circuit information pieces read from an external storage for example are temporarily stored in the circuit information storage 102. The circuit information editor 103 fetches compressed circuit information from the circuit information storage 102 according to a selective signal of circuit information and edits the fetched circuit information so that it becomes circuit information to be stored in the configuration memory 106 similar to a conventional one and having capacity for storing one circuit information.

Next, the circuit information input controller 101 stores the edited circuit information in the configuration memory 106 and a circuit selected by the circuit element 105 is reconfigured based upon the circuit information.

Another characteristic of the invention is that the capacity of the configuration memory 106 in the programmable logic circuit 104 is equal to the capacity of the conventional type programmable logic device independent of the number of circuit information pieces stored in the programmable logic device 100. In the case of the example that circuit information in the format of a normal frame includes five frames, the configuration memory 106 has only to have capacity that can store five frames equivalent to one circuit information.

Therefore, the problem that the load capacity of the circuit element is increased because the circuit scale of the configuration memory in the programmable logic device based upon conventional type multicontext technique is large, the performance of a circuit is deteriorated and power consumption is increased is solved by the first embodiment.

Also, in the first embodiment, as circuit information is compressed as shown in FIG. 2B, the circuit information storage 102 can store required plural circuit information pieces with capacity smaller than capacity required in the structure of a normal frame. In the case of the above example, in the case where circuit information is stored in a format of a normal frame, the circuit information storage 102 requires capacity for 15 frames, however, as shown in FIG. 2C, the circuit information storage requires only capacity for storing nine frames.

Figure 4:
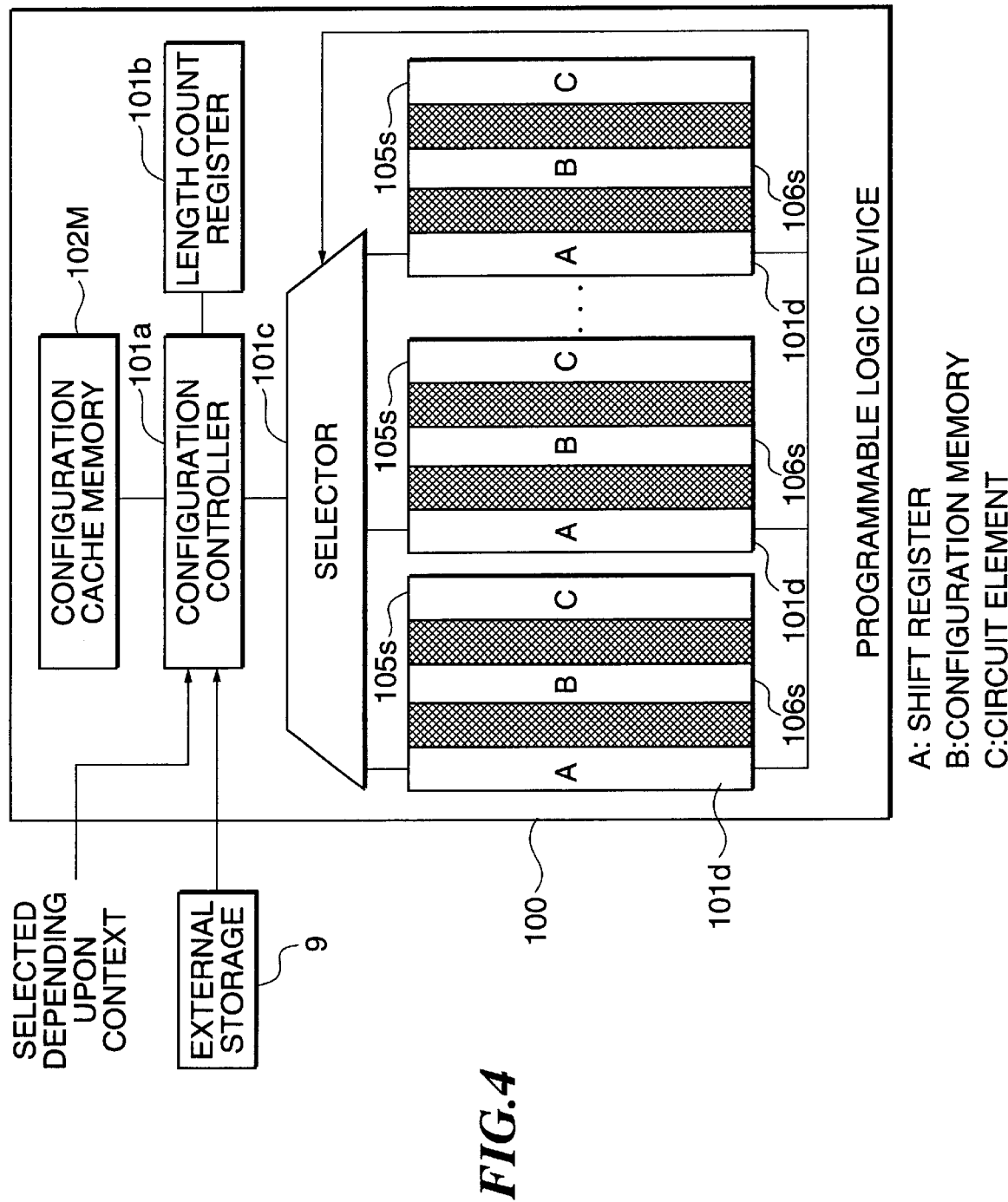
FIG. 4 is a block diagram for explaining a programmable logic device in an embodiment for configuration using circuit information in a serial format.

Configuration based upon circuit information in serial format of programmable logic device 100 in first embodiment FIG. 4 is a functional block diagram for explaining configuration operation based upon circuit information in a serial format to the programmable logic device in the first embodiment shown in FIG. 1. the storage of circuit information in the configuration memory in this case will be described below using the block diagram shown in FIG. 4.

The circuit information input controller 101 shown in FIG. 1 includes a configuration controller 101a, a length count register 101b, a selector 101c and plural shift registers 101d in FIG. 4.

Also, the circuit element 105 and the configuration memory 106 in the programmable logic circuit 104 shown in FIG. 1 are divided into plural columns in units of one column of plural logic circuit cells in the case of the FPGA type shown in FIG. 24A for example in FIG. 4.

That is, a set of a configuration memory 106s having capacity that can store circuit information for one column of plural logic circuit cells and a circuit element 105s connected to the configuration memory is provided by plural columns. In this case, circuit information including one normal frame is the size of circuit information for one column of plural logic circuit cells.

A register at each digit of each shift register 101d is connected to each memory cell of the configuration memory 106s in each column. Therefore, each shift register 101d has the number of columns for circuit information of the number of one columns of logic circuit cells in the case of the FPGA type shown in FIG. 24A for example. One shift register is allocated to one column of plural logic circuit cells and the shift registers 101d are provided by the number of logic circuit cells in a horizontal direction.

In the case where the number of logic circuit cells is large, one shift register 101d is provided for plural rows of approximately a few to few tens of rows and one shift register 101d is used for the plural rows in common. The size of a normal frame of circuit information is equivalent to data quantity for one shift register 101d.

The circuit information storage 102 shown in FIG. 1 corresponds to a configuration cache memory 102M and the function of the circuit information editor 103 is built in the configuration controller 101a.

When circuit information is read from the external storage 9 in the configuration shown in FIG. 4, it is stored in the configuration cache memory 102M via the configuration controller 101a.

When the configuration controller 101a receives an instruction to select context, circuit information corresponding to the instruction is read from the configuration cache memory 102M into the configuration controller 101a. The configuration controller 101a detects a preamble code in the header HDs of the read circuit information and starts circuit information editing processing.

Length count next to the preamble code is stored in the length count register 101b. The value of the length count register 101b is decremented by one every date shift described next in the shift register 101d and until the value of the length count register 101b becomes 0, the shift register 101d is operated. Hereby, all data is sent to the shift register 101d.

A data division DTs next to a delimiter is converted from a compressed frame in a state of a repeat frame and a reference frame to a normal frame in a state in which compression is decompressed according to a procedure described later and is sent to the selector 101c.

In an initial state, the selector 101c sends data to a shift register 101d in a first column. The shift register 101d sequentially shifts data sent from the selector 101c. When data is shifted to the end of the shift register 101d, the selector 101c switches the sending of data to a shift register 101d in the next column. All data is stored in the shift register 101d by operating the shift register 101d until the value of the length counter becomes 0 as described above.

When the shift register 101d is filled with data, the data is simultaneously transferred to the configuration memory 106s in parallel and the programmable logic circuit 104 is reconfigured. In this case, as shown in FIG. 29 for example, data is simultaneously transferred from the shift register to the configuration memory in parallel be connecting the latch of each memory cell of the configuration memory 106s to each register of the shift register and sending a latch clock LCLK to the latch.

When the configuration controller 101a detects a postamble code in a footer FTs next to the data division DTs, configuration processing is finished.

Figure 5:
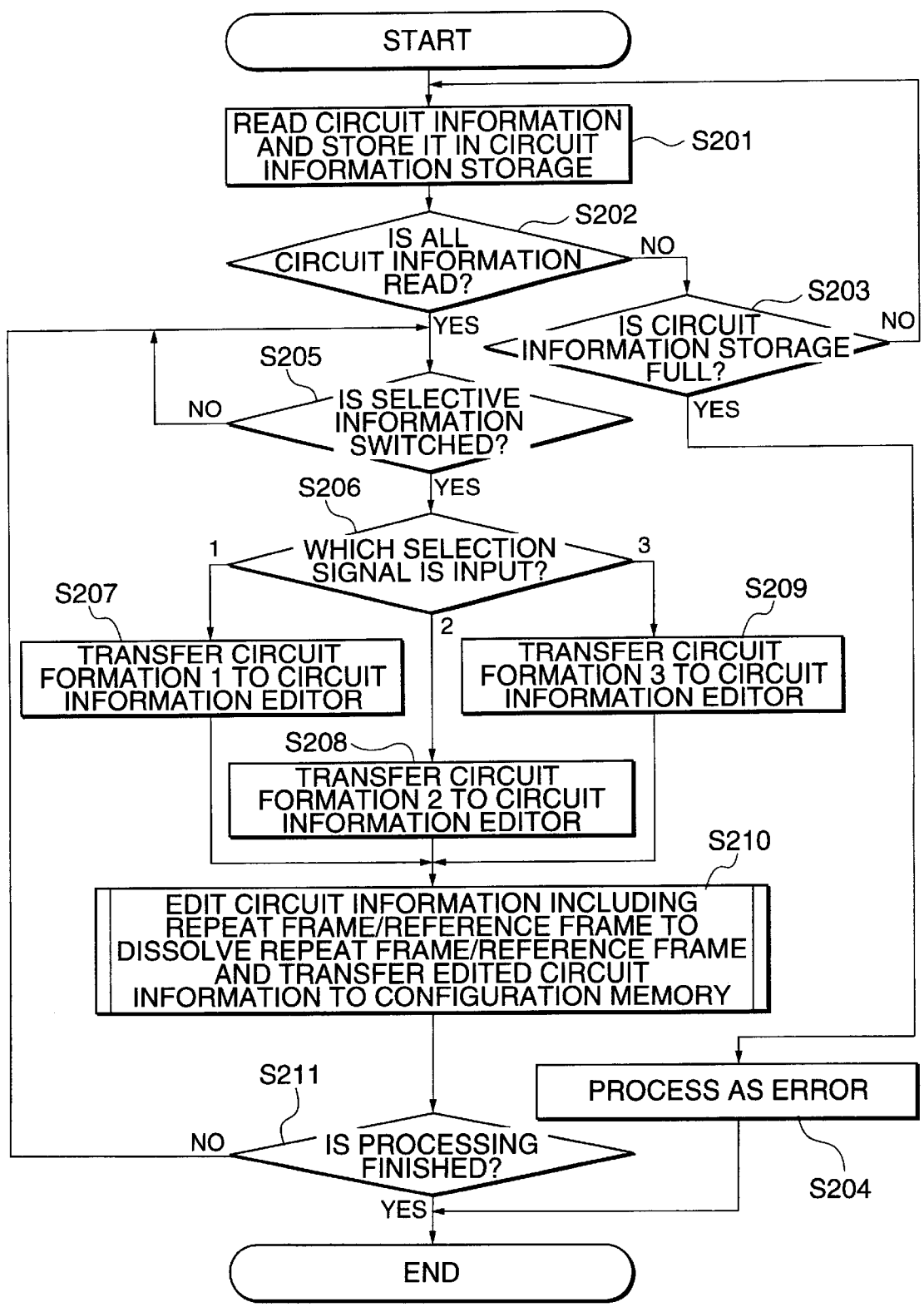
FIG. 5 is a flowchart for explaining the operation of the programmable logic device in the first embodiment.

Referring to flowcharts in FIGS. 5, 7 and 8 and a timing chart shown in FIG. 6, a procedure for reconfiguration described above will be described below assuming that processing instructed by an application program is executed using three circuit information pieces of circuit information pieces 1, 2 and 3 as the above example. In the timing chart shown in FIG. 6, it is supposed that the programmable logic device is reconfigured in the order of the circuit information pieces 1, 2 and 3 and processing is finished.

First, the circuit information input controller 101 stores sequentially reads circuit information stored in an external storage (not shown in FIG. 1) and others and stores it in the circuit information storage 102 (a step S201). At this time, every time circuit information is read, the circuit information input controller checks the residual capacity of the circuit information storage 102 (the configuration cache memory 102M) (steps S202 and 203) and when the circuit information storage 102 becomes full before all circuit information pieces are read, the circuit information input controller detects an error and terminates operation (a step S204).

When the circuit information input controller 101 stores all circuit information pieces in the circuit information storage 102, the circuit information editor 103 (a part of the configuration controller 101*a*) monitors a selection signal (a step S205). When the circuit information editor 103 detects that a selection signal is switched based upon the operation for selection of a user for example, it identifies which of three circuit information pieces is selected (a step S206) and reads circuit information according to the switched selection signal from the circuit information storage 102 (a step S207 or a step S208 or a step S209).

Figure 7:
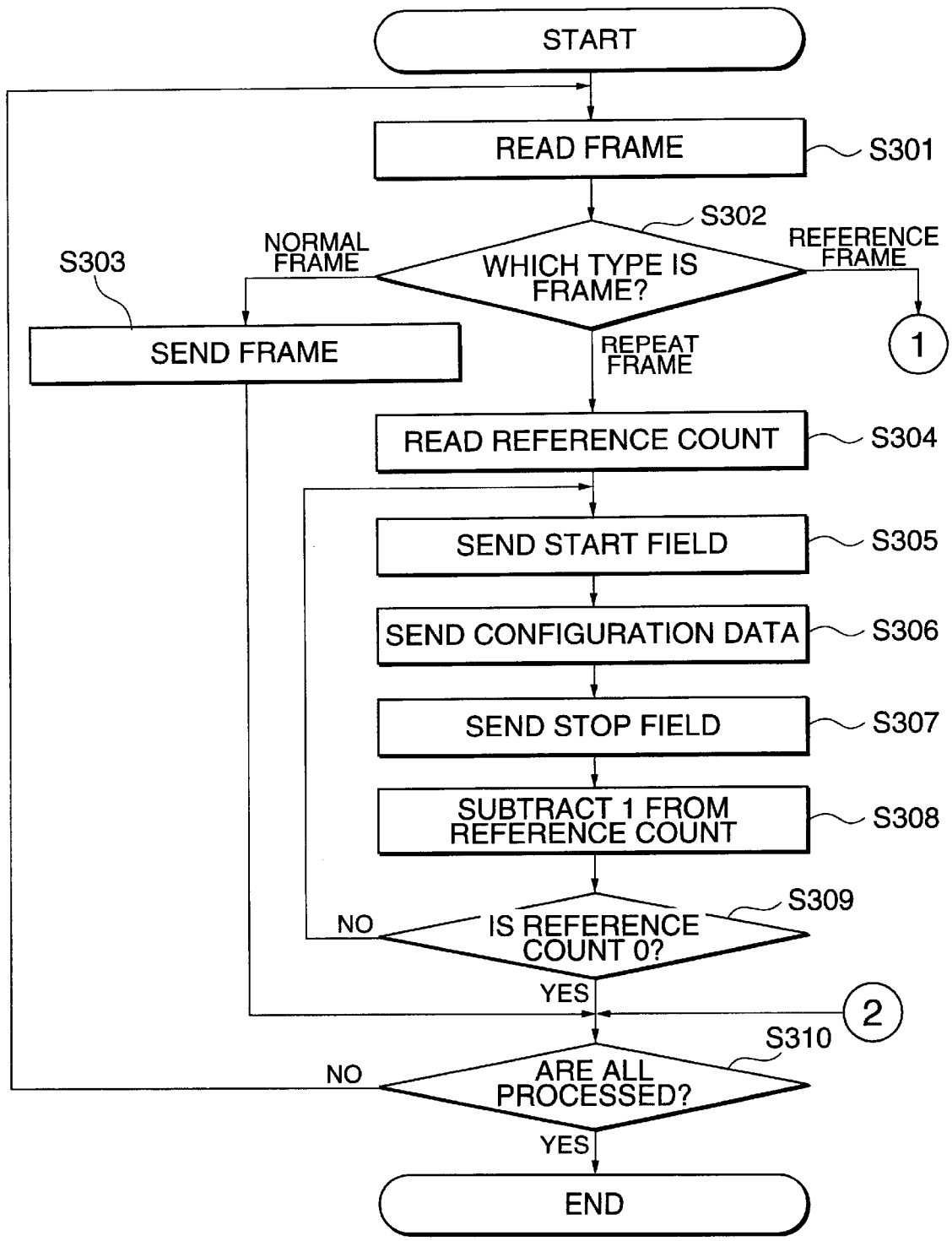
FIG. 7 is a part of a flowchart for explaining the editing of circuit information in a serial format in the programming logic device in the first embodiment and a programmable logic device in a third embodiment.
Figure 8:
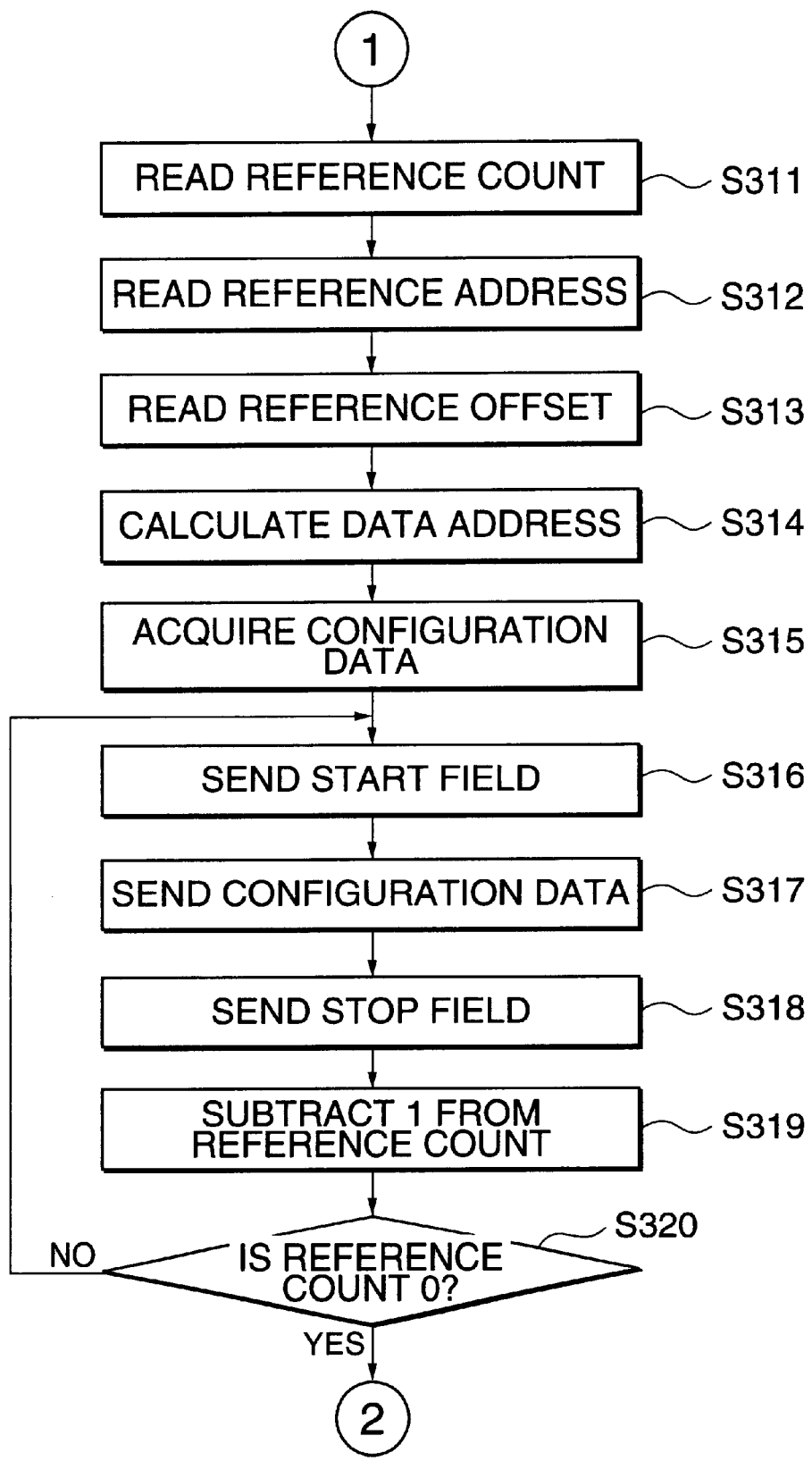
FIG. 8 is the remainder of the flowchart for explaining the editing of circuit information in a serial format in the programmable logic device in the first and third embodiments.

Next, the circuit information editor checks whether there are the repeats of frames (repeat frames) and the reference of a frame in another circuit information (a reference frame) or not based upon the read circuit information and when the circuit information editor judges that the read circuit information includes a repeat frame and a reference frame, it decompresses a compressed state of circuit information by dissolving the repeat frame and the reference frame as shown in the flowcharts in FIGS. 7 and 8 and transfers circuit information after the compressed state is dissolved to the configuration memory 106 (a step S210).

The circuit information editor 103 adds the same frame three times after a frame (1-B) in case the frame (1-B) is repeated four times as in circuit information 1 as shown in FIG. 2D for example. As in circuit information 2, if a frame (1-A) in circuit information 1 is referred by a second frame in it, the circuit information editor 103 fetches data in the frame (1-A) in the circuit information 1 from the circuit information storage 102 and inserts the data into the second frame of the circuit information 2. Further, in the case where a frame (2-A) and a frame (2-B) in the circuit information 2 are referred by first, second, third and fourth frames as in circuit information 3, the circuit information editor 103 fetches data in the frame (2-A) and the frame (2-B) in the circuit information 2 from the circuit information storage 102 and inserts the data into the first, second, third and fourth frames in the circuit information 3.

As described above, when a compressed state is decompressed, frame data in circuit information including a normal frame is all transferred to the configuration memory 106 and stored, the reconfiguration of a specified circuit to the programmable logic circuit 104 is completed. In the case where read circuit information includes no repeat frame and no reference frame, the circuit information is sequentially transferred to the configuration memory 106 as it is and the reconfiguration of a specified circuit is completed.

Afterward, as long as processing by the programmable logic device 100 continues, the monitoring of a selection signal by the circuit information editor 103 is continued (processing after a step S211 and the step S205). When processing by the programmable logic device 100 is finished (the step S211), a procedure for reconfiguration is finished independent of a selection signal.

In the case where processing by the programmable logic device 100 is finished, a state reconfigured based upon finally selected circuit information is generally kept unless power supply to the programmable logic device 100 is stopped.

Referring to the timing chart shown in FIG. 6, the above processing will be further described below. That is, when processing becomes an execution state, three circuit information pieces 1, 2 and 3 are first read in the circuit information storage 102. When reading is finished and an instruction to select circuit information is issued, circuit information instructed to be selected is transferred from the circuit information storage 102 to the circuit information editor 103 and required editing is executed. The edited circuit information is stored in the configuration memory 106 and the programmable logic circuit 104 is reconfigured based upon the circuit information.

Figure 6:
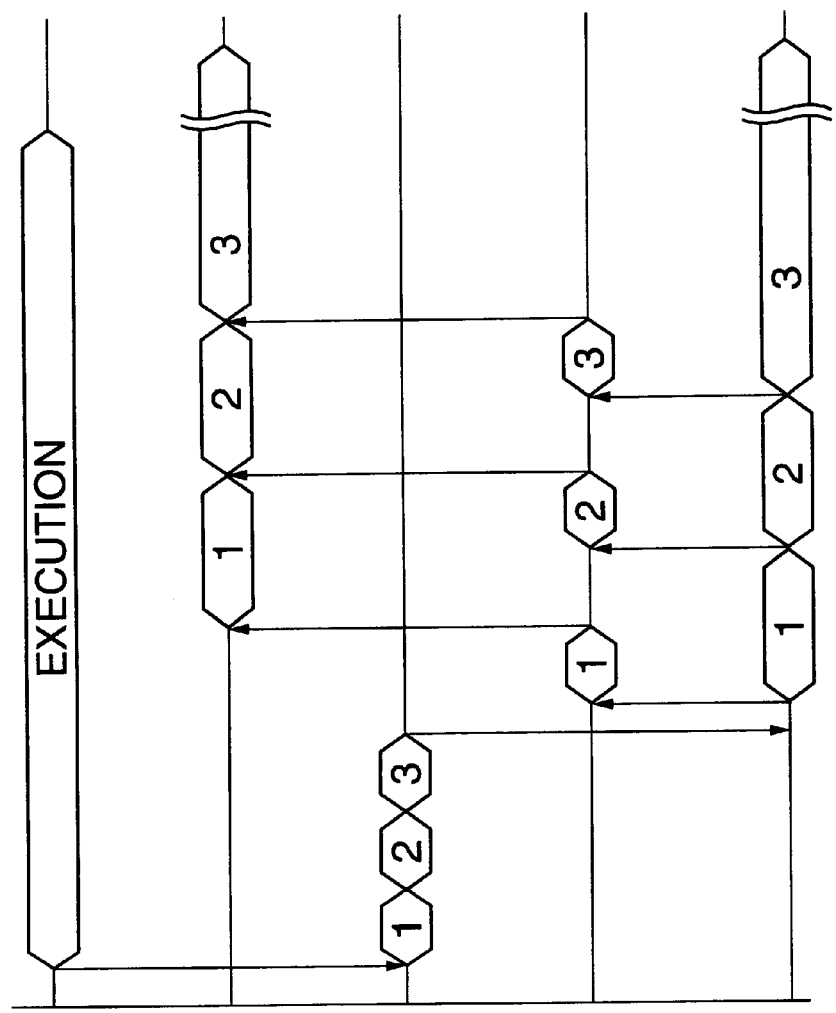
FIG. 6 is a timing chart for explaining the operation of the programmable logic device in the first embodiment and a programmable logic device in a second embodiment.

The reason why circuit information 3 also continues to be configured after execution is finished as shown in FIG. 6 is that the programmable logic device is generally kept in a state reconfigured based upon finally selected circuit information unless power supply is stopped in case processing is finished as described above.

In the case where the shift register 101*d* exists for all sets of the configuration memory 106*s* and the circuit element 105*s*, circuit information after editing is stored in the configuration memory 106 by writing it to the shift register 101*d*.

However, in the case where the shift register 101*d* is shared by plural columns (plural sets) of the configuration memories 106*s* and circuit elements 105*s*, the circuit information editor 103 is required to be provided with a memory for storing the result of editing.

Processing for dissolving repeat frame and reference frame by circuit information editor 103

Referring to FIGS. 7 and 8, editing processing including processing for dissolving a repeat frame and a reference frame in the step S210 shown in FIG. 5 and transfer processing to the configuration memory 106 will be described below.

First, the circuit information editor 103 reads a first frame (a step S301) and identifies the type of the frame based upon the start field of the frame (a step S302). That is, when the start field is start field bit data STB, the circuit information editor identifies that the frame is a normal frame, when the start field is start field repeat data STrp, the circuit information editor identifies that the frame is a repeat frame and further, when the start field is start field reference data STref, the circuit information editor identifies that the frame is a reference frame.

As a result of the identification of the type of the frame in the step S302, when the read frame is a normal frame, data in the frame is sent as it is (a step S303).

As a result of the identification of the type of the frame in the step S302, when the read frame is a repeat frame, reference count RCNT is read (a step S304). Next, as output is sent as the date of a normal frame, start field bit data STB, configuration data CFGD and stop field bit data ENB are sent (steps S305, S306 and S307) and reference count RCNT is decremented by one (a step S308).

It is identified whether the value of reference count RCNT is 0 or not (a step S309) and if the value is not 0, a procedure from the step S305 to the step S308 is repeated. When reference count RCNT is 0, it is identified whether all processing is finished or not (a step S310), if all processing is not finished, control is returned to the step S301 and the above steps are repeated. When all processing is finished, the processing routine is finished.

As described above, normal frames of the number indicated in reference count RCNT are generated based upon a compressed repeat frame by repeating the procedure from the step S305 to the step S308 until reference count RCNT becomes 0.

As a result of the identification of the type of the frame in the step S302, when the read frame is a reference frame, reference count RCNT, a reference address RADR and a reference offset ROFS are read (steps S311, S312, S313 shown in FIG. 8).

Next, the absolute address in the circuit information storage 102 of configuration data to be referred is calculated by adding a reference offset ROFS showing a relative position of the configuration data CFGD referred in a frame at the destination of reference to a reference address RADR showing the position of the frame at the destination of reference in the circuit information storage 102 (a step S314).

Next, the configuration data located at the absolute address is read from the circuit information storage 102 and is temporarily stored in the circuit information editor 103 (a step S315).

Next, as in the case of a repeat frame, as output is sent as data in a normal frame, start field bit data STB, configuration data CFGD and stop field bit data ENB are sequentially sent (steps S316, S317 and S318) and reference count RCNT is decremented by one (a step S319). A procedure from the steps S316 to S319 is repeated until reference count RCNT becomes 0 (a step S320).

When reference count RCNT becomes 0, it is identified whether all processing is finished or not (the step S310), if all processing is not finished, control is returned to the step S301 and the above steps are repeated. When all processing is finished, the processing routine is finished.

As described above, a normal frame having referred configuration data is generated by the number indicated in reference count RCNT based upon a compressed reference frame by repeating a procedure from the steps S316 to S319 until reference count RCNT becomes 0.

Circuit information the compression of which is decompressed (circuit information including only normal frames) is generated based upon circuit information compressed in the format of a repeat frame and a reference frame by performing the above procedure for all frames.

The programmable logic circuit 104 is configured according to the same procedure as the configuration of the conventional type programmable logic device by sending circuit information the compression of which is decompressed as described above from the circuit information editor 103 to the circuit information input controller 101.

Second Embodiment

Next, a second embodiment of the programmable logic device according to the invention will be described below comparing with the first embodiment.

For a programmable logic device equivalent to the second embodiment, the programmable logic device 100 having first structure shown in FIG. 1 is used. For circuit information, the same circuit information in a serial format as that shown in FIG. 3 is used. The second embodiment is different from the first embodiment in a method of configuration.

FIGS. 9 explain circuit information and its editing operation in the second embodiment. An example shown in FIG. 9 also shows a procedure for reconfiguring three circuits based upon the same three circuit information pieces 1, 2 and 3 as those shown in FIG. 37 described in the configuration of the programmable logic device based upon conventional type multicontext technique as in the case of the first embodiment shown in FIG. 2.

In FIG. 9, the frame structure of circuit information is also the same as that shown in FIG. 2. That is, FIGS. 9A to 9C are the same as FIGS. 2A to 2C.

In the second embodiment, as shown in the timing chart in FIG. 6, reconfiguration is executed in the order of circuit information pieces 1, 2 and 3.

In the second embodiment, when reconfiguration is executed based upon circuit information 3 after reconfiguration based upon circuit information 2, it is detected by the circuit information editor 103 that frame data in a first frame and a fourth frame in circuit information 3 is respectively the same as frame data in a first frame and a fourth frame of the circuit information 2.

A fact that data in frames located in the same position is the same in different circuit information pieces means that the function and a connected state of a circuit element corresponding to the corresponding frame are the same in the programmable logic circuit 104 even if circuit information is different. That is, in the case where reconfiguration is executed based upon circuit information 3 after reconfiguration based upon circuit information 2, it proves that circuit information corresponding to a first frame and a fourth frame is not required to be stored in the configuration memory 106.

In the second embodiment, in the case where circuit information generated by editing includes data in the same frame in the same position as the circuit information of a circuit generated last, the circuit information editor 103 does not transfer data in the corresponding frame to the circuit information input controller 101.

Referring to flowcharts in FIGS. 10 and 11 and the timing chart shown in FIG. 6, editing processing by the circuit information editor 103 and transfer processing to the configuration memory 106 in the second embodiment will be described below. The timing chart shown in FIG. 6 shows that the programmable logic device is reconfigured in the order of circuit information pieces 1, 2 and 3 and processing is finished.

Figure 10:
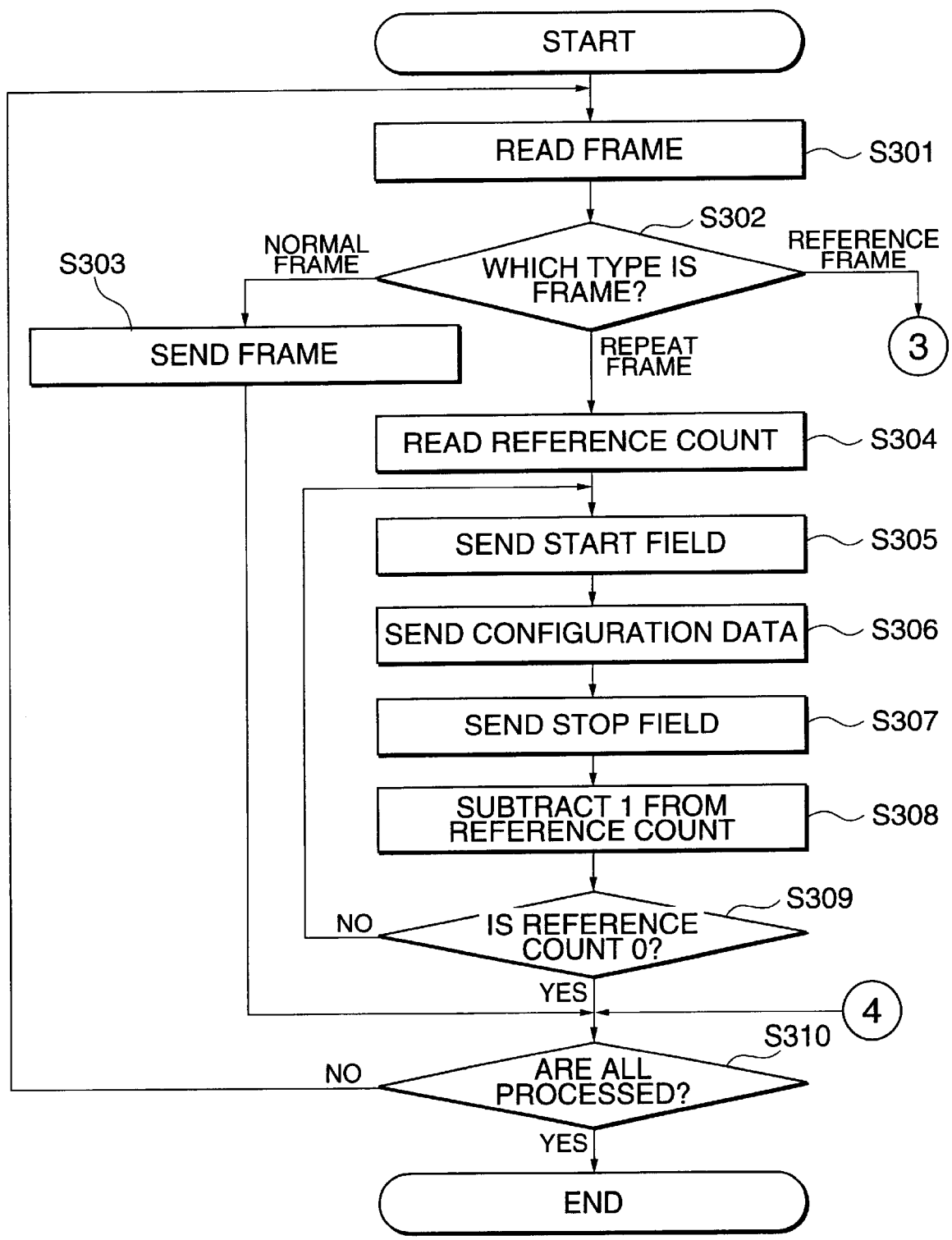
FIG. 10 is a part of a flowchart for explaining the editing of circuit information in a serial format in the programmable logic device in the second embodiment and a programmable logic device in a fourth embodiment.
Figure 11:
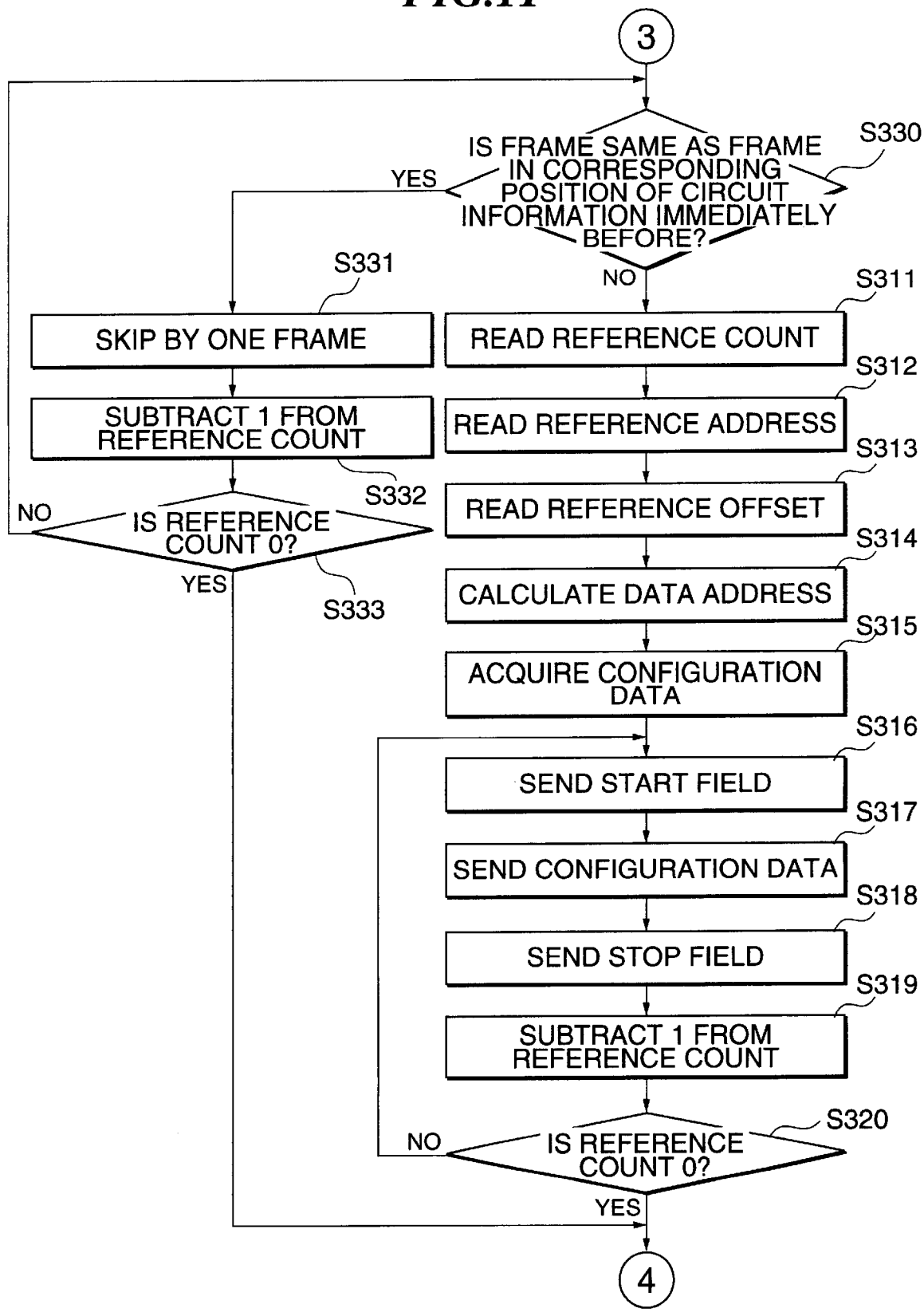
FIG. 11 is the remainder of the flowchart for explaining the editing of circuit information in a serial format in the programmable logic device in the second and fourth embodiments.

As most of the flowcharts in FIGS. 10 and 11 are similar to the corresponding flowcharts shown in FIGS. 7 and 8 in the first embodiment, the same step numbers as those in the flowcharts shown in FIGS. 7 and 8 are allocated to the similar parts.

The difference between a set of FIGS. 10 and 11 and a set of FIGS. 7 and 8 in the first embodiment is as follows. That is, as a result of the identification of the type of the frame in the step S302, when a read frame is identified as a reference frame, it is identified whether or not the frame is the same as a frame in the same position as the circuit information of a circuit reconfigured last (a step S330) as shown in FIG. 11 and if not, a procedure after the steps S311 is executed as described above.

In the meantime, as a result of the identification in the step S330, when the frame is identified to be similar to a frame in the same position as that of the circuit information of a circuit reconfigured last, the transfer of the circuit information of the frame to the configuration memory 106 is skipped (a step S331) and reference count RCNT is decremented by one (a step S332).

It is identified whether the value of reference count RCNT becomes 0 or not (a step S333), if not, control is returned to the step S330 and the above operation is repeated. When it is identified that reference count RCNT becomes 0 in the step S333, it is identified whether all processing is finished or not (the step S310), if all processing is not finished, control is returned to the step S301 and the above steps are repeated. If all processing is finished, the processing routine is finished.

The procedures of the other steps is similar to those described in relation to FIGS. 7 and 8. That is, in FIG. 11, underlined steps are added to the flowcharts shown in FIGS. 7 and 8 in the second embodiment.

Figure 9D:
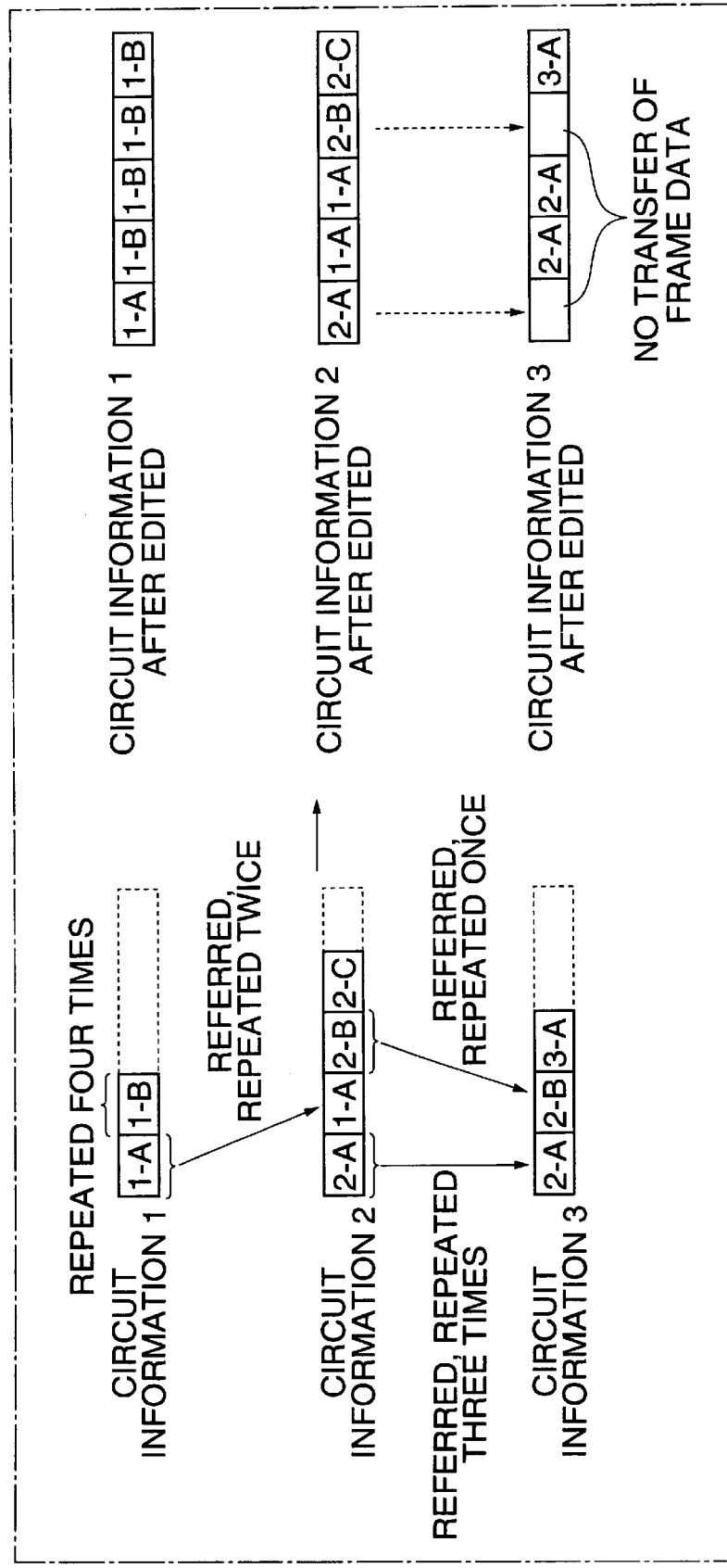

As shown in FIG. 9D, in an example of this case, a frame (2-A) in circuit information 2 is referred by first, second and third frames in circuit information 3 and a frame (2-B) in the circuit information 2 is referred by a fourth frame in the circuit information 3. Of the referred frames, frame data in the first frame and the fourth frame is equal between the circuit information pieces 2 and 3. Therefore, in the second embodiment, frame data in the first frame and the fourth frame in the circuit information 3 is not transferred to the configuration memory 106 as shown as a blank in FIG. 9D.

However, as frame data in the circuit information 2 is already transferred and stored to a part of the corresponding frame in the configuration memory 106, frame data required in the circuit information 3 is stored.

As described above, in the second embodiment, as the transfer of unnecessary frame data can be avoided by effectively utilizing circuit information that already exists in the configuration memory 106, configuration based upon circuit information can be further sped up.

Figure 12:
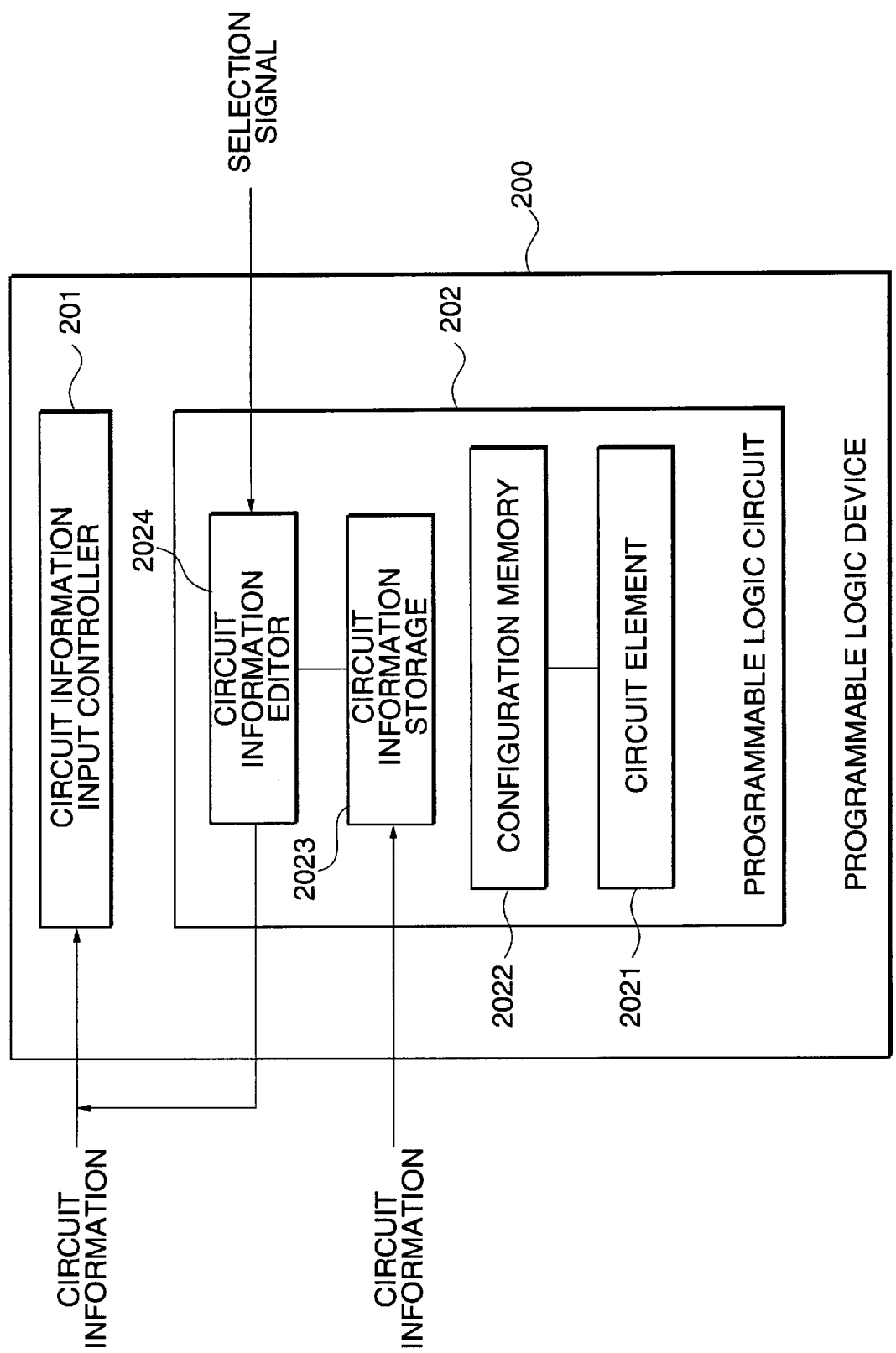
FIG. 12 is a block diagram for explaining second structure in the embodiment of the programmable logic device according to the invention.

Third Embodiment
Second structure of programmable logic circuit according to the invention A programmable logic circuit equivalent to a third embodiment is provided with the second structure of the programmable logic circuit according to the invention. FIG. 12 shows the configuration of a programmable logic circuit 200 according to the invention provided with the second structure and the programmable logic circuit includes a circuit information input controller 201 that reads circuit information from an external device and a programmable logic circuit 202 that realizes the function of a circuit based upon the read circuit information.

It is similar to the above embodiments that a circuit element 2021 the circuit of which is reconfigured and a configuration memory 2022 that stores circuit information for reconfiguring a circuit in the circuit element 2021 are provided in the programmable logic circuit 202. However, further, in the second structure, a circuit information storage 2023 that temporarily stores plural circuit information pieces required for processing and a circuit information editor 2024 that selects and edits required circuit information pieces out of these plural circuit information pieces are reconfigured and provided to the programmable logic circuit 202.

That is, in the first structure, the circuit information storage and the circuit information editor are newly provided in addition to the circuit information input controller and the programmable logic circuit which are respectively components of the conventional type programmable logic device provided with normal configuration, and the conventional type programmable logic device provided with normal configuration cannot be used as it is. However, in the second structure in the embodiment of the programmable logic device, according to the invention, the conventional type programmable logic device provided with normal configuration can be used as it is by reconfiguring the circuit information storage 2023 and the circuit information editor 2024 in the programmable logic circuit 202 in the conventional type programmable logic device provided with normal configuration.

In the second structure, as in the first structure, plural circuit information pieces read in the programmable logic device 200 are also stored in the circuit information storage 2023 in the programmable logic circuit 202 and after the plural circuit information pieces are edited by the circuit information editor 2024, they are written to the configuration memory 2022 by he circuit information input controller 201. The function and a connected state of the circuit element 2021 are determined based upon circuit information written to the configuration memory 2022.

The first difference of the second structure from the first structure is that one circuit information piece ie read by the programmable logic device 200 and a circuit provided with the respective functions of the circuit information storage 2023 and the circuit information editor 2024 is reconfigured in the programmable logic circuit 202. The circuit information at this time is stored in the configuration memory 2022 via the circuit information input controller 201.

Also, the second difference of the second structure from the first structure is that when plural circuit information pieces are read from an external storage for example and are stored the circuit information storage 2023, they are read in the circuit information storage 2023 via an input/output device in the programmable logic circuit 202 without via the circuit information input controller 201. Therefore, in the second structure, the input/output device in the programmable logic circuit 202 includes a writer of circuit information the circuit information storage 2023.

Also, the third difference of the second structure from the first structure is that circuit information edited by the circuit information editor 2024 is output to an external device outside the programmable logic device 200 via the input/output device in the programmable logic circuit 202 and is input to the circuit information input controller 201 again. It is similar to the conventional example that the circuit information input controller 201 transfers the circuit information to the configuration memory 2022 and executes configuration.

The second and third differences are caused because the conventional type programmable logic device cannot read plural circuit information pieces and a circuit configured in the programmable logic circuit is required to input/output data via the input/output device.

Configuration in third embodiment

Except that the programmable logic device 200 is provided with the second structure, the third embodiment is similar to the first and second embodiments in that circuit information is configured in a serial format and circuit information is compressed by providing three types of frame configurations shown in FIG. 3 to the circuit information.

Figure 13:
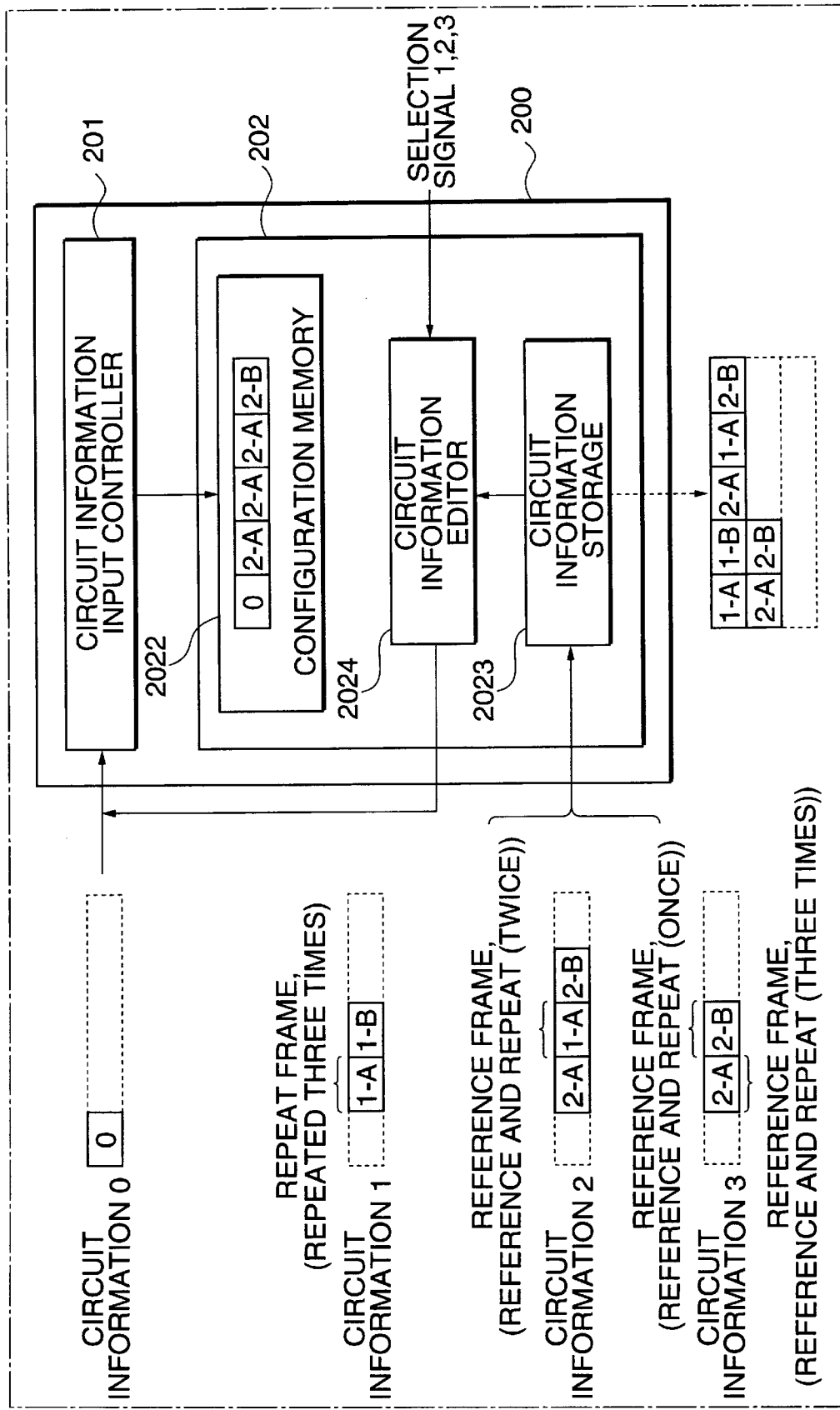
FIG. 13 explains the third embodiment of the programmable logic device according to the invention.

Referring to FIG. 13, the operation of the programmable logic device 200 equivalent to the third embodiment will be described below in view of the circuit information input controller 201, the circuit information storage 2023, the circuit Information editor 2024 and the configuration memory 2022 out of the components of the programmable logic device 200 equivalent to the third embodiment.

In an example shown in FIGS. 13, the configuration memory 2022 in the programmable logic device 200 can store circuit information for five frames. In the programmable logic device 200, the circuit information storage 2023 and the circuit information editor 2024 are reconfigured in the programmable logic circuit 202 in a first frame and three types of processing circuits are reconfigured in the residual four frames (second to fifth frames).

Actually, as shown in FIGS. 13, circuit information 0 in only a first frame for reconfiguring the circuit information storage 2023 and the circuit information editor 2024 is prepared as first circuit information. The circuit information storage 2023 and the circuit information editor 2024 are reconfigured in the programmable logic circuit 202 by the circuit information 0. Circuit information pieces 1, 2 and 3 required for processing include four frames as In FIGS. 13 because a first frame in blank so that no reconfiguration is performed in the first frame. In the example shown in FIGS. 13, three circuit information pieces 1, 2 and 3 finally include frames of the smaller number owing the compression of circuit information as in the above embodiments.

That is, the circuit information 1 includes two frames of a frame (1-A) and a frame (1-B). The frame (1-B) is a repeat frame and in the case of the example, reference information that the frame is repeated three times is added.

The circuit information 2 includes three frames of a frame (2-A), a frame (1-A) and a frame (2-B) The frame (1-A) in the circuit information 2 is a reference frame, reference information that the frame (1-A) is the same as the frame (1-A) in the circuit information 1 is added to the frame data and reference information that the frame is repeated twice is added.

The circuit information 3 includes two frames of a frame (2-A) and a frame (2-B). Reference information that respective frame data is the same as the frame (2-A) and the frame (2-B) in the circuit information 2 is added to the frame (2-A) and the frame (2-B) in the circuit information 3 and reference information that the frame (2-A) is repeated three times is also added to the frame (2-A).

As described above, circuit information in the third embodiment is also compressed as in the first embodiment. Therefore, the circuit information storage 2023 requires capacity for 12 frames in case no compression is executed, while only capacity for seven frames is required for the circuit information storage and the number of required frames can be reduced.

In the third embodiment, the function of the circuit information storage 2023 and the circuit information editor 2024 is also similar to that in the above embodiments and plural circuit information pieces read from an external device, circuit information pieces 1, 2 and in this example are temporarily stored in the circuit information storage 2023. The circuit information editor 2024 fetches compressed circuit information from the circuit information storage 2023 according to a selection signal according to an instruction to select from a user and edits the fetched circuit information so that it become circuit information similar to circuit information stored in the configuration memory in the conventional type programmable logic device. Next the circuit information input controller 201 stores circuit information from the circuit information editor 2024 in the configuration memory 2022 and the programmable logic device 200 is reconfigured based upon the circuit information.

Figure 15:
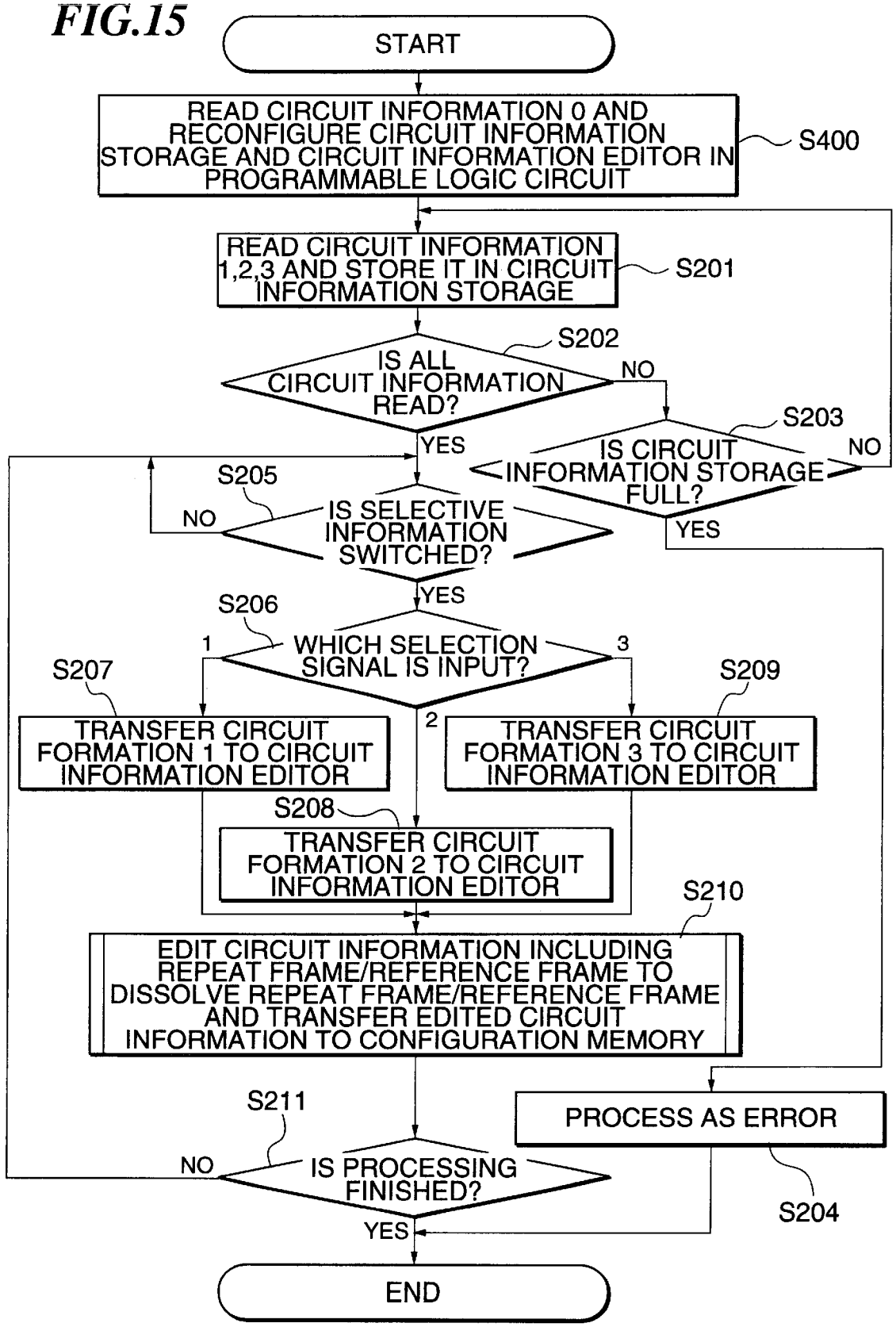
FIG. 15 is a flowchart for explaining the operation of the programmable logic device in the third embodiment.
Figure 16:
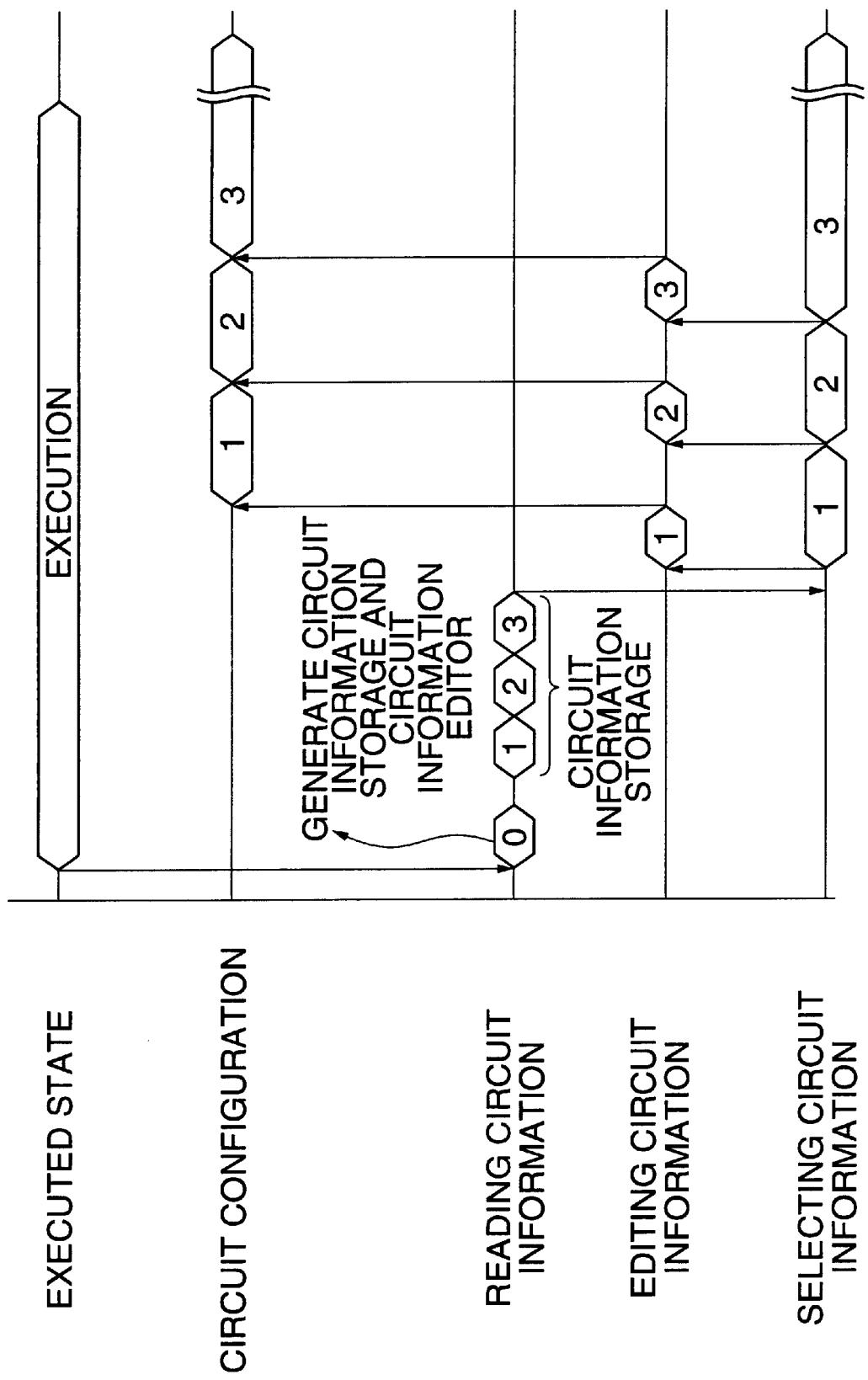
FIG. 16 is a timing chart for explaining the operation of the programmable logic device in the third and fourth embodiments.

Referring to a flowchart shown in FIG. 15 and a timing chart shown in FIG. 16, a procedure for reconfiguration will be described below. The Wing chart shown in FIG. 16 shows that a circuit required for processing is reconfigured in the programmable logic device 200 in the order of circuit information pieces 1, 2 and 3 and processing is finished.

The flowchart shown in FIG. 15 ie different from the flowchart shown in FIG. 5 in the first and second embodiments only in that a stop 9400 is first inserted and later steps are the same. In the flowchart shown in FIG. 15, the same step number is allocated to the same step as that in the flowchart shown in FIG. 5.

First, the circuit information input controller 201 reads circuit information 0 for reconfiguring the circuit information storage 2023 and the circuit information editor 2024 in the programmable logic circuit 202, As shown in FIGS. 13, the circuit information 0 has circuit information for reconfiguring the circuit information storage 2023 and the circuit information editor 2024 in a first frame 0. Second to fifth frames are blank to reconfigure a processing circuit later This procedure is the same an a procedure implemented in the conventional type programmable logic device.

Afterward, the procedure for the steps S201 to S211 is executed, circuit information pieces 1, 2 and 3 are sequentially stored in the configuration memory 2022 being decompressed and circuits required for processing are sequentially reconfigured in the programmable logic device 200.

That is, plural circuit information pieces 1, 2 and 3 stored in an external storage (not shown) and others are read one by one via the input/output device in the programmable logic circuit 202 and stored in the circuit Information storage 2023 (a step S201). Differently from the case of the above embodiments, in the case of the second embodiment, the circuit information pieces are not read via the circuit information input controller but are read via the input/output device in the programmable logic circuit 202.

At this time, every time one circuit information is read, the residual capacity of the circuit information storage 2023 is checked and when the circuit information storage 2023 becomes full before all circuit information on pieces are read, an error is detected and operation is finished (steps S202, S203 and S204).

Each first frame of read circuit information pieces 1, 2 and 3 is blank so that it does not interfere with the circuit information storage 2023 and the circuit information editor 2024 respectively already stored in the configuration memory 2022 and reconfigured in the programmable logic circuit 202 as shown in FIGS. 13, that is, so that the circuit configuration of the circuit information storage 2023 and the circuit information editor 2024 is not broken in the programmable logic circuit 202.

What all circuit information pieces are stored in the circuit information storage 2023 (the stop 3202), the circuit information editor 2024 monitors a selection signal (the steps 8205 and 9206). When the circuit information editor 2024 detects that a selection signal is switched, required circuit information ie fetched from the circuit information storage 2023 based upon the switched circuit information (the steps S207 to S209).

Next, a compressed state of circuit information is decompressed by checking the repeats of a frame (a repeat frame) and the reference of a frame in another circuit information (a reference frame) based upon the fetched circuit information and dissolving the repeat frame and the reference frame (the step S210).

Figure 14:
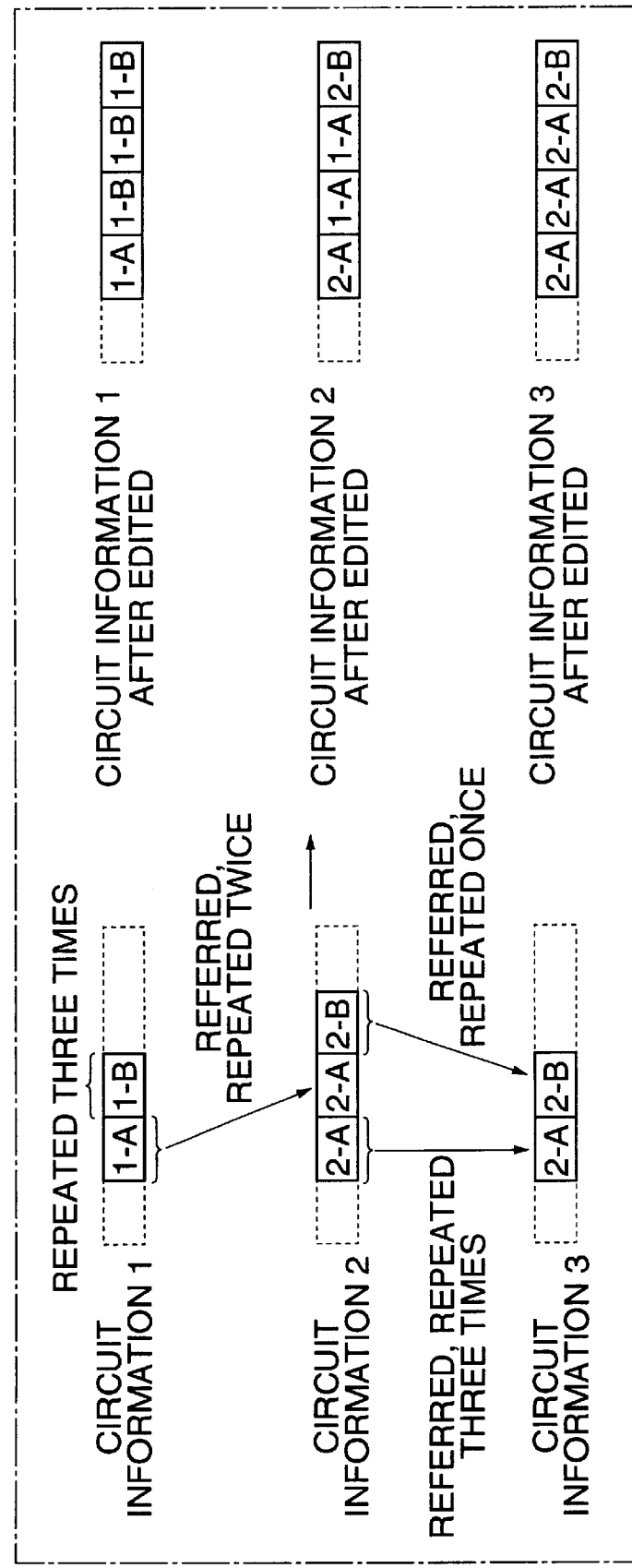
FIG. 14 explains editing operation in the third embodiment of the programmable logic device according to the invention.

In circuit information editing processing in the step S210, in the case where a frame (1-B) is repeated three times as in the circuit information 1 as shown in FIG. 14, the same frame data is added twice after the frame (1-B).

In the case where a frame (1-A) in the circuit information 1 is referred by a third frame as in the circuit information 2, the circuit information editor 2024 fetches data in a frame (1-A) in the circuit information 1 from the circuit information storage 2023 and inserts the data into the third frame in the circuit information 2.

Further, in the case where a frame (2-A) and a frame (2-B) in the circuit information 2 are referred by second, third, fourth and fifth frames as in the circuit information 3, the circuit information editor 2024 fetches data in the frame (2-A) and the frame (2-B) in the circuit information 2 from the circuit information storage 2023 and inserts the data into the second, third, fourth and fifth frames in the circuit information 3.

Circuit information the compressed state of which is decompressed is sent to the circuit information input controller 201, as in the conventional type programmable logic device, the circuit information is stored in the configuration memory 2022 and reconfiguration is completed (the step S211).

Afterward, as long as processing by the programmable logic device continues, the monitoring of a selection signal by the circuit information editor ie continued. When processing by the programmable logic device is finished, a procedure for reconfiguration is finished independent of a selection signal.

FIG. 16 is a timing chart of operation for reading circuit information and for reconfiguration based upon the circuit information. The timing chart is different from the timing chart shown in FIG. 6 in the first and second embodiments in that circuit information 0 is read so that the circuit information storage 2023 and the circuit information editor 2024 are reconfigured in the programmable logic circuit 202 beforehand before circuit information pieces 1, 2 and 3 are read.

Fourth Embodiment

A fourth embodiment is provided to effectively utilize a circuit already reconfigured last in the programmable logic circuit 202 in the third embodiment as in the second embodiment.

That is, in the fourth embodiment, in the case where the data of the same frame in the same frame position as the circuit information of a circuit reconfigured and generated in the programmable logic circuit 202 immediately before is included when circuit information read from the circuit information storage 2023 in edited by the circuit information editor 2024 and the edited circuit information is transferred to the configuration memory 2021 via the circuit information input controller 201, the data of the frame is not transferred to the configuration memory 2022 via the circuit information input controller 201.

Figure 17:
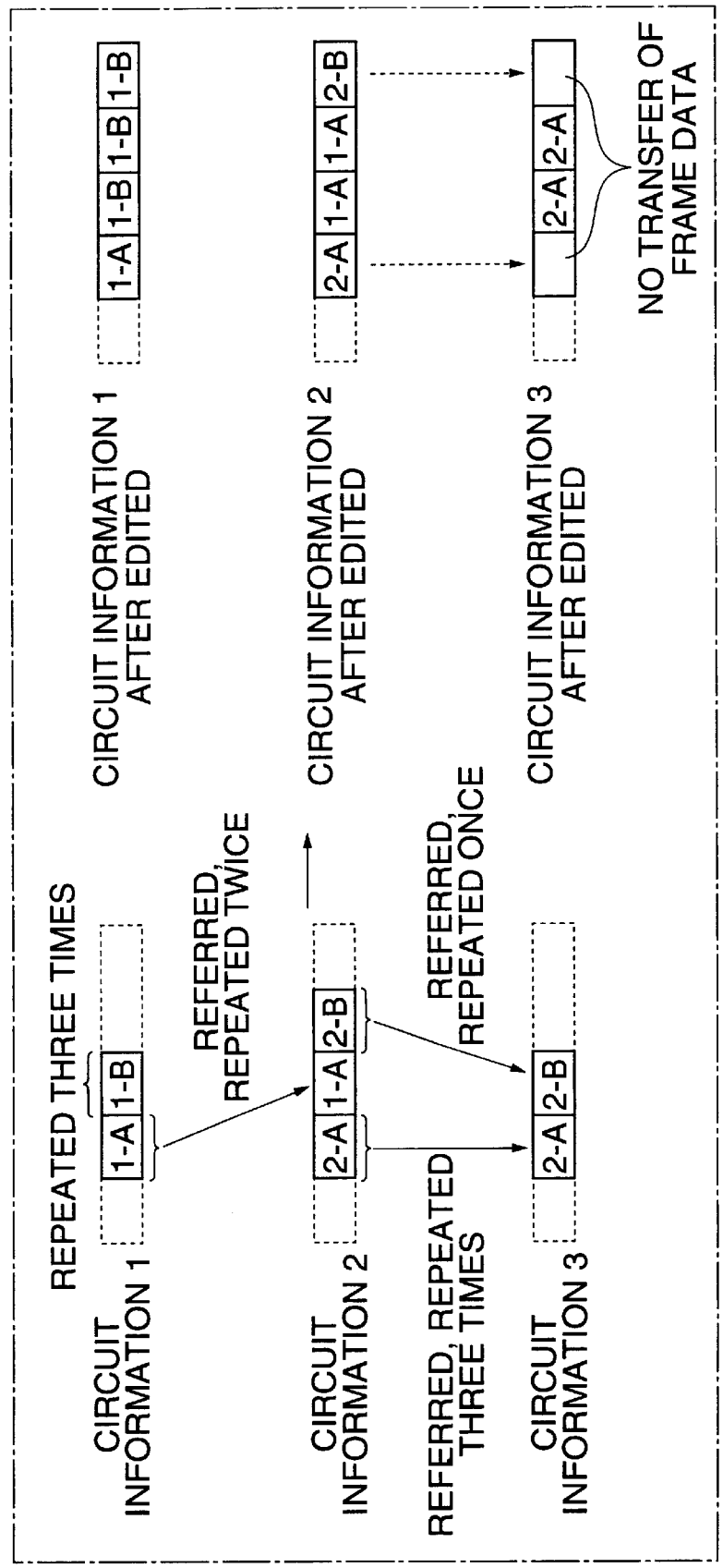
FIG. 17 explains editing operation in the programmable logic device in the fourth embodiment of the invention.

To give an example that three circuits are sequentially reconfigured and generated in the programmable logic device 200 based upon three circuit information pieces 1, 2 and 3, when the programmable logic circuit 202 is reconfigured based upon circuit information 3 after the programmable logic circuit 202 is reconfigured based upon circuit information 2 as shown in FIG. 17, it is detected by the circuit information editor 2024 that frame data in a second frame and a fifth frame in the circuit information 3 is the same as data in a frame in the same position in the circuit information 2.

As described above, as a fact that data in a frame in the same position in circuit information is the same means that the function and a connected state of a circuit element corresponding to the frame are the same, circuit information corresponding to the second frame and the fifth frame is not required to be stored in the configuration memory again in the case where reconfiguration is executed based upon this circuit information 3, as in the case shown in FIGS. 10 and 11, data in the frame is skipped and the frame data is not transferred to the circuit information input controller 201.

Fifth Embodiment

In the above first to fourth embodiments, circuit information all has a serial format, however, the invention can be naturally applied also to circuit information in a parallel format. In a fifth embodiment, circuit, information has a parallel format.

In the fifth embodiment, the dissolution executed by the circuit information editor 103 (in the first and second embodiments) and the circuit information editor 2024 (in the third and fourth embodiments) of a repeat frame and a reference frame in circuit information will be described below showing the concrete structure of circuit information in a parallel format.

Circuit information in parallel format according to the invention

Figures 32A, 32B:
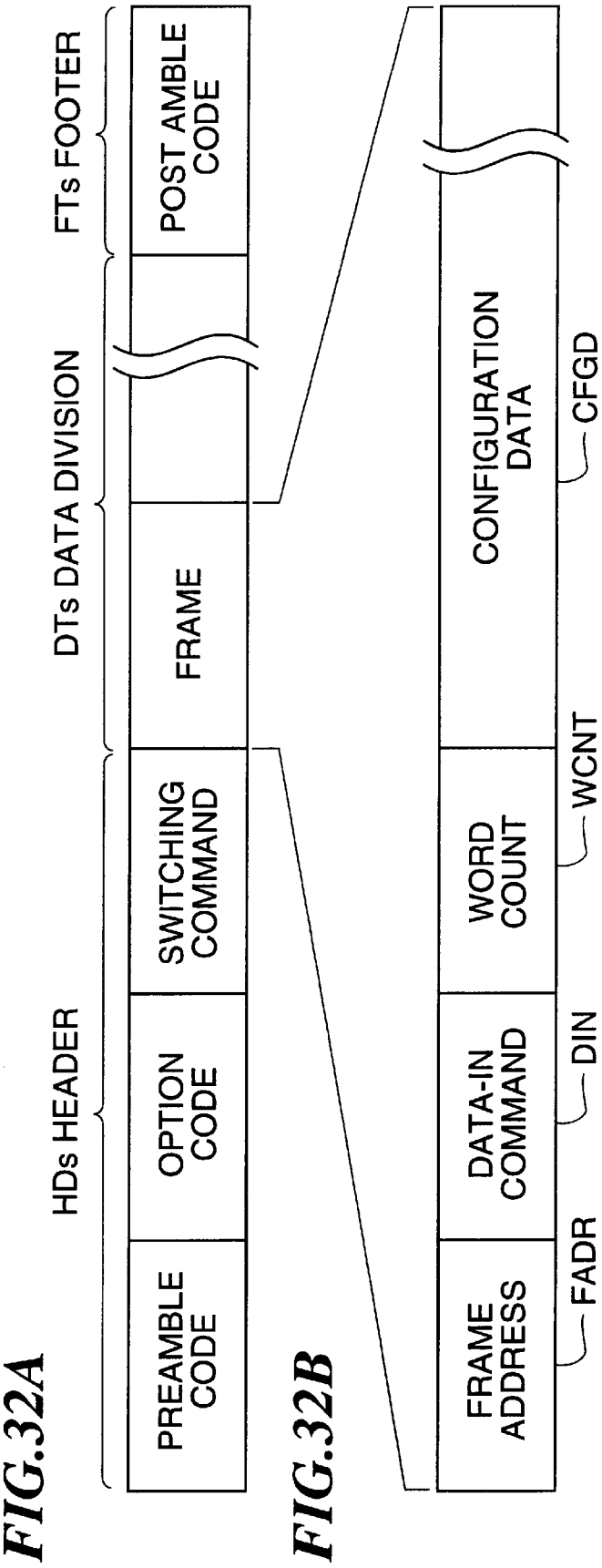
FIG. 32 explains conventional type circuit information in a parallel format.
Figure 33:
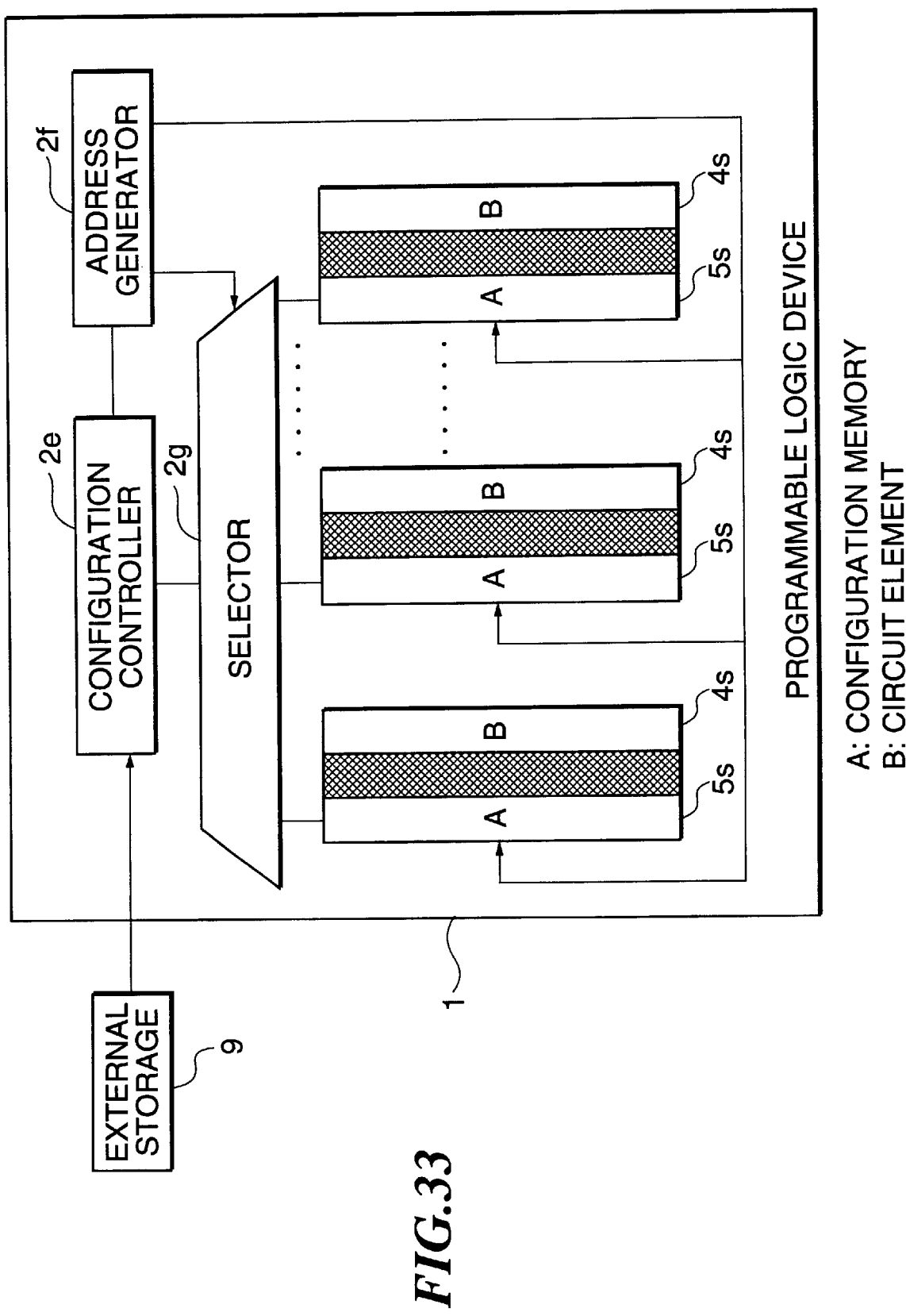
FIG. 33 is a block diagram for explaining a conventional type programmable logic device using circuit information in a parallel format.

FIGS. 18 show the structure of circuit information in a parallel format used in the fifth embodiment. As conventional type circuit information in a parallel format shown in FIG. 32, circuit information in a parallel format in this case also includes a header HDp, a data division DTp and a footer FTp as shown in FIG. 18A.

In the programmable logic device 100 or 200, circuit information having a certain bit length such as 32 bits in a parallel format can be serially transferred, can be transmitted in parallel via buses different in capacity and can be accessed to a memory in parallel by delimiting in a suitable unit such as one bit and 64 bits outside the programmable logic device 100 or 200.

A header HDp includes a preamble code showing the beginning of circuit information, an option code for setting a configuration parameter such as input clock speed of circuit information and a switching command to execute a set option and start the reading of data. The switching command also functions as editing instruction information to the circuit information editor in each embodiment of the invention.

A data division DTp includes three types of plural frames as in a serial format. A footer FTp includes a postamble code showing the and of circuit information.

For a frame including the data division DTp, there are also three types of a normal frame, a repeat frame and a reference frame in a parallel format.

Figure 18A:
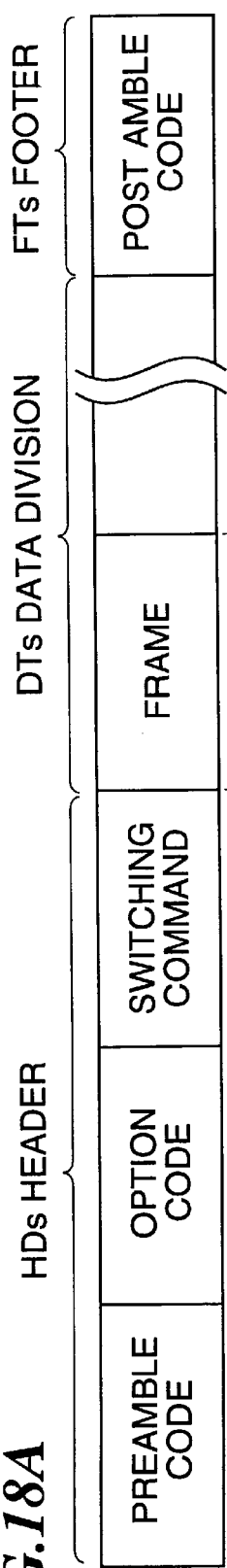
FIGS. 18A, 18B, 18C and 18D explain an example of circuit information in a parallel format used in the embodiment of the invention.
Figure 18B:
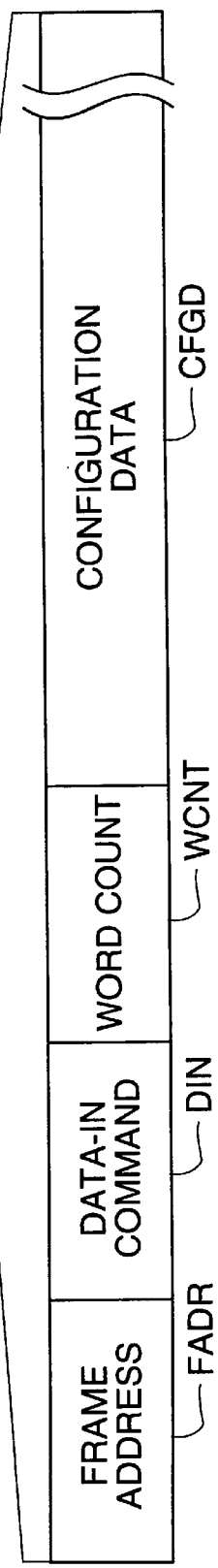

A normal frame has the same-structure as a frame used in conventional type circuit information in a parallel format as shown in FIG. 18B and includes a frame address FADR showing a frame position in a configuration memory for data to be written, a data-in command DIN that instructs to write data, word count WCNT that indicates the number of words to be read from configuration data CFGD and configuration data CFGD.

Figure 18C:
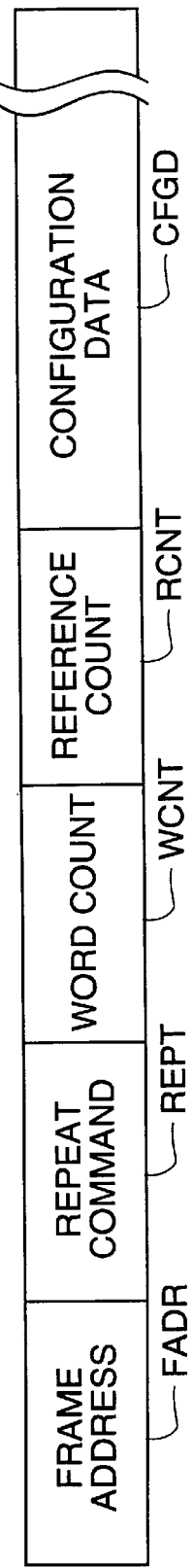

A repeat frame rue includes a frame address FADR showing a frame rams position in at configuration memory for data to be written, a repeat command REPT that instructs the repetition of data, word count WCNT that indicates the number of words read from configuration data CFGD, reference count RCYT that indicates the number of repeats and configuration data CFGD as shown in FIG. 18C. Normal frames of the number indicated in reference count RCNT are generated based upon a repeat frame compressed according to a procedure described later.

Figure 18D:
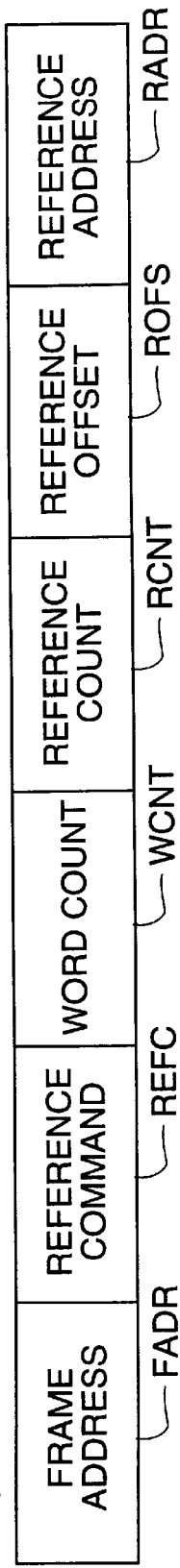

A reference frame includes a frame address FADR showing a frame position in a configuration memory frame or data to be written, a reference command REFC that instructs the reference of data, word count WCNT that indicates the number of words read from configuration data CFGD, reference count RCNT that indicates the number of repeats, a reference offset ROFS showing a relative-address at which date is read in a frame at the destination of reference and a reference address RADR showing the address of a frame at the destination of reference in the circuit information storage 102 or 2023 as shown in FIG. 18D. Normal frames having configuration data stored in the circuit information storage 102 or 2023 calculated based upon a reference address FADR and an offset address ROFS is generated based upon a reference frame compressed according to it procedure described later by the number indicated in reference count RCNT.

Circuit information in a parallel frame format in the example is characterized in that it has two types of frames of a repeat frame and a reference frame in addition to a normal frame. These three types of frames are recognized and identified by the circuit information editor 103 or 2024 because their frames respectively have different commands (a data-in command DIN, a repeat command REPT and a reference command REFC).

Figure 19:
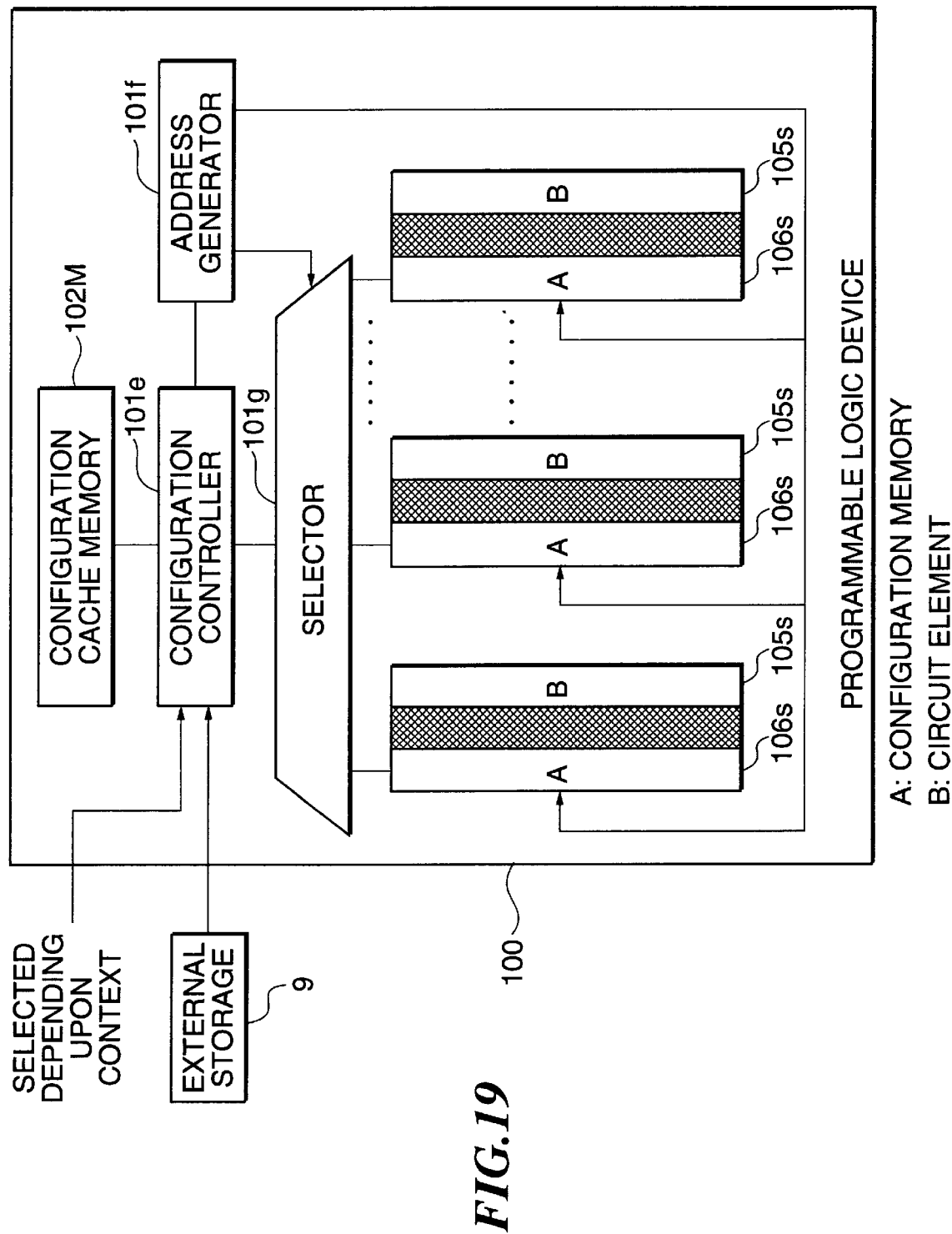
FIG. 19 is a block diagram for explaining a programmable logic device in an embodiment for configuration using circuit information in a parallel format.

Configuration of programmable logic device 100 having first structure based upon circuit information in parallel format FIG. 19 is a functional block diagram for explaining configuration operation based upon-circuit information in a parallel format to the programmable logic device having first structure shown in FIG. 1. The storage of circuit information in the configuration memory in this case will be described below using the block diagram shown in FIG. 19.

The circuit information input controller 101 shown in FIG. 1 includes a configuration controller 1019, an address generator 101f and a selector 101g in FIG. 19.

Also, the circuit element 105 and the configuration memory 106 in the programmable logic circuit 104 shown in FIG. 1 are divided into plural columns in units of one column of plural logic circuit it cells in FIG. 19 in the case of the FPGA type shown in FIG. 24A for example.

That is, the programmable logic circuit includes plural sets each of which has a configuration memory 106a having capacity that can store circuit information for one column of plural logic circuits and a circuit element 105e connected to the configuration memory. In this case, circuit information in one normal frame is the size of circuit information for one column of plural logic circuits.

Figure 34:
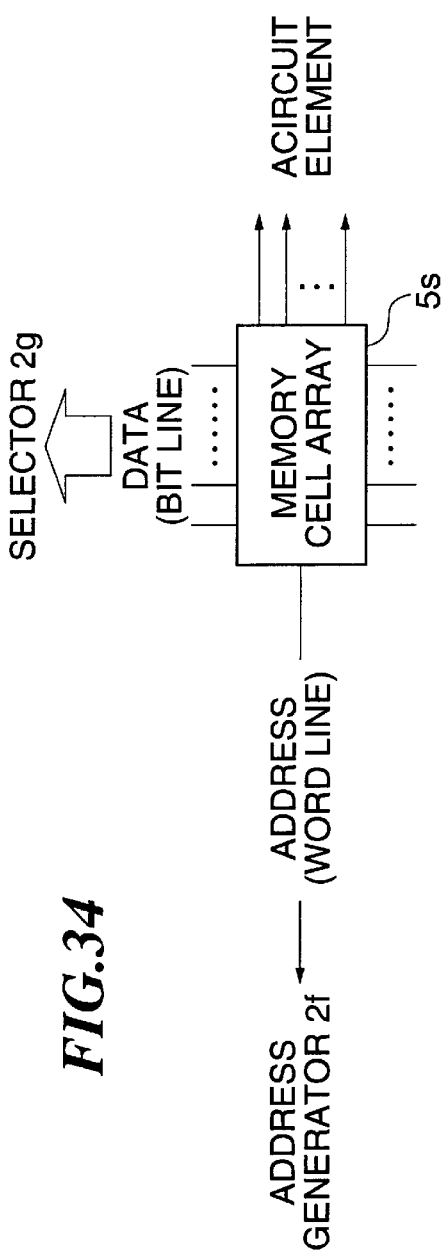
FIG. 34 explains the configuration of a part of the programmable logic circuit in the conventional type programmable logic device using circuit information in a parallel format.
Figure 35:
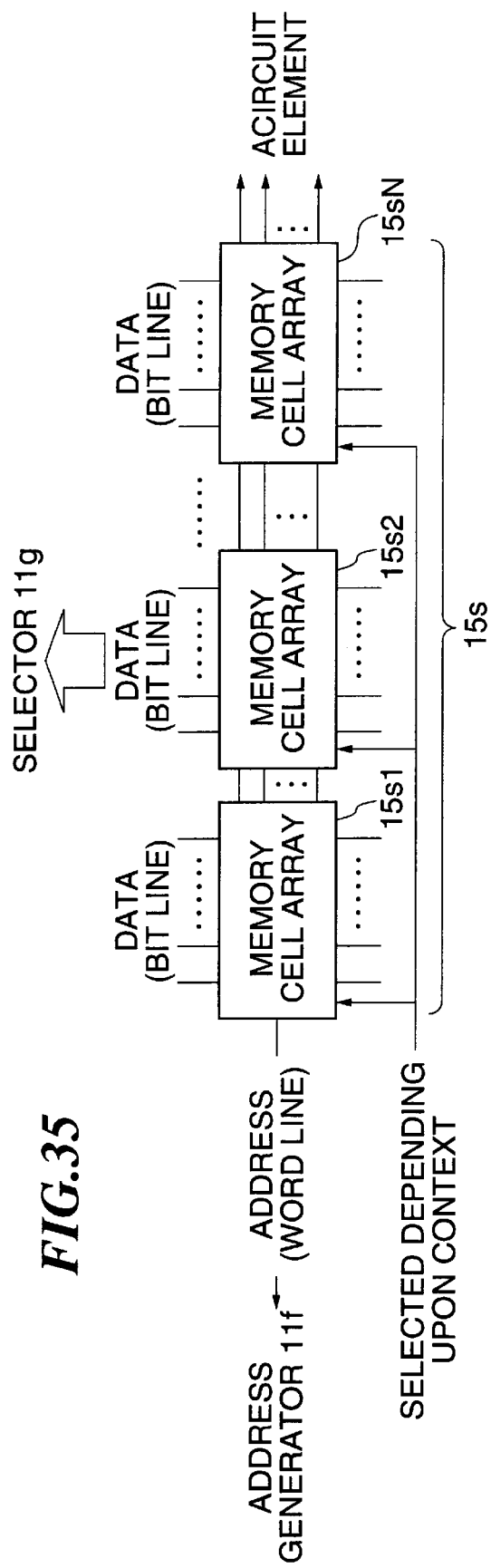
FIG. 35 explains the configuration of a part of the programmable logic circuit in the programmable logic device based upon multicontext technique using circuit information in a parallel format.
Figure 36:
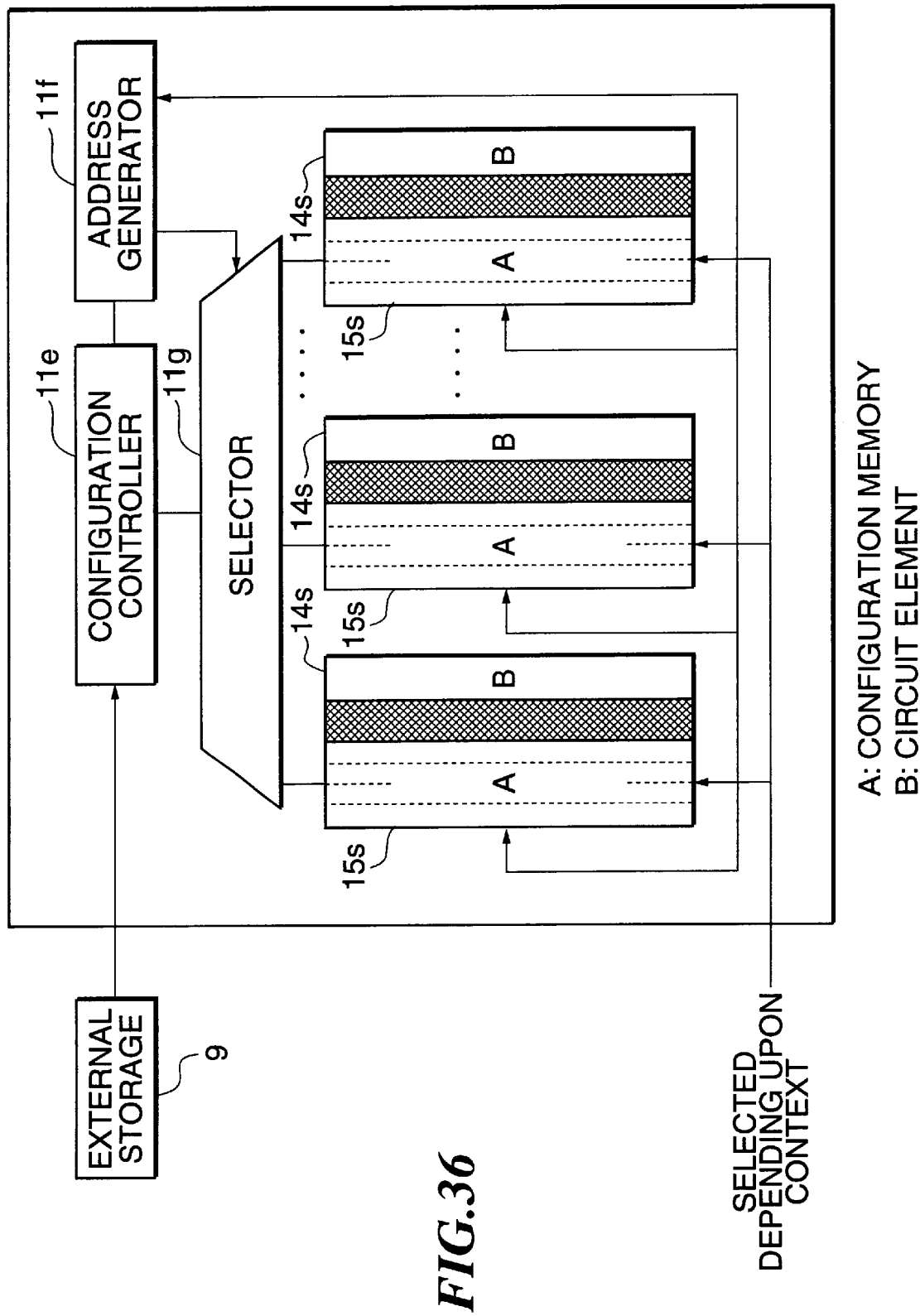
FIG. 36 is a block diagram for explaining a programmable logic device based upon multicontext technique using circuit information in a parallel format.

The bit line of each column of the configuration memory 106s is connected to the selector 101g as shown in FIG. 34. The word line of the configuration memory 106s is also connected to the address generator 101f.

The circuit information storage 102 shown in FIG. 1 is equivalent to it configuration Ache memory 102M in FIG. 19 and the function of the circuit information editor 103 is built in the configuration controller 101e.

When circuit information is read from an external storage 9 in configuration shown in FIG. 19, it is stored in the configuration cache memory 102M via the configuration controller 101e.

When the configuration controller 101e receives an instruction to select context, circuit information corresponding to the instruction is read from the configuration cache memory 102M into the configuration controller 101e. The configuration controller 101e detects a preamble code in a header HDp of circuit information and starts circuit information editing processing.

First, a parameter for configuration is set in the field of an option code next to the preamble code. A set option is executed by the next switching command and the reading of data DTp is started.

Frame data in a data division DTp is converted from a compressed frame in the format of a repeat frame and a reference frame to a decompressed normal frame according to a procedure described later. The frame address FADR of each frame is read in the address generator 102f, and a bit line and a word line corresponding to the configuration memory 106s for data to be written are selected. Next, a data-in command DIN is activated, data by the number indicated in word count WCNT is read, from configuration data CFGD and is written to the configuration memory 106s via the selector 101g. This procedure is repeated for all frames.

Figure 20:
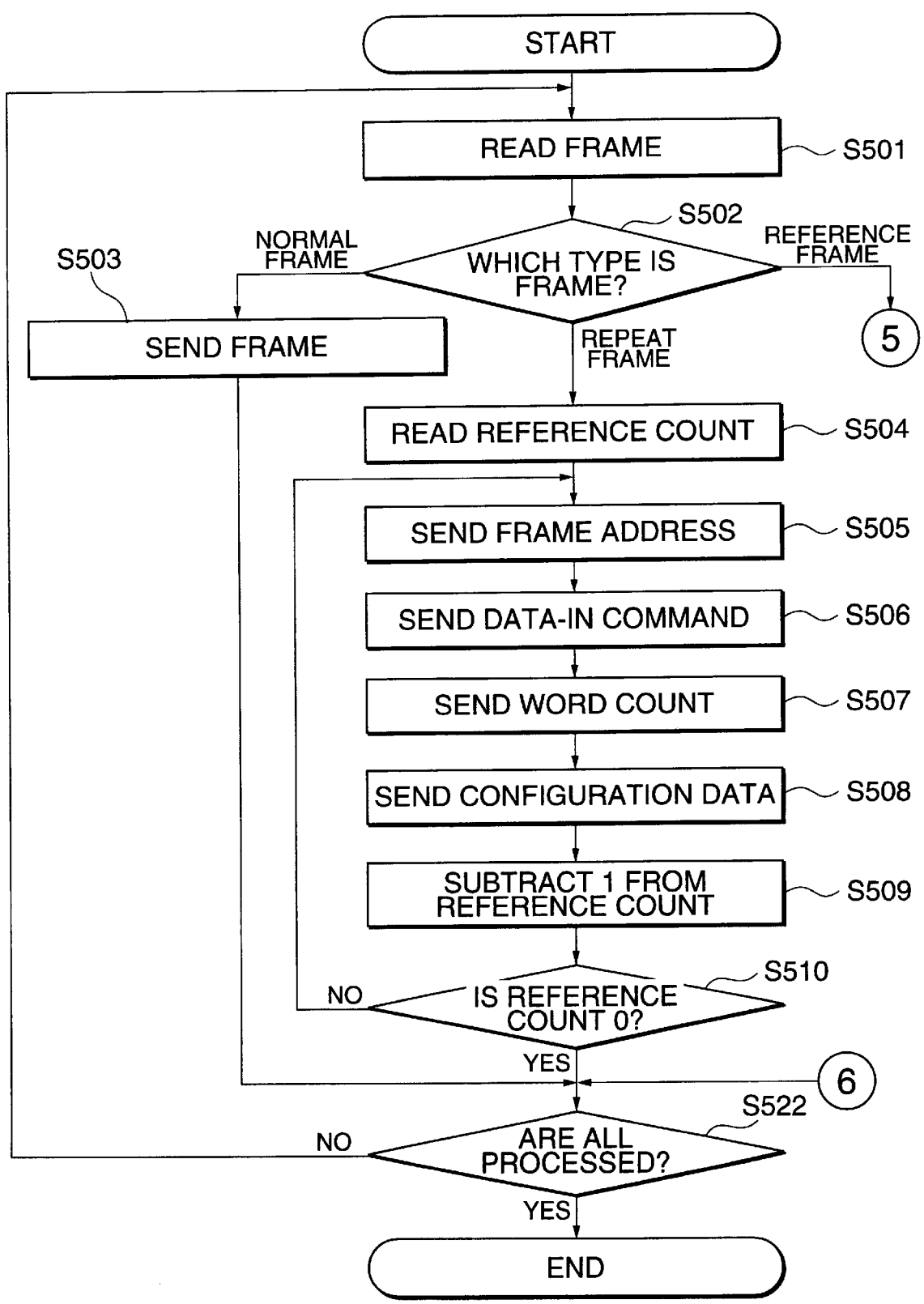
FIG. 20 is a part of a flowchart for explaining editing operation in case circuit information in a parallel format is used in the embodiment of the invention.
Figure 21:
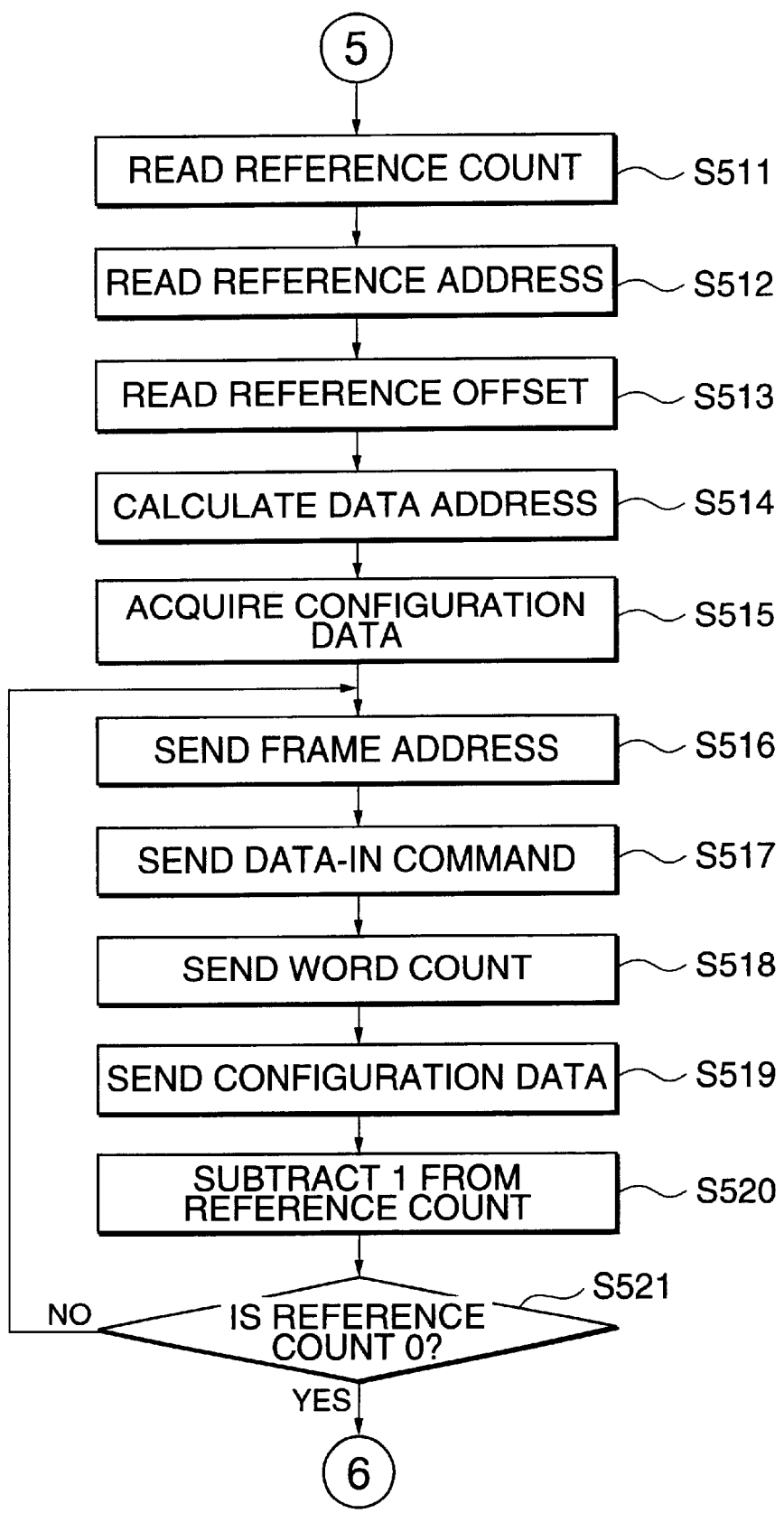
FIG. 21 is the remainder of the flowchart for explaining editing operation in case circuit information in a parallel format is used in the embodiment of the invention.

When the configuration controller 101 e detects a postamble code in a footer FTp next to the data division DTp, configuration processing is finished. The above processing is similar to the procedure shown in the flowchart in FIG. 5, however, the processing is different from the case of circuit information in a serial format shown in FIGS. 7 and 8 in that decompressing processing by the circuit information editor 103 in the stop S210 is as shown in FIGS. 20 and 21.
Processing by circuit information editor Referring to FIGS. 20 and 21, processing for decompressing a repeat frame and a reference frame in the embodiment in the case of circuit information in a parallel format will be described below.

First, the circuit information editor 103 reads a first frame and identifies the type depending upon a command next to the frame address FADR of each frame. When the read frame is identified as a normal frame, data in the frame is sent as it is (a step S503).

Also, when the read frame is identified as a repeat frame, reference count RCNT is read. Next, a frame address FADR, a data-in command DIN, word count WCNT and configuration data CFGD are sequentially sent (steps S504 to S508) and reference count RCNT Is decremented by one (a step S509). Normal frames of the number indicated in reference count RCNT are generated base upon a compressed repeat frame by repeating this procedure until reference count becomes 0 (a step S510).

Also, when the read frame is identified as a reference frame, reference count RCNT, a reference address RADR and a reference offset ROFS are read (steps S512 to S513 shown in FIG. 21). Next, the absolute address of configuration data CFGD to be referred is calculated by adding a reference offset ROFS showing the relative position of the configuration data CFGD to be referred erred in a frame at the destination of reference to a reference address RADR showing a frame position at the destination of reference in the circuit information storage 102 (a step S514).

Next, the configuration data CFGD located at the absolute address is read and is temporality stored in the circuit information editor 103 (a step S515). Next, as in the case of a repeat frame, a frame address FADR, a data-in command DIN, word count WCNT and configuration data CFGD are sent until reference count RCNT becomes 0 (steps S516 to S521) and normal frames having the referred configuration data CFGD are generated by the number indicated in reference count RCNT based upon a compressed reference frame.

Circuit information including only a decompressed normal frame is generated based upon circuit information compressed in the format of a repeat frame and a reference frame by executing this procedure for all frames (a step S522).

Configuration in executed according to the same procedure as the configuration of the conventional type programmable logic device by sending the decompressed circuit information to the circuit information input controller 101.

The fifth embodiment described above is related to the case using circuit information in a parallel format for the configuration of the programmable logic device 100 having first structure, however, the fifth embodiment can also be similarly applied to the case of the programmable logic device 200 having second structure and in the case where a circuit already generated in the programmable logic circuit is effectively utilized as in the second and fourth embodiments, the fifth embodiment can also be similarly applied.

A method of compressing circuit information described above is an example and the invention is not limited to the method. The circuit information editor 103 is provided with a function for executing editing processing corresponding to the method of compressing circuit information.

As described above, according to the invention, technique similar to multicontext technique by the programmable logic circuit not requiring an extra configuration memory for storing plural circuit information pieces as conventional type multicontext technique can be implemented, time required for reconfiguring the programmable logic device is reduced using the technique and hardware processing shorter in processing time than software processing in comparison in total processing time including circuit reconfiguration time can be realized. As a result, the high speed and miniaturized information processing system using reconfigurable computing by cache logic technique can be implemented.

Also, as an extra configuration memory is not required in the programmable logic circuit as conventional type multicontext technique, the deterioration of circuit performance and the increase of power consumption respectively caused by the increase of wiring load capacity caused by arranging the extra configuration memory are not caused and the programmable logic device similar to that based upon multicontext technique can be implemented.

Also, in the invention, as compressed circuit information is stored in the circuit information storage, the same circuit information can be stored in the programmable logic device in storage capacity smaller than conventional type multicontext technique and as a result, technique similar to multicontext technique can be implemented in the scale of a circuit smaller than the programmable logic device based upon conventional type multicontext technique without using DRAM technology causing the increase of processes and the deterioration of circuit performance.

Also, as the programmable logic device according to the invention can use the programmable logic circuit having the same structure as the conventional type normal programmable logic device, it can be readily implemented using the design of the conventional type programmable logic device.

Also, there is also a merit that the programmable logic device according to the invention can be implemented by configuring the circuit information storage and the circuit information editor in the programmable logic device according to the invention in the conventional type programmable logic device by reading circuit information using the conventional type programmable logic device without producing a new device.

What is claimed is:

1. A programmable logic device, comprising:
    a programmable logic circuit provided with a circuit element and a configuration memory connected to the circuit element in which a circuit is configured based upon circuit information written to the configuration memory;
    a circuit information storage different from the configuration memory that stores plural circuit information pieces for sequentially configuring plural circuits in the programmable logic circuit;
    a circuit information writer that writes the plural circuit information pieces to the circuit information storage;
    a circuit information editor that generates, in the programmable logic circuit, the circuit information of one, circuit specified in specification information using one or plural circuit information pieces out of the plural circuit information pieces stored in the circuit information storage; and
    a controller that writes the circuit information of the circuit generated by the circuit information editor to, the configuration memory.

2. A programmable logic device according to claim 1, wherein:
    the circuit information storage and the circuit information editor are provided separately from the programmable logic circuit.

3. A programmable logic device according to claim 1, wherein:
    the circuit information editor generates circuit information in part of the circuit element of the programmable logic circuit by writing the circuit information to part of the configuration memory.

4. A programmable logic device according to claim 1, wherein:
    the circuit information stored in the circuit information storage is compressed; and
    the compressed circuit information is decompressed by the circuit information editor and circuit information specified in-the specification information is generated.

5. A programmable logic device according to claim 1, wherein:
    the circuit information stored in the circuit information storage is provided with reference information for reading other circuit information from the circuit information storage in the case where part or all of the circuit information is composed of other circuit information; and
    the circuit information editor acquires circuit information of one circuit specified in the specification information from the circuit information storage, and in the case where reference information is included in the circuit information, the circuit information editor generates the circuit information of the specified circuit by acquiring the other circuit information based upon the reference information.

6. A programmable logic device according to claim 1, wherein: circuit information stored in the circuit information storage is provided with reference information for referring to another part of the circuit information itself in the case where part of the circuit information is composed of another part of the circuit information itself; and
    the circuit information editor acquires circuit information of the specified circuit from the circuit information storage, and in the case where reference information is included, the circuit information editor generates the circuit information of a circuit specified in the specification information also using the reference information.

7. A programmable logic device according to claim 1, wherein:
    each of the plural circuit information pieces stored in the circuit information storage includes a circuit data division and its additional information division;
    the additional information division includes description to instruct the circuit information editor to edit the circuit data division;
    the circuit data division in data for configuring a circuit in the programmable logic circuit and in the case where part or all of the division is composed of a circuit data division of other circuit information, the part or all of the circuit data division includes description of reference information for referring to the other circuit information in the circuit information storage; and the circuit information editor acquires circuit information specified in the specification information and a circuit data division of the other circuit information referred to by the reference information from the circuit information storage to generate the circuit information specified in the specification information.

8. A programmable logic device according to claim 1, wherein:

each of the plural circuit information pieces stored in the circuit-information storage includes a circuit data division and its additional information division;

the additional information division includes description to instruct the circuit information editor to edit the circuit data division;

the circuit data division is data for configuring a circuit in the programmable logic circuit, and in the case where part of the division in composed of another circuit data division of its own circuit information, the part includes description using reference information for referring to another circuit data division; and the circuit information editor acquires circuit information specified in the specification information from the circuit information storage, and in the case where reference information is included, the circuit information editor generates the circuit information specified in the specification information also using the reference information.

9. A programmable logic device according to claim 7, wherein:

the circuit data division of circuit information stored in the circuit information storage is described in one or plural frames equivalent to data segmented per every fixed quantity in the configuration memory; and in the case where part or all of the one or plural frames are composed of a frame of other circuit information, the reference information is described as circuit data of a frame to refer to the frame of the other circuit information in the corresponding circuit information.

10. A programmable logic device according to claim 7, wherein;

the circuit data division of circuit information stored in the circuit information storage is described in one or plural frames equivalent to data segmented per every fixed quantity in the configuration memory; and in the case where part of the one or plural frames is composed of another frame in its own circuit information, the reference information is described as circuit data of a frame to refer to the frame-of its own circuit information in the corresponding circuit information.

11. A programmable logic device according to claim 9, wherein:

in the case where the reference information is described in a frame in the circuit information of a circuit to be generated, the circuit information editor does not transfer data in a frame to the configuration memory via the controller when data in a frame position where reference information is described is determined to be identical to data in a frame in the same position of the circuit information of a circuit generated immediately before in the programmable logic circuit.

12. An information processing system that performs at least a part of processing by an application program in a programmable logic device, wherein:

the programmable logic device according to claim 1 is used as the programmable logic device.

13. A method of reconfiguring a circuit in a programmable logic device, comprising the steps of:

providing a circuit information storage different from a configuration memory, which stores plural circuit information pieces for sequentially configuring plural circuits in the programmable logic circuit and a circuit information editor that generates the-circuit information of a specified circuit using circuit information stored in the circuit information storage to the programmable logic device equipped with a programmable logic circuit having a circuit element and the configuration memory connected to the circuit element where a circuit is configured based upon circuit information written to the configuration memory;

storing circuit information of the plural circuits in the circuit information storage in a compressed state; and upon input of specification information of the circuit information of a reconfigured circuit to the programmable logic circuit, reading required circuit information by the circuit information editor from the circuit information storage;

decompressing the compressed circuit information to generate circuit information specified in the specification information; and transferring the generated circuit information to the configuration memory to reconfigure the circuit.

14. A method of reconfiguring a circuit in the programmable logic device according to claim 13, wherein;

circuit information stored in the circuit information storage is compressed by, describing reference information for reading other circuit information from the circuit information storage in the case where part or all of the circuit information is composed of other circuit information; and the circuit information editor acquires required circuit information from the circuit information storage based upon reference information in the case where the specified circuit information read from the circuit information storage Includes the reference information.

15. A method of reconfiguring a circuit in the programmable logic device according to claim 13, wherein:

circuit information stored in the circuit information storage is compressed by describing reference information for referring to another part of the circuit information Itself in the case where part of the circuit information is composed of another part of the circuit information itself; and the circuit information editor generates required circuit information using the read circuit information based upon the reference information in the case where the specified circuit information read from the circuit information storage includes the reference information.

16. A method of reconfiguring a circuit in the programmable logic device according to claim 14, wherein:

each of the plural circuit information pieces stored in the circuit information storage includes a circuit data division and its additional information division;

the additional information division includes description to instruct the circuit information editor to edit the circuit data division; and the circuit data division is compressed using the reference information.

17. A method of reconfiguring a circuit in the programmable logic device according to claim 14, wherein:

the circuit data division is described in one or plural frames equivalent to data segmented per every fixed quantity in the configuration memory; and in the case where part or all of the one or plural frames are composed of the frame of other circuit information, the reference information is described in the corresponding circuit information as the circuit data of a frame to refer to the frame of the other circuit information.

18. A method of reconfiguring a circuit in the programmable logic device according to claim 14, wherein:

the circuit data division is described in one or plural frames equivalent to data segmented per every fixed quantity in the configuration memory; and in the case where part of the one or plural frames is composed of another frame in its own circuit information, the reference information is described in the corresponding circuit information as the circuit data of a frame to refer to the frame of its own circuit information.

19. A method of controlling plural circuit information pieces for sequentially configuring plural circuits in a programmable logic device, the method comprising the steps of:

describing each of the circuit information pieces in one or plural frames equivalent to data segmented per every fixed quantity in a configuration memory in the programmable logic device and; and in the case where part or all of the circuit information is composed of other circuit information or another part in the circuit information itself, describing reference information in the corresponding circuit information as another circuit information or the circuit data of a frame to refer to the frame of its own circuit information.

20. A method of compressing circuit information, comprising the steps of:

describing circuit data division of circuit information for configuring a circuit in a programmable logic device in a set of frames equivalent to data segmented per every fixed quantity in a configuration-memory of a programmable logic circuit; and in the case where part oral I of the circuit information is composed of other circuit information or another part of the circuit information itself, compressing the data quantity of circuit information by describing reference information in the corresponding circuit information as other circuit information or the circuit data of a frame to refer to the frame of its own circuit information.

\* \* \* \* \*